US012419190B2

United States Patent
Hao et al.

(10) Patent No.: US 12,419,190 B2
(45) Date of Patent: Sep. 16, 2025

(54) PEROVSKITE SOLAR CELL AND METHOD OF MAKING THE SAME

(71) Applicant: NewSouth Innovations Pty Limited, Sydney (AU)

(72) Inventors: Xiaojing Hao, Sydney (AU); Xu Liu, Sydney (AU); Martin Andrew Green, Sydney (AU); Ziheng Liu, Sydney (AU)

(73) Assignee: NewSouth Innovations Pty Limited, Sydney (AU)

( * ) Notice: Subject to any disclaimer, the term of this patent is extended or adjusted under 35 U.S.C. 154(b) by 204 days.

(21) Appl. No.: 17/904,578

(22) PCT Filed: Feb. 22, 2021

(86) PCT No.: PCT/AU2021/050147
§ 371 (c)(1),
(2) Date: Aug. 18, 2022

(87) PCT Pub. No.: WO2021/163766
PCT Pub. Date: Aug. 26, 2021

(65) Prior Publication Data
US 2023/0087893 A1   Mar. 23, 2023

(30) Foreign Application Priority Data
Feb. 20, 2020   (AU) ................. 2020900488

(51) Int. Cl.
*H10K 85/50*   (2023.01)
*H10K 30/10*   (2023.01)
*H10K 30/40*   (2023.01)
*H10K 30/50*   (2023.01)
*H10K 85/60*   (2023.01)
*H10K 102/00*   (2023.01)

(52) U.S. Cl.
CPC ............ *H10K 85/50* (2023.02); *H10K 30/10* (2023.02); *H10K 85/633* (2023.02); *H10K 30/40* (2023.02); *H10K 30/50* (2023.02); *H10K 2102/00* (2023.02)

(58) Field of Classification Search
CPC ... H10K 85/633; H10K 30/10; H10K 2102/00
See application file for complete search history.

(56) References Cited

PUBLICATIONS

Niu et al. Temporal and spatial pinhole constraint in small molecule hole transport layers for stable and efficient, Journal of Materials Chemistry, vol./issue 7, pp. 7338-7346 (Year: 2019).*

(Continued)

*Primary Examiner* — Jayne L Mershon
(74) *Attorney, Agent, or Firm* — Knobbe, Martens, Olson & Bear, LLP

(57) ABSTRACT

A method of forming a photovoltaic device comprising a perovskite photovoltaic cell, particularly a method of forming a perovskite solar cell (PSC), is disclosed having a hole transport layer comprising an additive that may result in one or more of reduced formation of crystalline domains in the hole transport layer; reduced size of pinholes in the hole transport layer; improved dopant homogeneity and increased hydrophobicity of the hole transport layer. Also disclosed are PSCs so formed, showing one or more improved properties.

12 Claims, 54 Drawing Sheets

(56) References Cited

PUBLICATIONS

Yang et al., The Effect of Using 1-Dodecanethiol as a Processing Additive on the Performances of Polymer Solar Cells, Chinese Physics Letters, Chinese Physical Society, vol. 30, No. 10, pp. 108401-1 through 4 (Year: 2013).*

Peet et al., Efficiency enhancement in low-bandgap polymer solar cells by processing with alkane dithiols, Letters, Nature Materials, vol. 6, pp. 487-500 (Year: 2007).*

Niu et al.*

Peet et al.*

Yang et al.*

Calio, L., et al., "A Generic Route of Hydrophobic Doping in Hole Transporting Material to Increase Longevity of Perovskite Solar Cells", Joule 2, 2018, 1800-1815.

Hawash, Z., et al., "Recent Advances in Spiro-MeOTAD Hole Transport Material and Its Applications in Organic-Inorganic Halide Perovskite Solar Cells", Adv. Mater. Interfaces, 2018, 5, 1700623 (22 pages).

International Search Report and Written Opinion issued on Mar. 31, 2021, in corresponding PCT Patent Application No. PCT/AU2021/050147 filed on Feb. 22, 2021.

Liu, X., et al., "Improvement of Cs-(FAPbl3)0.85(MAPbBr3)0.15 Quality Via DMSOMolecule-Control to Increase the Efficiency and Boost the Long-Term Stability of 1 cm2 Sized Planar Perovskite Solar Cells", Sol. RRL, 2019, 3, 1800338 (10 pages).

Niu, X., et al., "Temporal and spatial pinhole constraints in small molecule hole transport layers for stable and efficient perovskite photovoltaics", J. Mater. Chem. A, 2019, 7, 7338-7346.

Ono, L. K., et al., "The influence of secondary solvents on the morphology of a spiro-MeOTAD holes transport layer for lead halide perovskite solar cells", J. Phys. D: Appl. Phys. 2018, 51, 294001 (13 pages).

Peet, J., et al., "Efficiency enhancement in low-bandgap polymer solar cells by processing with alkane dithiols", Nature Materials, 2007, vol. 6, 497-500.

Schloemer, T. H., et al., "Doping strategies for small molecule organic hole-transport materials: impacts on perovskite solar cell performance and stability", Chem. Sci., 2019, 10, 1904-1935.

Yang, Shao-Peng, et al., "The Effect of Using 1-Dodecanethiol as a Processing Additive on the Performance of Polymer Solar Cells", Chin. Phys. Lett., 2013, vol. 30, No. 10, 108401 (4 pages).

* cited by examiner

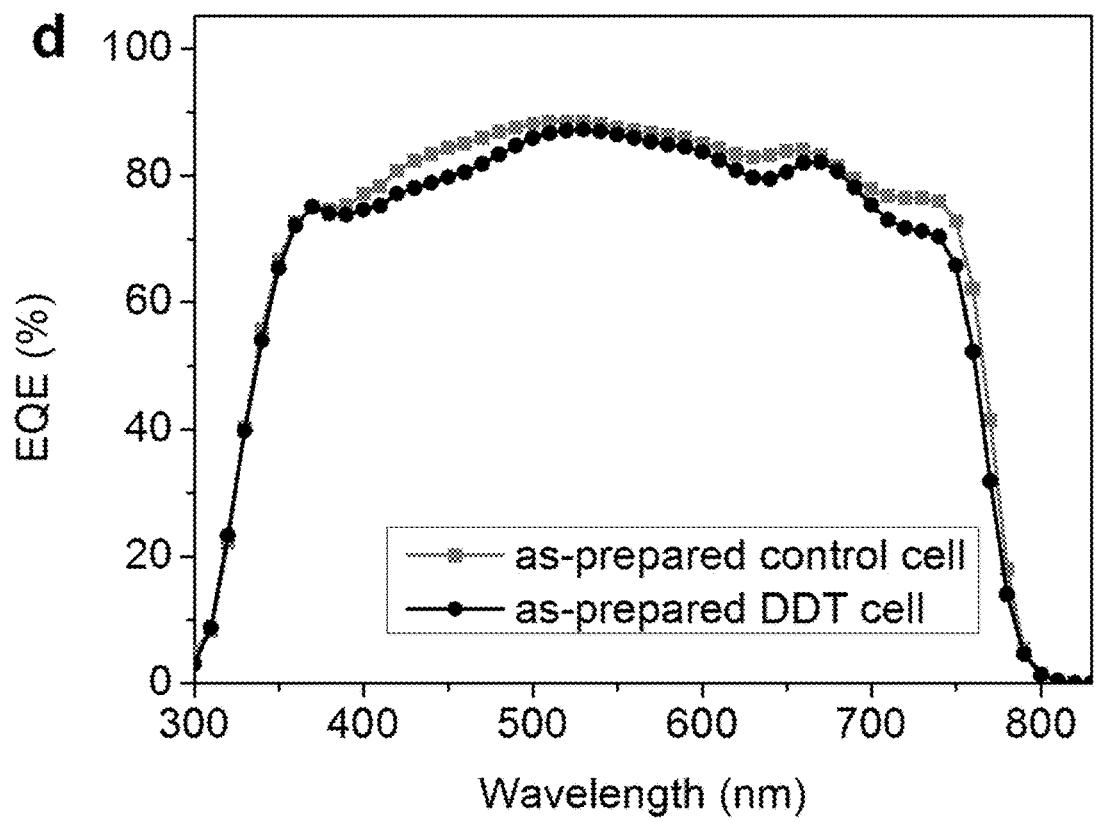
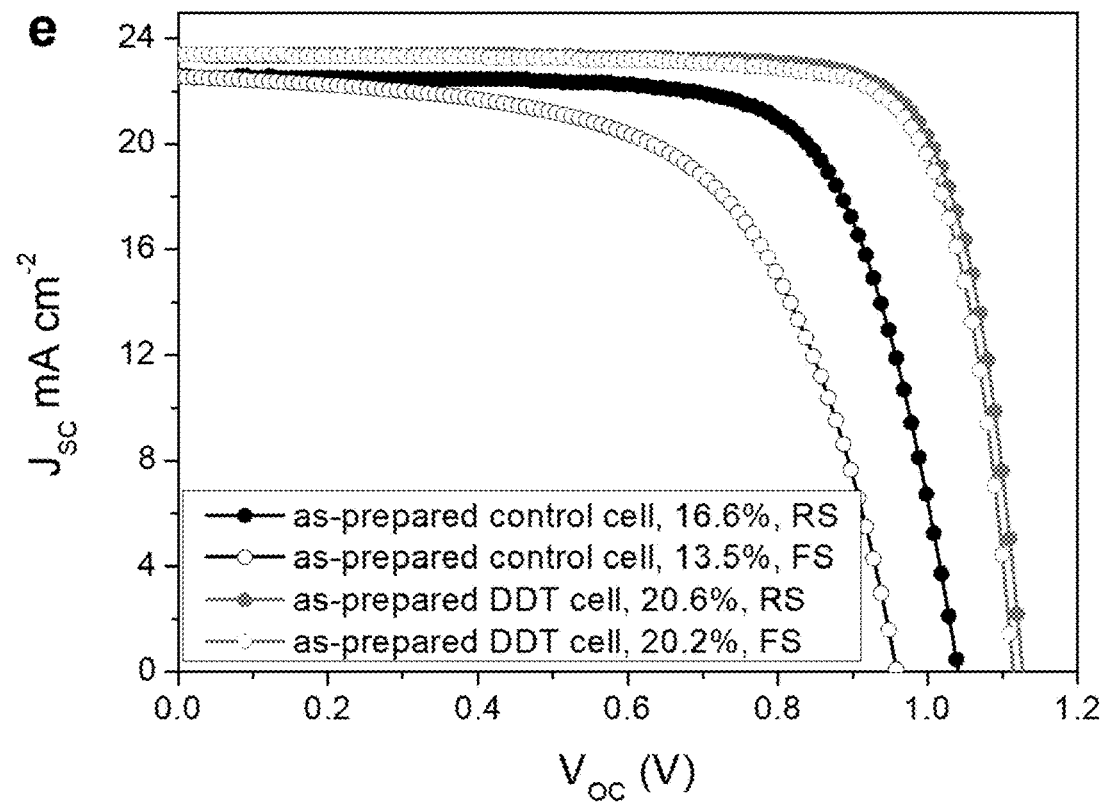
Figure 1 cont.

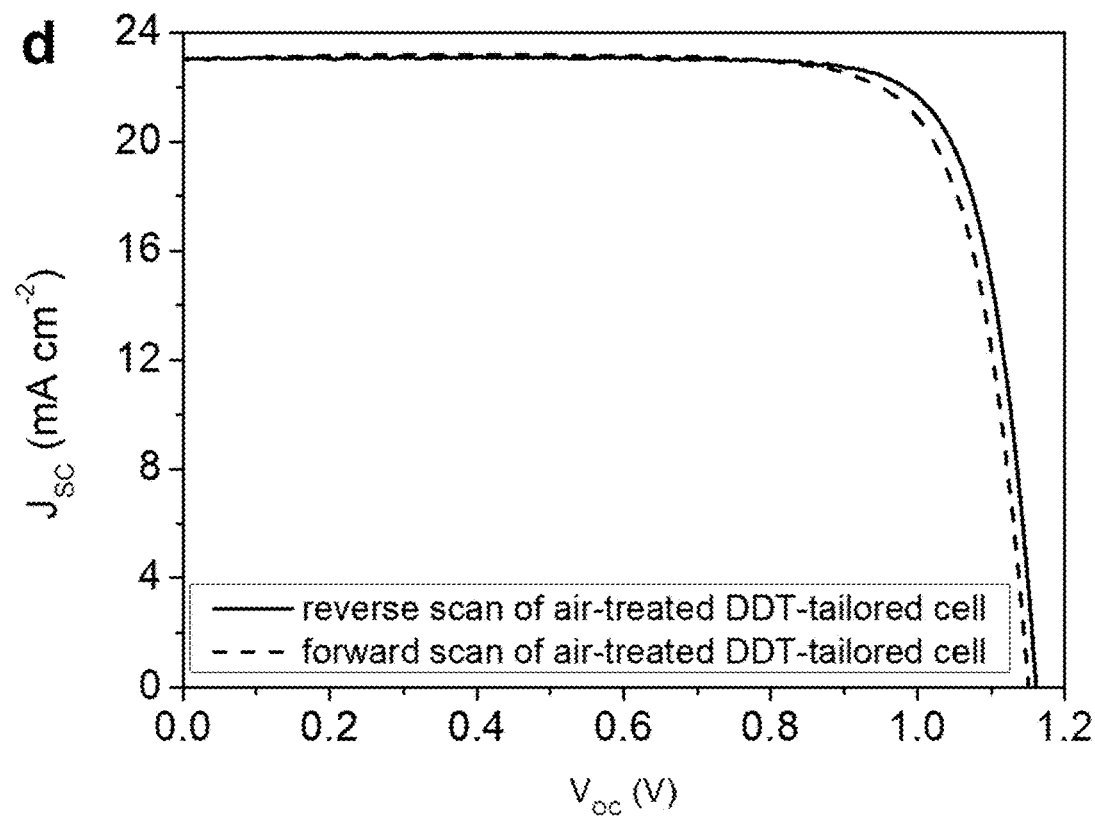
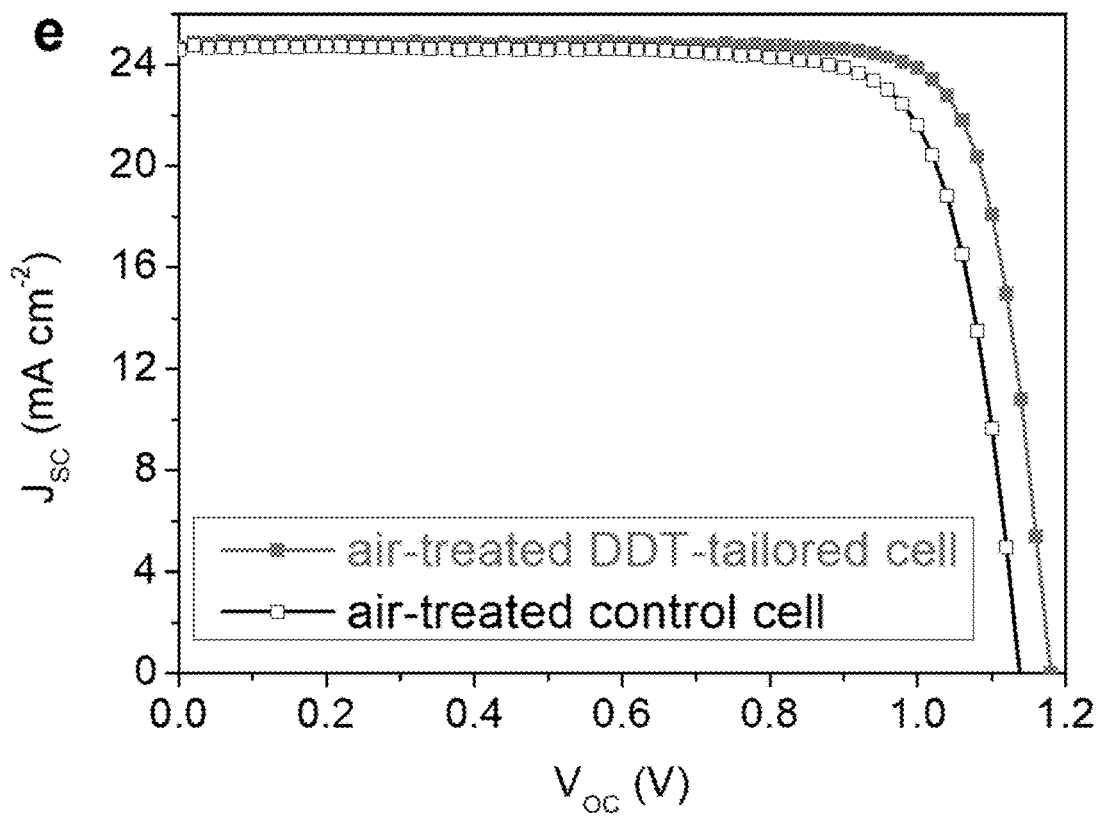
Figure 5 cont.

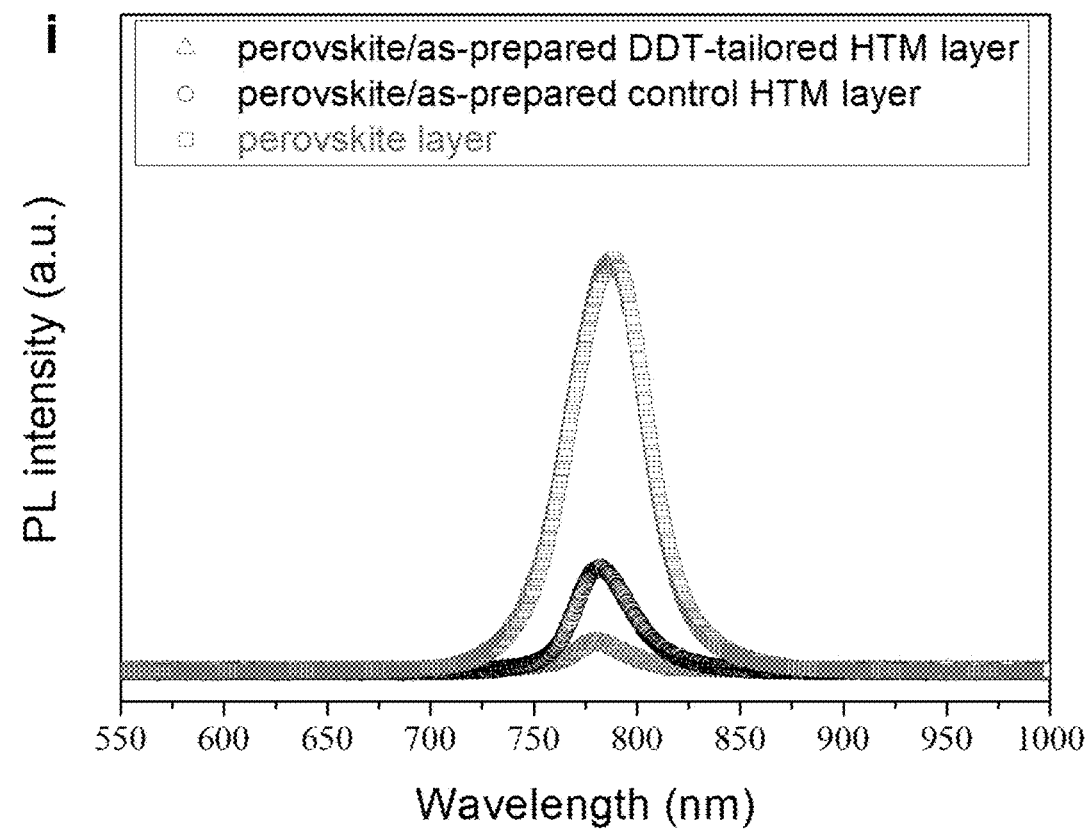
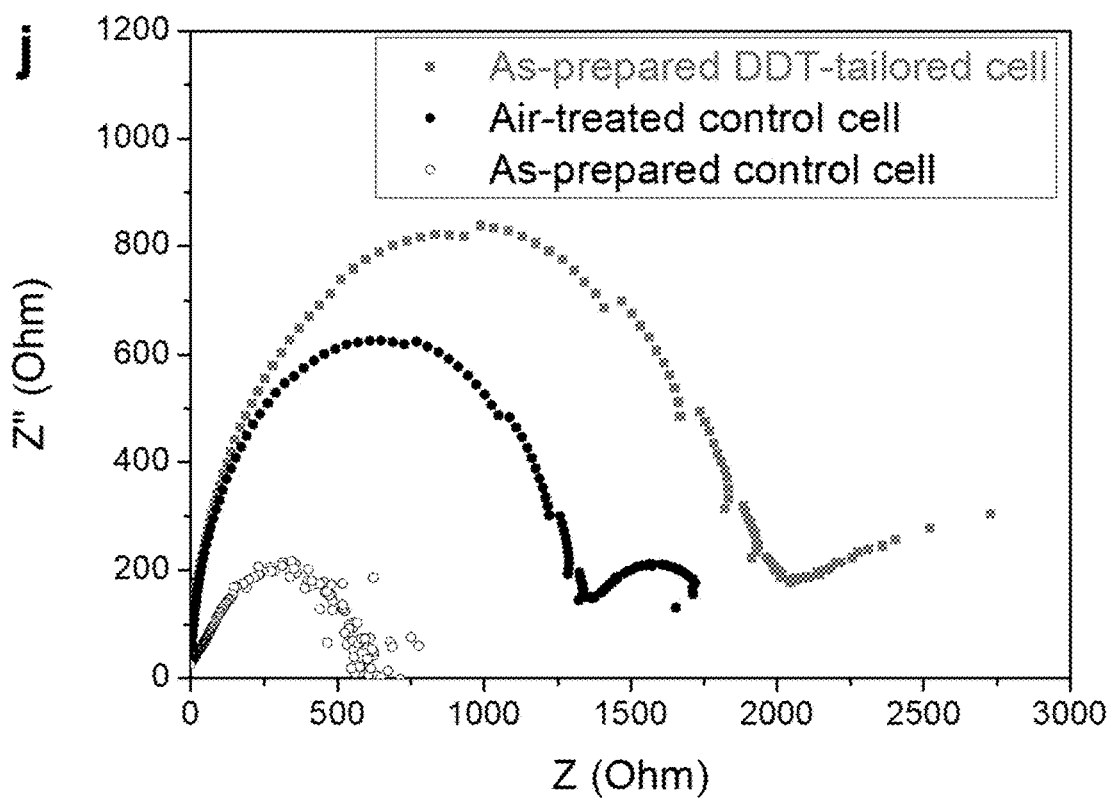
Figure 7 cont.

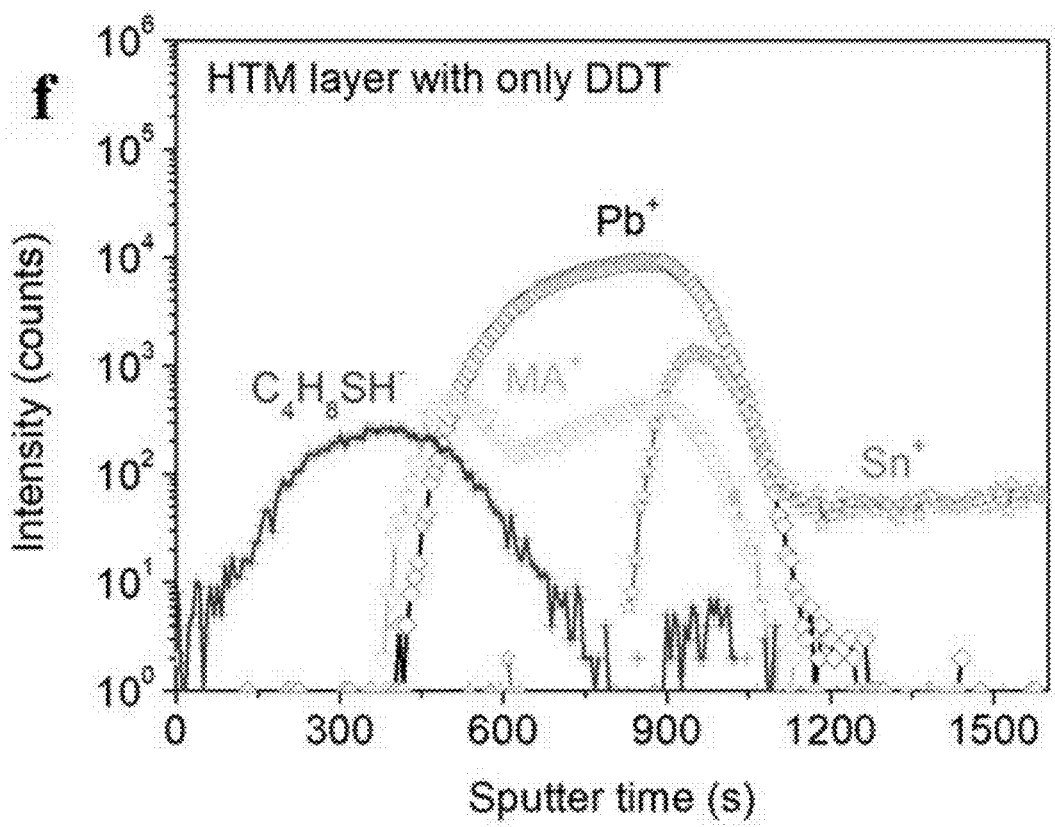
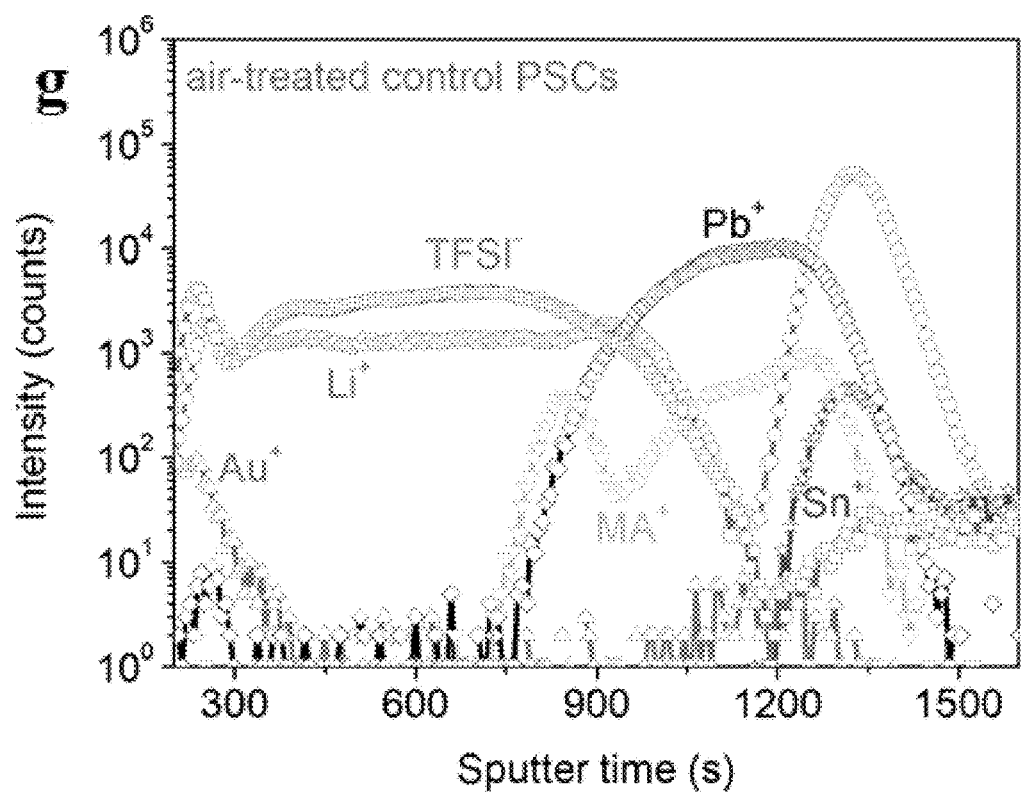
Figure 8 cont.

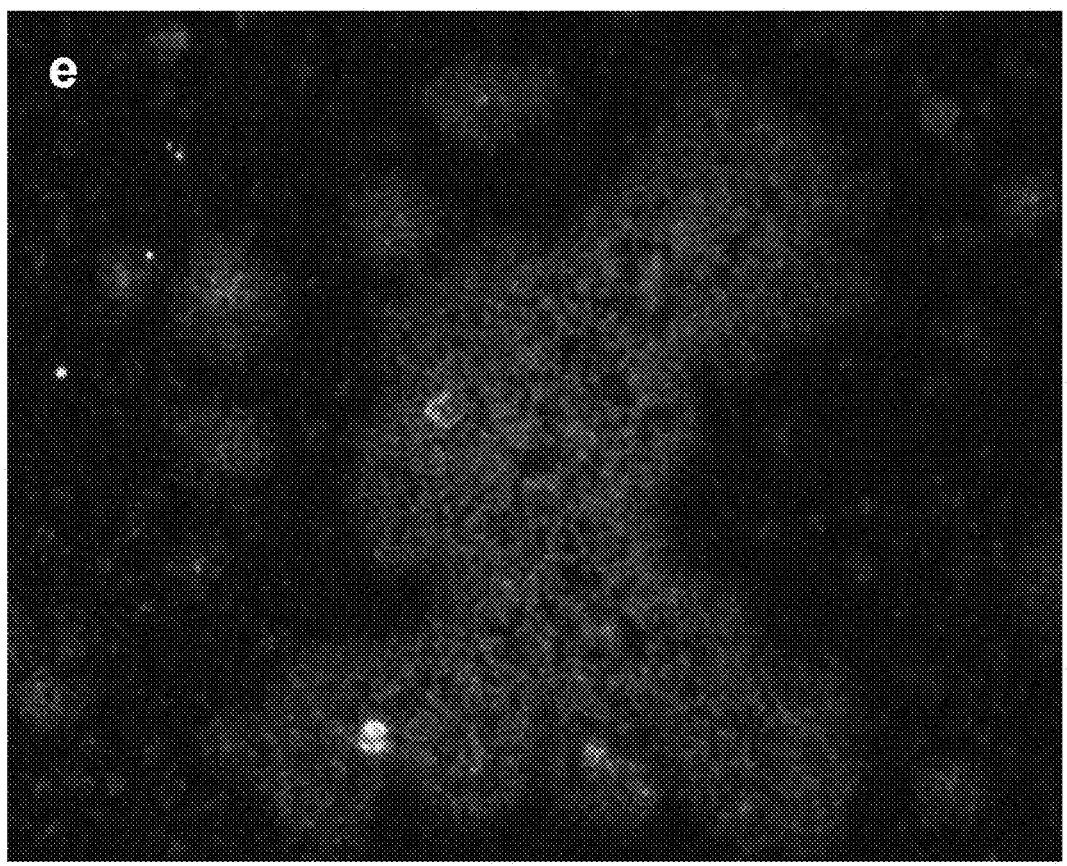
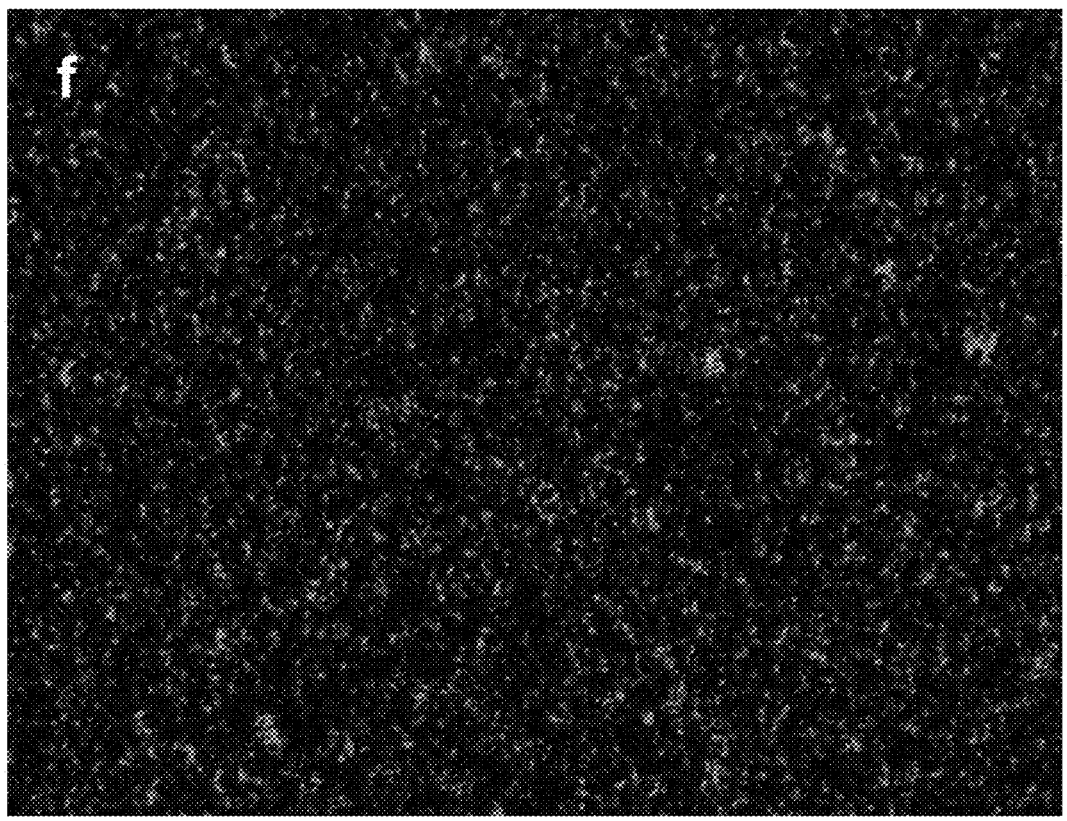
Figure 9 cont.

PEROVSKITE SOLAR CELL AND METHOD OF MAKING THE SAME

TECHNICAL FIELD

This disclosure relates generally to perovskite solar cells and methods of forming perovskite solar cells.

BACKGROUND

Since the employment of solid-state Spiro-MeOTAD (2,2',7,7'-tetrakis(N,N-di-p-methoxyphenyl-amine)9,9'-spirobifluorene) as a hole transport layer (HTL), perovskite solar cells (PSC) power conversion efficiencies (PCEs) have skyrocketed, recently reaching 24.2%

However, an overall PSC stability is still far from that required for commercialization. One of the most prominent sources of instabilities arises from the Spiro-MeOTAD HTL, including inconsistency due to uncontrolled oxidation, moisture instability from the hygroscopic nature of dopants that facilitates ingress of moisture from ambient to the perovskite, and thermal instability from the growth of large crystalline domains upon heating. Moreover, an additional oxidation process, usually during storage in oxygen or air for a certain time, is required for freshly prepared Spiro-MeO-TAD HTL as a critical step to achieve high PCEs. During this process, the energy level alignment at the perovskite/Spiro-MeOTAD HTL interface is optimized whilst recombination is minimized and carrier extraction efficiency maximized.

Unfortunately, this additional oxidation process can be affected by many factors including dopant concentration, environmental conditions, chemical interactions with underlying layers, and possible diffusion and phase-segregation of components in the HTL. A non-trivial consequence is that it is challenging, if not impossible, to adequately control the oxidation progress of Spiro-MeOTAD.

As a result, tremendous efforts have been made in controllably doping Spiro-MeOTAD. For example, FK 209 (Co-TFSI) was developed as a co-dopant with Li-TFSI to oxidize Spiro-MeOTAD and generate additional charge carriers. However, FK 209 negatively impacts PSCs stability over time and its price does not meet a low-cost prerequisite for future up-scaling. Besides, numerous efforts have been made in order to improve the humid and/or thermal stability of PSCs by seeking alternative HTL candidates. PTAA (poly-triarylamine) appears as an alternative candidate that, in some cases, can achieve comparable PCEs to devices employing Spiro-MeOTAD. Another promising candidate is P3HT [poly(3-hexylthiophene)]. A double-layered halide architecture appears to improve the interfacial contact between perovskite and P3HT HTL, demonstrating a considerable enhancement of PCEs. However, these materials have several drawbacks in terms of commercialization, including high cost, limitations in the conversion process, restricted reporting of high PCEs, and lack of evidence for comprehensive stability testing. Apart from these two HTL candidates, most suggested alternatives have not yet demonstrated PCEs close to 20%. As a result, at the current stage, Spiro-MeOTAD is still the dominant HTL implemented by the majority of high efficiency PSCs, so the issues of Spiro-MeOTAD remain.

It is to be understood that, if any prior art is referred to herein, such reference does not constitute an admission that the prior art forms a part of the common general knowledge in the art, in Australia or any other country.

SUMMARY

Disclosed is a method of forming a photovoltaic device, including the steps of: providing a substrate;
  forming a perovskite photovoltaic cell on the substrate comprising forming a hole transport layer, the hole transport layer having an additive that results in one or more of the following:
  reduced formation of crystalline domains in the hole transport layer; reduced size of pinholes in the hole transport layer; and increased hydrophobicity of the hole transport layer.

In embodiments, disclosed is a method of forming a photovoltaic device, including the steps of:
  providing a substrate; and
  forming a perovskite photovoltaic cell on the substrate comprising forming a hole transport layer, the hole transport layer comprising an organosulphur additive.

Disclosed is a photovoltaic device comprising:
  a substrate; and
  a perovskite photovoltaic cell comprising a hole transport layer having an additive that that results in one or more of the following: reduced formation of crystalline domains in the hole transport layer; reduced size of pinholes in the hole transport layer; and increased hydrophobicity of the hole transport layer.

In embodiments, disclosed is a photovoltaic device comprising:
  a substrate; and
  a perovskite photovoltaic cell comprising a hole transport layer which comprises an organosulphur additive.

An advantage of the additive is that it may help to improve long-term moisture and/or thermal stability of perovskite photovoltaic cells and/or dopant homogeneity. The additive may be included in a mixture that is used to form the hole transport layer. For example, the additive may be dissolved in a solution that is used to form the hole transport layer.

BRIEF DESCRIPTION OF FIGURES

Embodiments of the disclosure will now be described by way of example with reference to the following non-limiting Figures.

FIG. 12 shows the impacts of thermal and illumination stresses on device performance: (a) J-V curve of the thermal-aged control cell after re-depositing new Spiro-OMeTAD HTM layer measured from reverse-bias scan direction under simulated AM 1.5 sunlight; the renewed cell shows a PCE of 18.7% with a $V_{OC}$ of 1.11V, a $J_{SC}$ of 22.7 mA cm$^{-2}$, and a FF of 74.3%; (b) J-V curve of the illumination-aged control cell after re-depositing new Spiro-OMeTAD HTM layer measured from reverse-bias scan direction under simulated AM 1.5 sunlight; the renewed cell shows a PCE of 10.4% with a $V_{OC}$ of 1.0V, a $J_{SC}$ of 18.4 mA cm$^{-2}$, and a FF of 56.1%; tape was used to remove previously deposited Au contact and chlorobenzene used to wash away previously deposited Spiro-OMeTAD HTM layer.

DETAILED DESCRIPTION OF EMBODIMENTS

Figure 1:
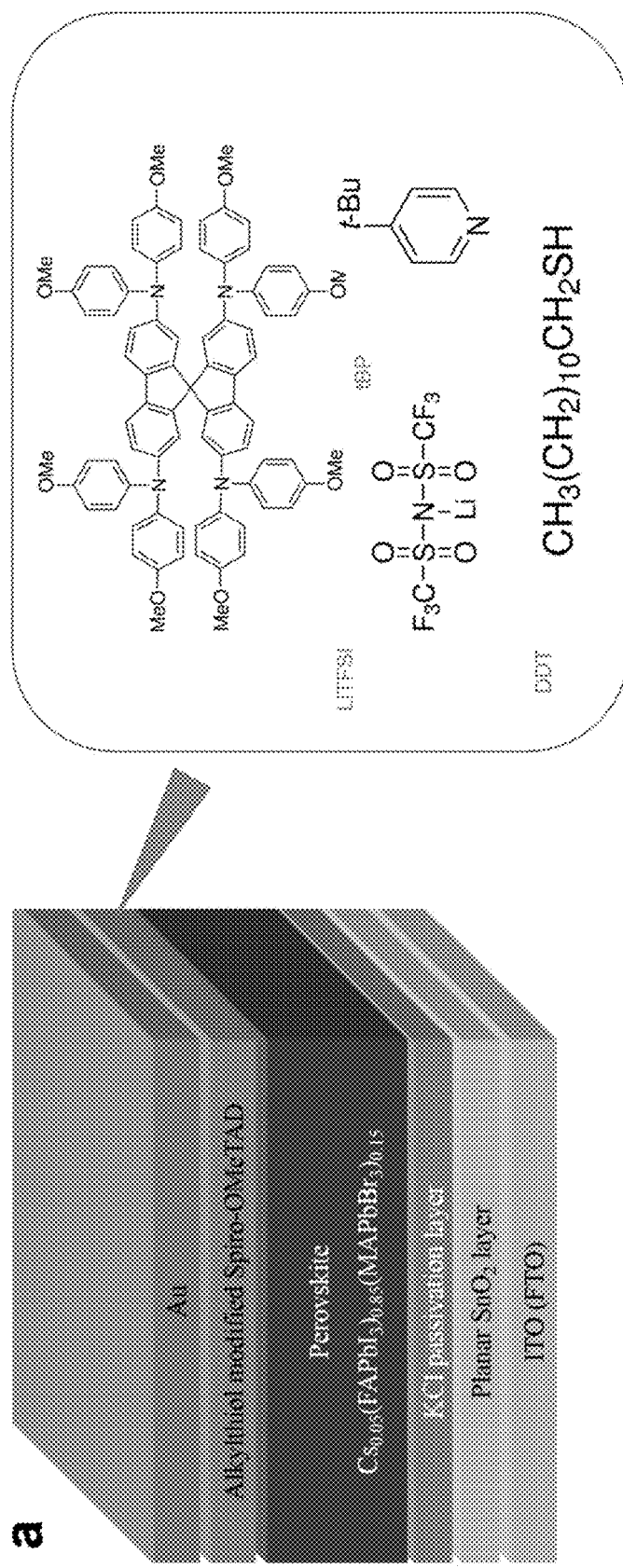
FIG. 1 shows: (a) an embodiment of the disclosed photovoltaic device, and the molecule structures of Spiro-OMeTAD and alkylthiol (1-DDT); (b) J-V curves of the best-performing photovoltaic device for each condition measured from forward bias to short-circuit scan (reverse scan) under simulated AM 1.5 sunlight; (c) histograms showing embodiments of photovoltaic device PCEs of at least 20 cells per type, fitted with Gaussian distributions (solid lines); (d) external quantum efficiency (EQE) spectra and photocurrent, integrated over the AM 1.5 (100 mW cm-2) solar spectrum; and (e) J-V curves of freshly prepared devices for each condition measured under the reverse—(RS) and forward-bias (FS) scan directions, respectively, between −0.1 V and 1.2 V.
Figure 1:
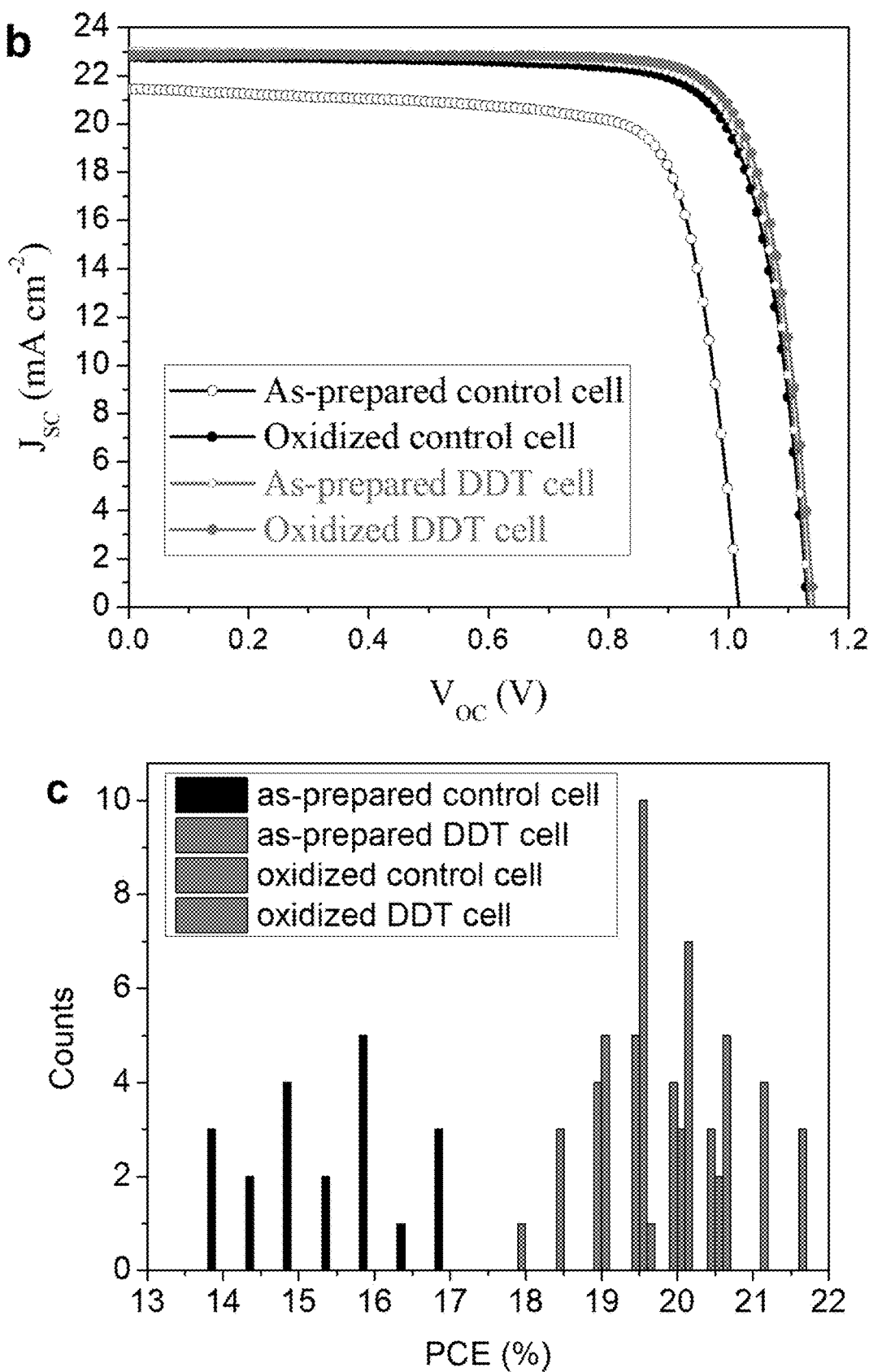

In an aspect, disclosed is a method of forming a photovoltaic device, including the steps of:

providing a substrate; and forming a perovskite photovoltaic cell on the substrate comprising forming a hole transport layer, the hole transport layer comprising an additive.

In embodiments, disclosed is a method of forming a photovoltaic device, including the steps of:

providing a substrate; and forming a perovskite photovoltaic cell on the substrate comprising forming a hole transport layer, the hole transport layer comprising a heterorganic additive.

An embodiment provides a method of forming a photovoltaic device, including the steps of:

providing a substrate; and forming a perovskite photovoltaic cell on the substrate including forming a hole transport layer, the hole transport layer comprising an additive that results in one or more of the following: at least reduces the formation of crystalline domains in the hole transport layer; reduces a pinhole size in the hole transport layer; increases a hydrophobicity of the hole transport layer.

In an aspect, disclosed is a photovoltaic device comprising:

a substrate; and a perovskite photovoltaic cell comprising a hole transport layer which comprises an additive.

In embodiments, disclosed is a photovoltaic device comprising:

a substrate; and a perovskite photovoltaic cell comprising a hole transport layer which comprises a heterorganic additive.

In embodiments, disclosed is a photovoltaic device comprising:

a substrate; and a perovskite photovoltaic cell comprising a hole transport layer having an additive that that results in one or more of the following: reduced formation of crystalline domains in the hole transport layer; reduced size of pinholes in the hole transport layer; and increased hydrophobicity of the hole transport layer.

In embodiments, disclosed is a photovoltaic device comprising:

a substrate; and a perovskite photovoltaic cell comprising a hole transport layer which comprises an organosulphur additive.

The following comments apply, mutatis mutandis, to each aspect and disclosed embodiment above.

By including the additive, long-term moisture and thermal stability of the perovskite photovoltaic cell may be improved. The additive may substantially prevent the formation of crystalline domains in the hole transport layer, reduce a pinhole size in the hole transport layer, and increase a hydrophobicity of the hole transport layer. The additive may also facilitate improved homogeneity of dopant within the HTL. This improved distribution of dopant is believed to be highly beneficial for improved PSC performance.

Preventing the formation of crystalline domains may help to improve the interfacial and electrical properties of the hole transport layer, which may lead to an increased adhesive and cohesive fracture resistance and reduce the formation of additional undesired layer(s) that acts as an energy barrier for charge extraction. Reducing pinhole size may help to reduce the inward and outward diffusion of gases and molecules through the hole transport layer, which may help to reduce moisture-induced degradation. Increasing a hydrophobicity may help to reduce a wettability of the hole transport layer which may help to reduce moisture-induced degradation.

The additive may reduce a HOMO energy level of the hole transport layer compared to the hole transport layer in the absence of the additive. Having a hole transport layer with a lower HOMO energy level may help to improve energy band alignment with reduced voltage loss at the perovskite/hole transport layer heterojunction. The hole transport layer may have a lower resistance and high recombination resistance compared to the hole transport layer in the absence of the additive. A lower resistance and high recombination resistance may help to improve a performance of the photovoltaic device.

A pinhole size of the hole transport layer may have a maximum diameter of about 100 nm. A contact angle of a water drop on the hole transport layer may be greater than 35°, such as >50°, >80°, >90°, >100°, >110°, >120°, >140°. In an embodiment, the contact angle is about 100° such as 101°. In an embodiment, the hole transport layer is superhydrophobic. For example, a contact angle of the hole transport layer may be >150°. In an embodiment, the ability of the hole transport layer to resist moisture degradation increases as the hydrophobicity of the hole transport later increases. The contact angle may change depending on a concentration and/or distribution of the additive in the hole transport layer. In an embodiment the additive is substantially homogenously distributed in the hole transport layer. The additive may act as a homogenising/solubilising agent allow the components of the hole transport layer to be homogenously distributed in the hole transport layer. The additive may at least partially inhibit the formation of crystalline domains in the hole transport layer.

The hole transport layer may comprise a number of components. In embodiments, the hole transport layer may comprise an organic hole transport material and/or a polymer hole transport material.

In embodiments, the hole transport layer may comprise a spirobifluorene hole transport material. For example, the spirobifluorene hole transport material may be 2,2',7,7'-tetrakis(N,N-di-p-methoxyphenyl-amine) 9,9'-spirobifluorene (Spiro-MeOTAD).

In embodiments, the hole transport layer may comprise a polymeric amine and/or polymeric thiophene material including but not limited to poly-triarylamine (PTAA) and poly(3-hexylthiophene) (P3HT).

In embodiments, the hole transport layer may comprise an organic hole transport material and/or a polymer hole transport material and a lithium dopant.

Other components, such as those dopants employed to enhance hole conductivity or morphology control agents, may also be present in any embodiment described herein. Non-limiting examples may include 4-tert-butylpyridine (tBP) and/or a (bis(trifluoromethane)sulfonimidelithium salt (TFSI). The TFSI salt may be Li$^+$ TFSI.

In embodiments, the hole transport layer comprises 2,2',7,7'-tetrakis(N,N-di-p-methoxyphenyl-amine) 9,9'-spirobifluorene (Spiro-MeOTAD) and LiTFSI.

In embodiments, the hole transport layer comprises 2,2',7,7'-tetrakis(N,N-di-p-methoxyphenyl-amine) 9,9'-spirobifluorene (Spiro-MeOTAD), LiTFSI and tBP.

The hole transport layer may be formed by applying a hole transport layer precursor solution onto the perovskite photovoltaic cell. The hole transport layer precursor solution may include the additive or the additive may be separately applied concurrently or immediately subsequent to the precursor solution being laid down. The hole transport layer precursor solution may be formed from a number of components including any one or more of those described above as forming part of the hole transport layer. For example, the hole transport layer precursor solution may include one or more components selected from the group consisting of Spiro-MeOTAD, PTAA, P3HT and a TFSI salt. In an embodiment the hole transport layer precursor solution comprises Spiro-MeOTAD, Li$^+$ TFSI and the additive. A solvent used to form the hole transport layer precursor solution may be an organic solvent. The solvent may be chlorobenzene. The hole transport layer may be formed by spin coating the hole transport layer precursor solution on the perovskite photovoltaic cell.

In an embodiment the additive is a $C_4$-$C_{40}$ alkyl-species, preferably a $C_6$-$C_{30}$ alkyl, or $C_8$-$C_{26}$ alkyl species. The alkyl-species may include an alkane, alkene, alkyne and/or aryl species. The alkyl-species may have a boiling point that is high than a melting point of one of the other components in the hole transport layer. For example, when Spiro-MeOTAD is used in the hole transport layer, the alkyl species may have a boiling point greater than the melting point of Spiro-MeOTAD (234° C.). The additive may include two or more species.

The alkyl-species discussed above can have a heteroatom such as S, N, B, P, O, F, Cl, Br.

In embodiments, the additive is a heterorganic species. Suitable heterorganic species may be selected from the group consisting of heteroalkyl, heteroalkenyl and heteroalkynyl, each of which may be $C_4$-$C_{40}$, $C_6$-$C_{36}$, $C_8$-$C_{32}$, or $C_{10}$-$C_{30}$.

In embodiments, the additive is an organosulphur additive. The organosulphur additive may be a long chain organosulphur additive. The organosulphur additive may be an alkyl organosulphur additive, branched or unbranched. The organosulphur additive may be selected from an alkylthiol and a disulphide. The disulphide may be a dialkyldisulphide of formula —R—S—S—R' wherein R and R' are independently selected from $C_4$-$C_{20}$ alkyl, $C_6$-$C_{18}$ alkyl and $C_8$-$C_{16}$ alkyl.

In one embodiment, the additive is a $C_4$-$C_{40}$ sulphur-containing alkyl-species including a $C_8$-$C_{30}$ sulphur-containing alkyl-species or a $C_{10}$-$C_{26}$ sulphur-containing alkyl-species. In an embodiment the alkyl species is an alkylthiol. In a further embodiment, the alkyl species is a disulphide alkyl species. When the additive is an alkylthiol it may be $C_8$-$C_{20}$ alkyl including a $C_8$, $C_9$, $C_{10}$, $C_{11}$, $C_{12}$, $C_{13}$, $C_{14}$, $C_{15}$, and $C_{16}$ alkyl species. In an embodiment, the alkylthiol is a hexyl, heptyl, octyl, nonyl, decyl, undecyl and/or dodecyl and/or optionally substituted species. In an embodiment the alkylthiol is 1-dodecanethiol (1-DDT or DDT).

In embodiments where the additive is a disulphide species it may be a coupled species of the listed alkylthiols. The disulphide species may therefore be selected from a $C_8$—$C_{20}$—S—S—$C_8$—$C_{20}$ disulphide or a $C_{10}$—$C_{18}$—S—S—$C_{10}$—$C_{18}$ disulphide. In one embodiment, the disulphide species may be didodecyl disulphide. It will be appreciated that the addition of an alkylthiol species, such as DDT, to the precursor solution may result in the formation of didodecyl disulphide in situ to some degree. If the additive is to be present as a disulphide it may therefore be added to the precursor solution directly as a disulphide compound or as the corresponding alkylthiol and the desired disulphide is then formed.

The hole transport layer may have a concentration of additive less than 5 mol % relative to one of Spiro-MeO-TAD, PTAA, P2HT and/or TFSI. A molar ratio of the alkyl-species, preferably sulphur-containing alkyl species, to one of Spiro-MeOTAD, PTAA, P2HT and/or TFSI may range from [0.1-1.0]:[99.9-99]. In an embodiment, a molar ratio of [alkylthiol]:[Spiro-MeOTAD] ranges from [0.2-0.8]:[99.8-99.2].

The perovskite photovoltaic cell may be an organic perovskite. The organic perovskite may have a formula $M_a(FAPbX_3)_b(MAPbY_3)_{1-(a+b)}$, where M is a metal, X and Y are halides, FA is a formamidinium cation and MA is a methylammonium cation. M may include Cs or Rb. X and/or Y may be F, Cl, Br, I. In an embodiment, the organic perovskite has a formula $Cs_a(FAPbI_3)_b(MAPbBr_3)_{1-(a+b)}$, where a ranges from 0-0.1 and b ranges from 0.5-1.0. In an embodiment, the organic perovskite is $Cs_{0.05}(FAPbI_3)_{0.85}(MAPbBr_3)_{0.15}$.

In one embodiment the photovoltaic device has a passivation layer positioned between the substrate and the perovskite photovoltaic cell. For example, the passivation layer may be an alkaline salt such as KCl. The photovoltaic device may have an open-circuit voltage of 1.135V or more.

In one preferred embodiment, disclosed is a photovoltaic device comprising:
a substrate; and
a perovskite photovoltaic cell comprising a hole transport layer, the hole transport layer comprising:
an organic or polymer hole transport material;
a lithium dopant; and
an organosulphur additive.

The organic hole transport layer may be a spirobifluorene hole transport material. For example, the spirobifluorene hole transport material may be 2,2',7,7'-tetrakis(N,N-di-p-methoxyphenyl-amine) 9,9'-spirobifluorene (Spiro-MeO-TAD).

The polymer hole transport material may be a polymeric amine and/or polymeric thiophene material including, but not limited to, poly-triarylamine (PTAA) and poly(3-hexylthiophene) (P3HT).

The photovoltaic device may further comprise electrodes, an electron transport layer, and one or more passivation and/or blocking layers, as is known in the field to achieve a working device.

An embodiment provides a photovoltaic device formed using an embodiment of the disclosed method.

EXAMPLES

Embodiments will now be described with reference to the accompanying non-limiting Examples.

1-dodecanethiol (1-DDT) was incorporated into a hole transport layer (HTL) formed from Li-TFSI, tBP, Spiro-OMeTAD (FIG. 1a). Enhanced efficiencies in freshly prepared PSCs comprising 0.2-0.8 mol % of 1-DDT with respect to standard Spiro-MeOTAD were observed. This modified HTL was used with a KCl salt layer being deposited on a $SnO_2$ surface formed on the substrate prior to the perovskite fabrication to passivate the perovskite/electron-transport-layer (ETL) interface. For the following discussion, HTLs having 1-DDT are referred to as '1-DDT', and denote the counterparts without 1-DDT as 'control'. Freshly prepared 1-DDT devices can immediately reach efficiencies comparable to the peak efficiency values of control devices after an additional oxidation process (namely, storage in an air desiccator for several days in a lab) (FIG. 1b and Table 1).

TABLE 1

Photovoltaic parameters of the control and 1-DDT devices before and after oxidation as well as diode parameters by curve fitting of light IV data of the cells in FIG. 1a, including the reverse saturation current density ($J_0$), the ideality factor (A), the series resistance ($R_{SERIES}$), and the shunt resistance ($R_{SHUNT}$).

| | $J_{SC}$ (mA cm$^{-2}$) | $V_{OC}$ (mV) | FF (%) | PCE (%) | Jo (mA cm$^{-2}$) | A | $R_{SERIES}$ (Ω cm$^{-2}$) | $R_{SHUNT}$ (Ω cm$^{-2}$) |
|---|---|---|---|---|---|---|---|---|
| fresh control | 21.8 | 1017.8 | 74.8 | 16.6 | 1.7E−08 | 1.9 | 2.0 | 991 |
| oxidized control | 22.8 | 1131.9 | 78.4 | 20.2 | 1.1E−09 | 1.85 | 1.3 | 1777 |
| fresh 1-DDT | 23.0 | 1134.7 | 79.0 | 20.6 | 1.0E−09 | 1.85 | 1.2 | 1967 |
| oxidized 1-DDT | 22.9 | 1142.0 | 80.3 | 21.0 | 8.5E−10 | 1.85 | 0.9 | 2716 |

A freshly prepared 'champion' device, comprising 0.2 mol % 1-DDT, had an open-circuit voltage (VOC) of 1.135 V, a short-circuit photocurrent density (JSC) of 23 mA cm$^{-2}$, and a high fill factor (FF) of 79%, yielding a PCE of 20.6%. Further oxidation of this 1-DDT device only gave a slight increase in VOC and FF values, exhibiting a PCE of 21.0% with a JSC of 22.9 mA cm-2, a VOC of 1.14 V, and a FF of 80.3%. By contrast, a freshly prepared champion control device exhibits an inferior PCE of 16.6%, owing to a low VOC of 1.018 V, JSC of 21.8 mA cm$^{-2}$ and FF of 74.8%, although significant improvement is observed in all photovoltaic parameters after additional oxidation process as expected, reaching peak PCE of 20.2%.

It is noteworthy that there is a significant difference in the calculated diode parameters by fitting light J-V data with a 1-diode model. The reverse saturation current density ($J_0$) of the freshly prepared 1-DDT device is one order of magnitude lower than that of the control device, suggesting a dramatically reduced recombination loss that explains the increased VOC and FF values. To elucidate the change of PCE before and after additional oxidation process, a change index (C-index) is used, defined as C-index=(PCE$_{PEAK}$−PCE$_{INITIAL}$)/PCE$_{PEAK}$, where PCE$_{PEAK}$ and PCE$_{INITIAL}$ are device peak PCE and initial PCE, respectively. The C-index is as high as 17.8% for controls whilst being as low as 1.9% for 1-DDT counterparts. Histograms of the PCEs for freshly prepared control and 1-DDT (0.2 mol %) devices are shown in FIG. 1c. JSC values derived from the J-V curves well match with that derived from the external quantum efficiency (EQE) results, integrated over the solar spectrum (FIG. 1d). Note that freshly prepared 1-DDT devices show little hysteresis, whereas there is pronounced hysteresis for freshly prepared control devices (FIG. 1e) though the hysteresis for control devices nearly disappears after the additional oxidation process.

In order to understand why adding 1-DDT improves the device performance, a range of characterizations was carried out on films and devices. The incorporation of 1-DDT into Spiro-MeOTAD seems to have no obvious impact on the structural properties of the underlying perovskite. With addition of 1-DDT, the X-ray diffraction (XRD) peak positions of perovskite remain unaltered, indicating consistency with the corresponding control sample and no perturbation of the underneath perovskite crystal lattice. The intensities of the main perovskite diffraction peaks remain identical, suggesting neither texturing nor re-crystallisation caused by 1-DDT, in good agreement with the unchanged perovskite grains seen in scanning electron microscopy (SEM) images. The thicknesses of Spiro-MeOTAD HTLs in complete devices are about 150 nm regardless of the addition of 1-DDT.

Instead, the introduction of 1-DDT greatly modifies the electrical properties of Spiro-MeOTAD. An increased intensity in the film absorption with the maximum peak was observed at around 480 nm, which is consistent with the formation of oxidized Spiro-OMeTAD.+TFSI- (p-doping). This suggests electrically enhanced interaction between Li-TFSI and freshly prepared Spiro-MeOTAD without applying any additional oxidation process. Further, Kelvin probe force microscopy (KPFM) analysis is used to determine the electrical properties of freshly prepared Spiro-MeOTAD HTLs. From the contact potential difference (CPD) measurement, a change in the Fermi energy level of freshly prepared Spiro-MeOTAD film—from 4.94 eV to 5.09 eV—with respect to vacuum after addition of 1-DDT is observed, confirming the achieved oxidation (p-doping). Because the Fermi level lies very close to the edge of the HOMO level for p-dopant incorporated Spiro-OMeTAD, it indicates 1-DDT Spiro-OMeTAD HTL has a lower HOMO energy level by 0.15 eV compared to that of the control HTL. This suggests an improved energy band alignment, with reduced voltage loss at the perovskite/Spiro-OMeTAD heterojunction, in good agreement with the improved VOC distribution.

Figure 2:
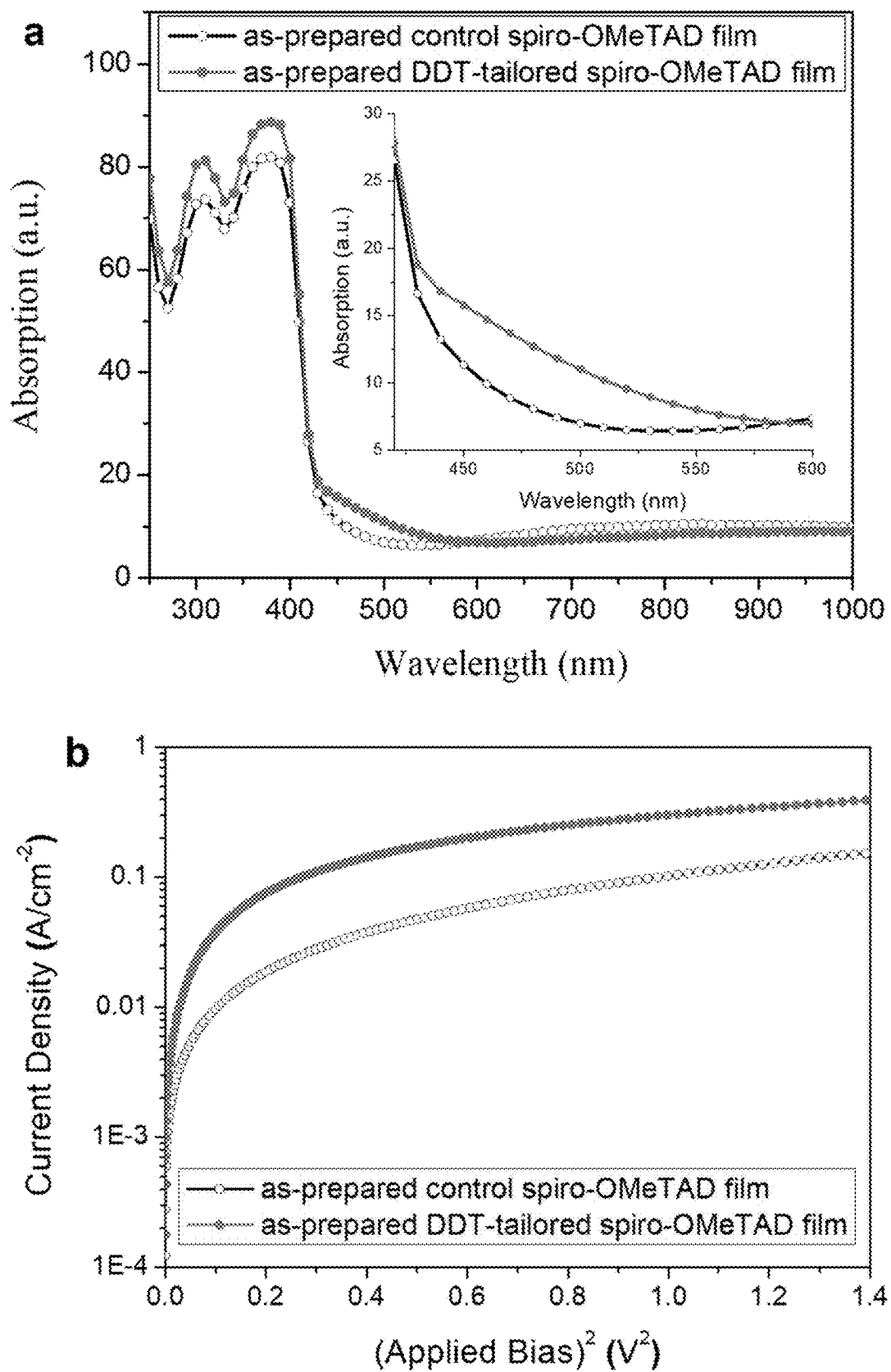
FIG. 2 shows: (a) UV-vis absorption of freshly prepared control and 1-DDT Spiro-OMeTAD films on quartz substrates; (b) current density vs the square of the applied bias for "hole only" diodes composed of FTO/spin-coated Spiro-OMeTAD with or without 1-DDT (200 nm)/Au; (c) steady state PL spectra of freshly prepared perovskite film (blue), freshly prepared perovskite/control Spiro-MeOTAD film (black), and freshly prepared perovskite/1-DDT Spiro-MeO-TAD film (red) on a quartz substrate, excitation with 405 nm light was from the film side; (d) EIS of freshly prepared control, oxidized control, and freshly prepared 1-DDT devices, the Nyquist plots were obtained with an applied bias voltage of 0.95 V in the dark condition; (e) ToF-SIMS depth profiles of freshly prepared control photovoltaic devices; and (f) ToF-SIMS depth profiles of freshly prepared photovoltaic devices with 1-DDT as the additive.
Figure 2:
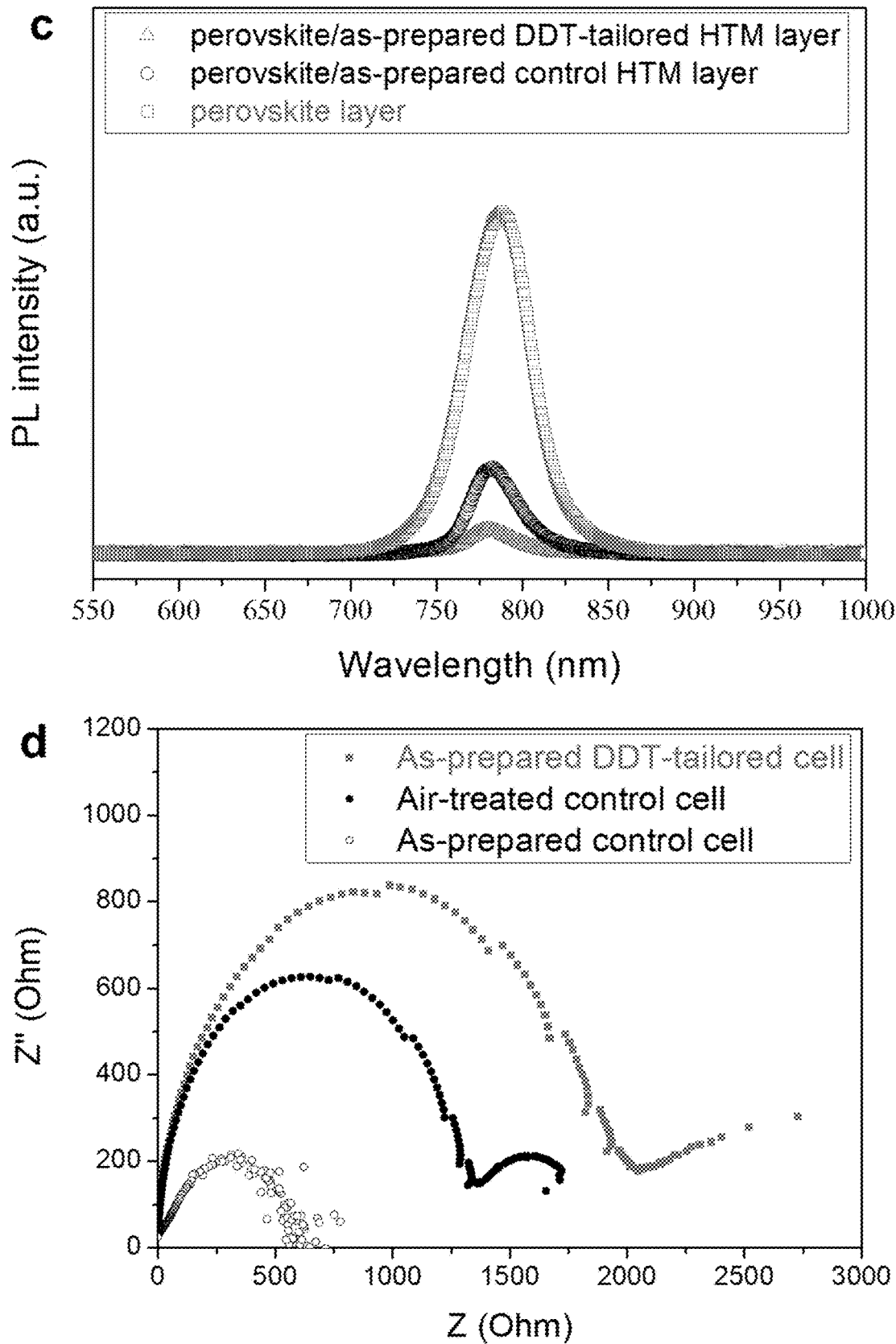
Figure 2:
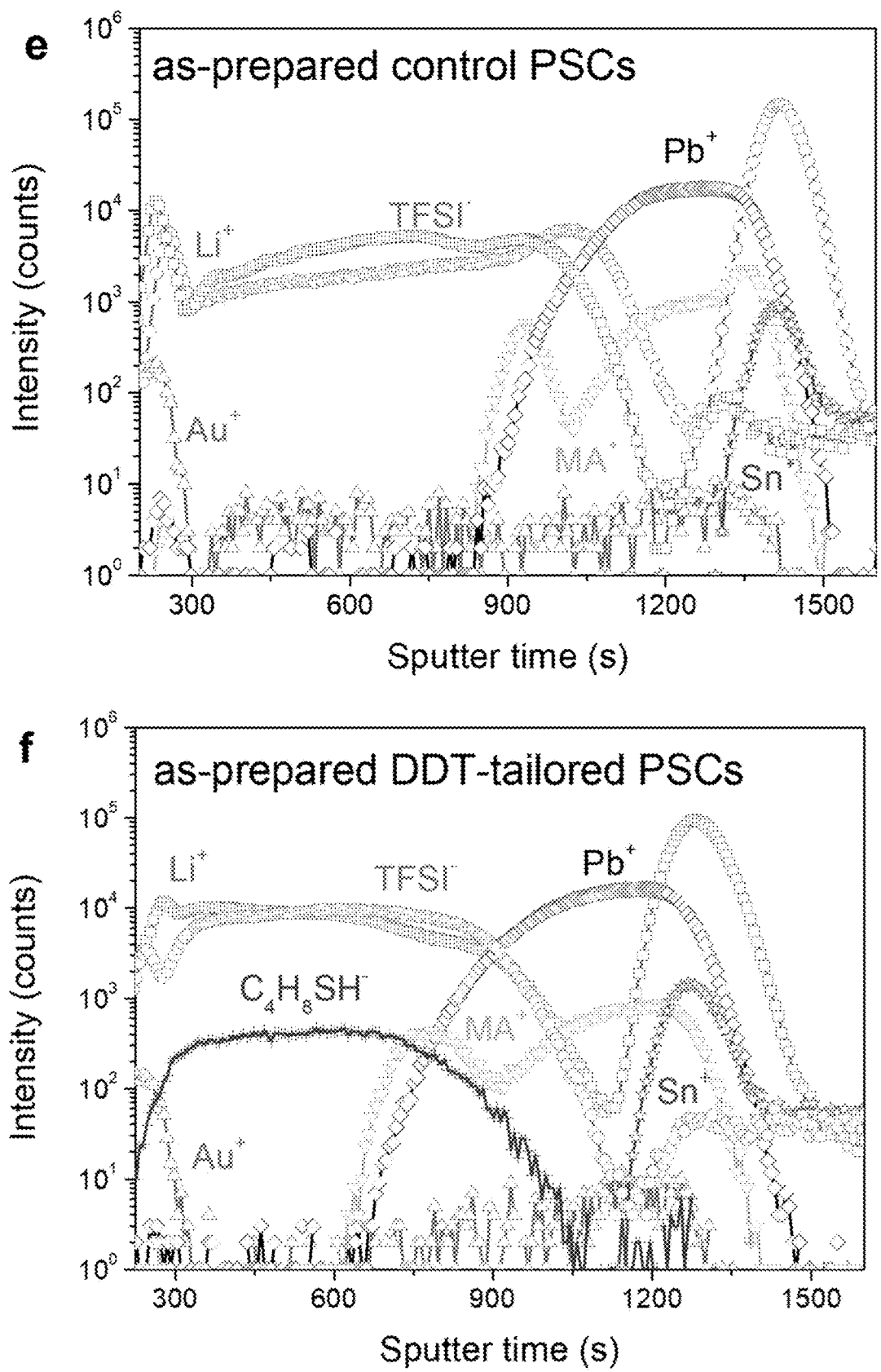

Space charge limited current (SCLC) measurements show enhanced hole mobility for freshly prepared Spiro-OMeTAD HTL, from $2.7 \times 10^{-3}$ cm$^2$V$^{-1}$S$^{-1}$ to $1.1 \times 10^{-2}$ cm$^2$V$^{-1}$S$^{-1}$ (FIG. 2b), indicating the improved charge extraction by one order of magnitude after the addition of 1-DDT. Photoluminescence (PL) spectra of the perovskite film (quartz/perovskite/HTL) was performed to investigate hole separation at the heterointerface between perovskite and the overlying Spiro-OMeTAD layer. It was observed that the PL intensity of perovskite peak for the 1-DDT sample quenches more significantly than that for the control, affording more efficient hole injection from perovskite to the HTL (FIG. 2c). This supports the SCLC result and agrees with the improved JSC values for freshly-prepared 1-DDT devices (FIG. 1). Electrical impedance spectroscopy (EIS) provides further insight into the hole transport in Spiro-OMeTAD and the recombination occurring at the interface. By fitting with an equivalent circuit, a fitted series resistance (Rs) and a fitted recombination resistance ($R_{REC}$) are deduced (FIG. 2d). It was observed that, on one hand, the Rs (1.2Ω) value in the freshly prepared 1-DDT device is lower than that (3.9Ω) in the control counterpart and even lower than that (2.1Ω) in the oxidized control. On the other hand, the RREC value (1927Ω) in the freshly prepared 1-DDT device is much higher than that (589Ω) in the control counterpart and even higher than that (1311Ω) in the oxidized control. The much lower Rs and higher $R_{REC}$ indicate the improved charge transport and the reduced recombination in 1-DDT devices, consistent with the improved photovoltaic parameters in Table 1.

In order to probe a chemical composition throughout the film, time-of-flight secondary-ion mass spectrometry (ToF- SIMS) was performed to allow the study of depth profiles for both positive and negative secondary ions. Given the same Spiro-OMeTAD recipe except for the addition of 1-DDT, in the freshly prepared 1-DDT PSC, p-dopant (Li-TFSI) shows nearly an order of magnitude enhanced intensity (related to solubility) throughout the Spiro-OMeTAD HTL compared to that in the control counterpart (FIG. 2e and FIG. 2f), explaining the improved hole conductivity shown in FIG. 2b. The strong dopant accumulation at the Au/HTL and HTL/perovskite interfaces observed in the freshly prepared control is significantly diminished after the addition of 1-DDT, and its homogeneity throughout the whole HTL is markedly improved. Dopant accumulation at interfaces and/or dopant gradient across the HTL may cause the poor electrical properties of freshly-prepared Spiro-OMeTAD films and the consequent low PCEs of PSCs, in good agreement with the J-V results (FIG. 1 and Table 1).

For completeness, the effect of the additional oxidation process on the p-dopant distribution was investigated. It is noteworthy that the additional oxidation process neither completely resolves the dopant accumulation problem at interfaces nor improves the solubility of dopant in the HTL, though it diminishes p-dopant preferential distribution close to the bottom of HTL (FIG. S8). However, difference of $Li^+$ ions in both freshly prepared 1-DDT and control devices was not observed. Interestingly, $Li^+$ ions diffuse across the perovskite layer and accumulate at the interface with $SnO_2$ ETL for all samples. Dopant-free 1-DDT samples were prepared (to exclude the possible disturbance from S-containing species in Li-TFSI) and detect 1-DDT uniformly distributed throughout the whole Spiro-OMeTAD film.

Figure 3:
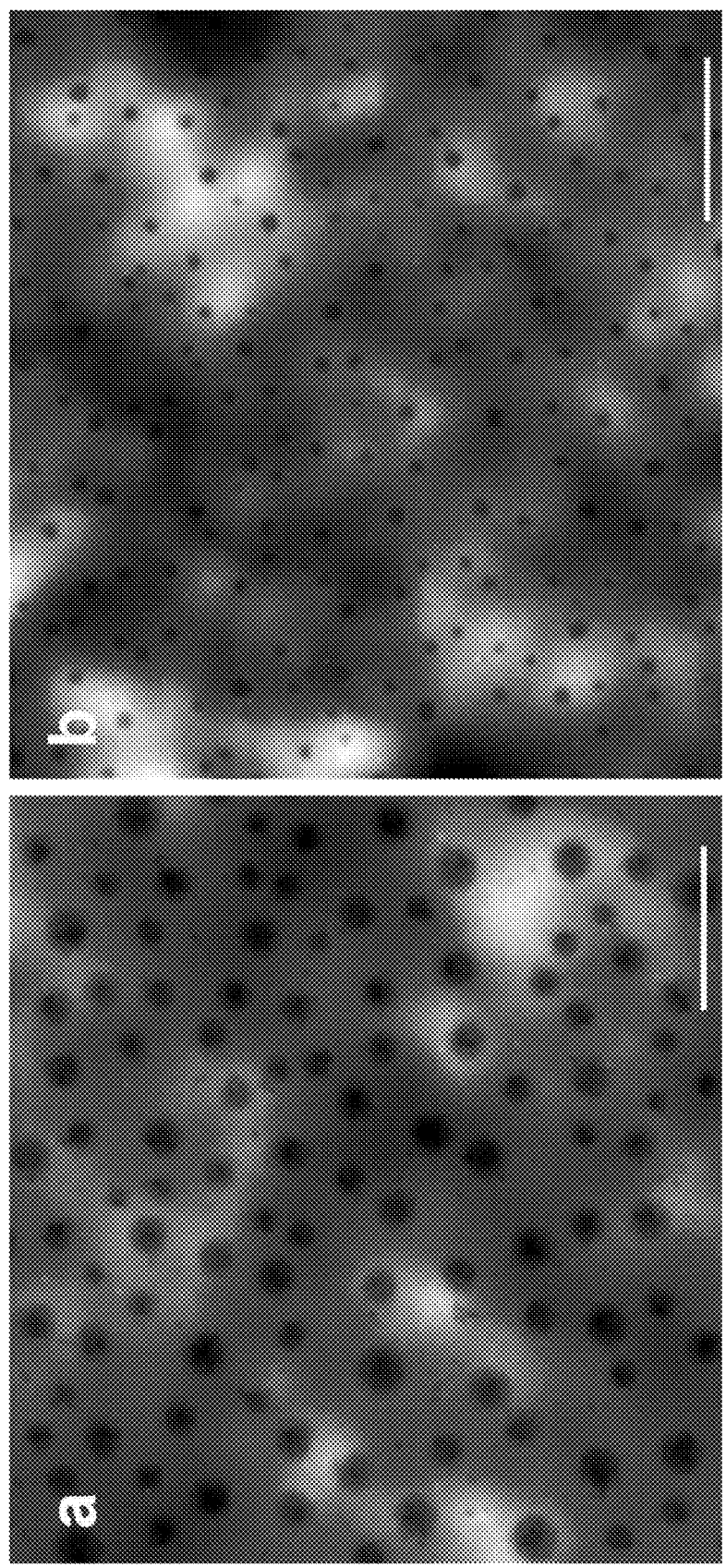
FIG. 3 shows results from film stability under moisture stressing and heat stressing: (a) tapping-mode AFM image of freshly prepared control Spiro-MeOTAD film; (b) tapping-mode AFM image of freshly prepared 1-DDT containing Spiro-MeOTAD film; (c) tapping-mode AFM image of moisture aged control Spiro-MeOTAD film; (d), tapping-mode AFM image of moisture aged 1-DDT containing Spiro-MeOTAD film in ambient air at a relative humidity of 50% for 600 hours; (e), tapping-mode AFM image of a thermally aged control Spiro-MeOTAD film after aging at 50° C. in N2 atmosphere for 120 hours; (f) thermally aged control of a 1-DDT containing Spiro-MeOTAD film after aging at 50° C. in N2 atmosphere for 120 hours; (g) microscope photograph (50× magnification) of the film from (c); (h) microscope photographs (50× magnification) of the film from (d); (h) microscope photographs (50× magnification) of the film from (e); (h) microscope photographs (50× magnification) of the film from (f); (k) XRD patterns of the control and 1-DDT devices before and after moisture stressing at a relative humidity of 35-80% for 2880 hours; and (l) XRD patterns of the control and 1-DDT devices before and after heat stressing at 50° C. in N2 atmosphere for 120 hours. In (k) and (l) §: yellow-phase FAPbI3; *: PbI$_2$; &: (FAPbI$_3$)$_{1-x}$(MAPbI$_3$)$_x$; #: ITO substrate).
Figure 3:
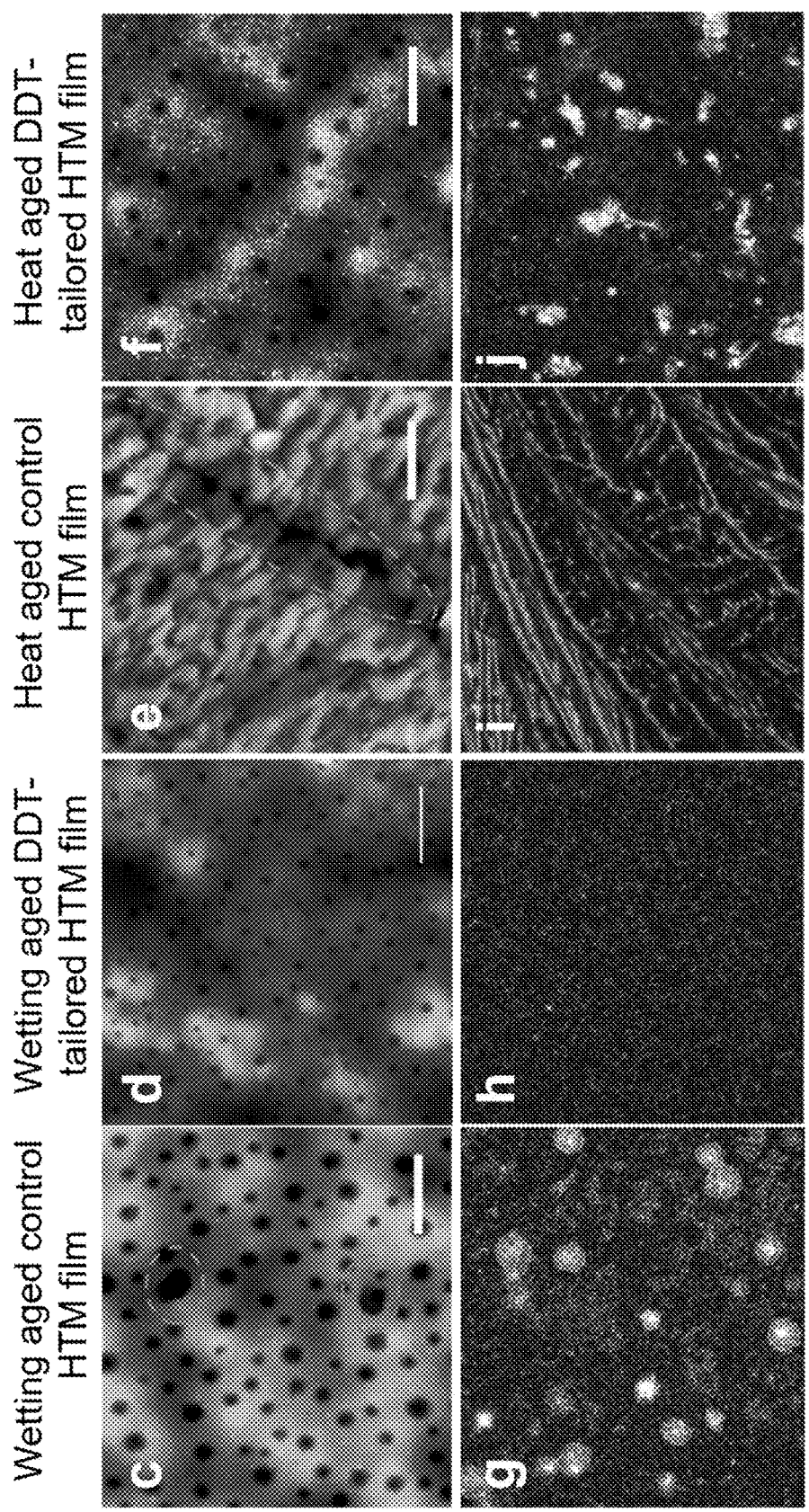
Figure 3:
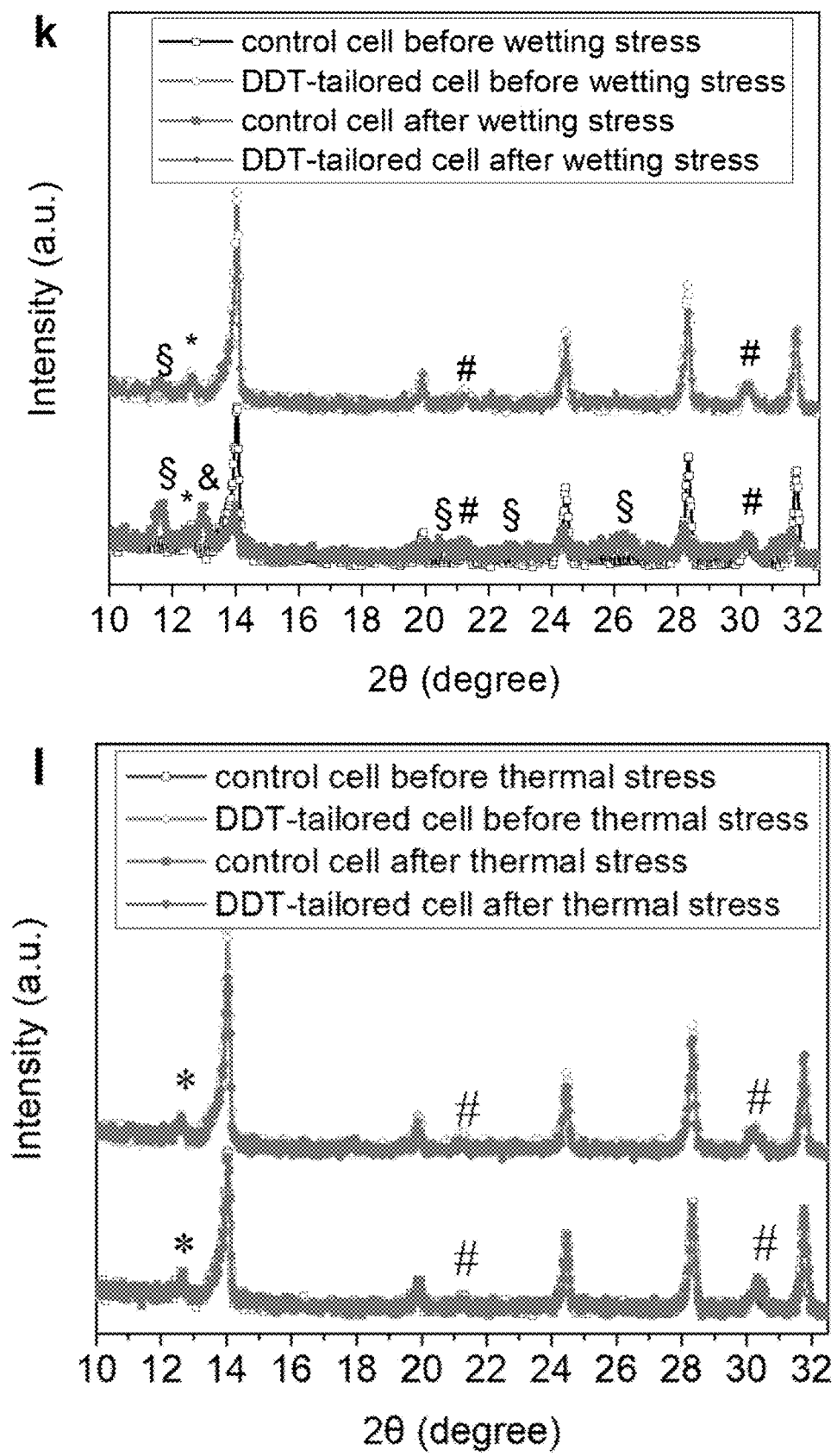

The stability of Spiro-OMeTAD under moisture and heat stressing was also measured. Tapping-mode atomic force microscopy (AFM) was used to determine whether there are any morphological changes upon the addition of 1-DDT in Spiro-OMeTAD. For the control (FIG. 3a), numerous pinholes were observed with sizes ranging from 200 nm to 400 nm. In contrast, pinhole size is greatly reduced to 40-100 nm after addition of 1-DDT (FIG. 3b). Pinholes are known to form channels across the Spiro-OMeTAD film, facilitating the inward and outward diffusion of gases and molecules. For example, pinholes facilitate ingress and diffusion of moisture from the ambient. On one hand, this helps to redistribute Li-TFSI dopant uniformly across the HTL leading to initial PCE enhancement but, on the other hand, causes moisture-induced degradation over time. Reducing pinhole size is expected to improve device moisture stability. Besides, the reduced pinhole size can explain the higher shunt resistance value for the 1-DDT containing PSCs (Table 1).

In order to elucidate the differences between adding 1-DDT versus the control, contact angles of a water droplet on each sample's surface was measured. The addition of 1-DDT increases the contact angle from 35° to 101° after addition of 1-DDT, indicating a reversed water wettability for Spiro-OMeTAD HTL owing to the extremely hydrophobic nature of 1-DDT material. Films in ambient air at a relative humidity of 50% were measured. For the control film, pinholes are observed (FIG. 3c) after 600 hours of moisture exposure and cracks even appear in some regions (as shown in the dashed circle in FIG. 3c). These enlarged pinholes and cracks may provide more pathways for ingress of moisture and oxygen from the ambient, leading to degradation of the underlying perovskite. By contrast, there is no morphological change in the moisture aged 1-DDT containing Spiro-OMeTAD films (FIG. 3d). Additionally, the formation of crystalline domains is observed on the surface of the control films after moisture stressing (FIG. 3g), whereas these are not found in the aged 1-DDT containing films (FIG. 3h).

The stability of perovskite/HTL films in ambient air at a relative humidity of 35-80% (typically, sunny days: 35-60%; rainy days: >60%) were investigated. For the control film, a complete bleaching in colour after 2880 hours was observed, which results from a fractional perovskite decomposition into $PbI_2$ and yellow-phase $FAPbI_3$ as inferred from XRD measurements (FIG. 3k). By contrast, no discolouration and no increased $PbI_2$ was seen in HTLs having 1-DDT containing samples, despite the presence of very weak yellow-phase $FAPbI_3$ (FIG. 3k).

Another critical issue for commercialization is the fragile thermal stability of Spiro-OMeTAD HTL owing to its deformation (crystallization) at elevated temperatures. Additives (including Li-TFSI and tBP) in the pristine Spiro-OMeTAD further drops its glass transition temperature (TG) from ~120° C. to ~50° C. Heating standalone Spiro-OMeTAD films at 50° C. in a $N_2$ atmosphere showed morphological differences between adding 1-DDT versus controls. For the control film, a crystalline fibril structure forms with obvious valleys and cracks after 120 hours (FIG. 3e). These crystal domains severely affect the interfacial and electrical properties of a HTL, leading to decreased adhesive and cohesive fracture resistance and formation of an additional undesired layer that causes an energy barrier for charge extraction. By contrast, the 1-DDT containing film retains its initial morphological features, though presenting some slightly enlarged pinholes (FIG. 3f). The formation of these enlarged pinholes can be ascribed to the evaporation of volatile tBP additive.

From the microscopy images, it was found that heat stressing leads to much larger crystalline domains than moisture stressing. For the control film, the whole region investigated crystalizes after thermal ageing (FIG. 3i). In contrast, the 1-DDT film exhibits much suppressed crystalline coverage with much smaller domain size under identical ageing conditions (FIG. 3j). The results indicate that the notorious crystallization in heated Spiro-OMeTAD films is greatly suppressed by introducing 1-DDT.

The stability of perovskite/HTL films heated at 50° C. in $N_2$ atmosphere was also measured. XRD shows no difference for both control and 1-DDT samples after 210 hours (FIG. 3l). This suggests no deterioration for perovskite films.

Having demonstrated the improved stability of 1-DDT containing Spiro-OMeTAD films and 1-DDT containing perovskite/Spiro-OMeTAD films, the stability of complete photovoltaic cells under moisture and heat stressing was examined. Note that the ageing test is carried out immediately after the control devices reach their peak PCEs after applying the additional oxidation process. The stability performance of non-encapsulated devices in ambient air at a relative humidity of 50% (FIG. 4a) was first tested. For the most stable oxidized control device, a slow degradation of PCEs during the first 100 hours is observed, followed by a quick degradation of PCE, decreasing to 68% of its peak performance after roughly another 430 hours. By contrast, the most stable 1-DDT containing device shows negligible PCE loss, retaining 97% of its peak performance after 530 hours of ageing in ambient air with a relative humidity of 50%. The control device discolours in the regions beyond the electrode-protected area, whereas the 1-DDT containing device presents no visible discolouration (FIG. 4a, insets), consistent with the idea that the enhanced device stability originates from the improved moisture resistance of the 1-DDT containing Spiro-OMeTAD HTL.

Figure 4:
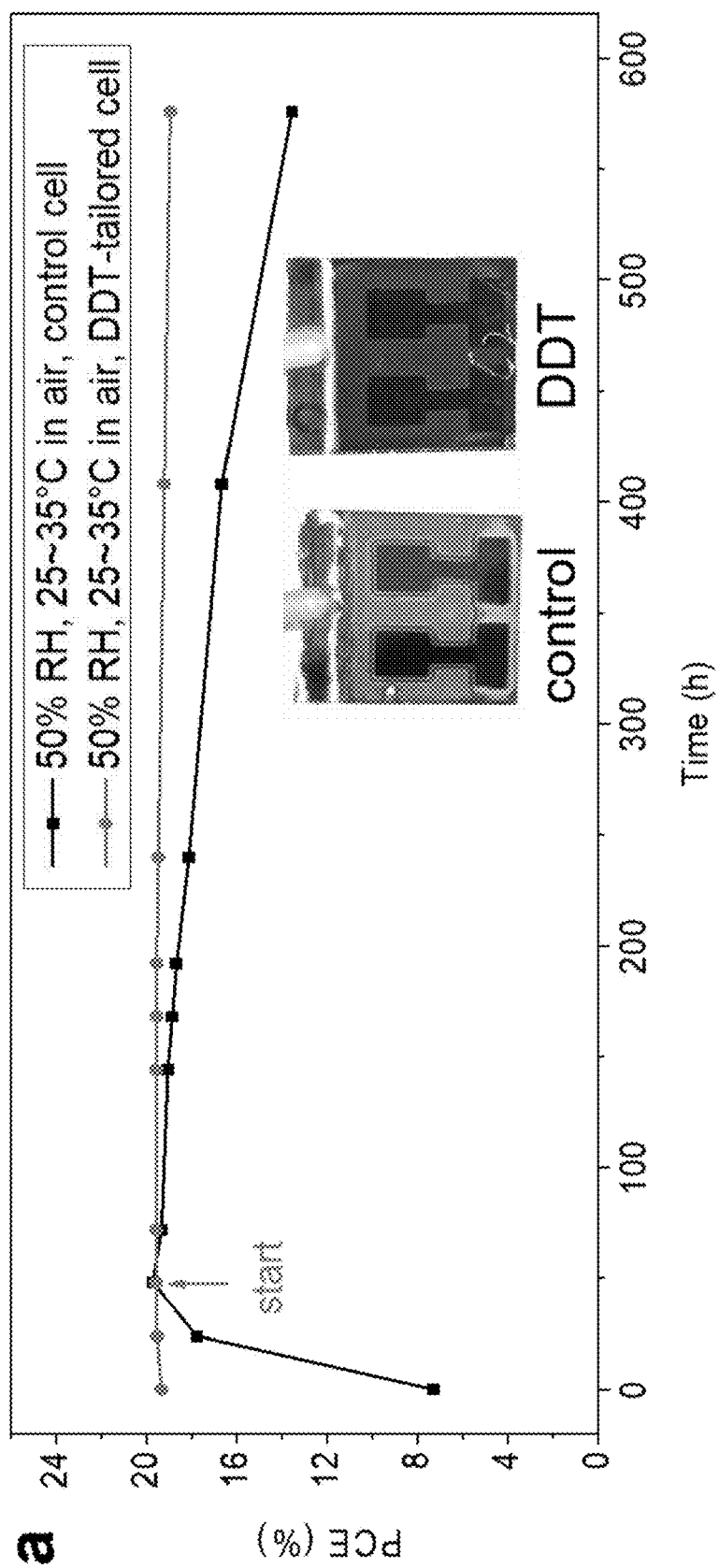
FIG. 4 shows results from photovoltaic device stability under moisture stressing and heat stressing: (a) evolution of PCEs of PSCs on moisture aging (relative humidity of 50% at room temperature) with inset photographs of the control (left) and 1-DDT (right) devices after 530 h, where for each type of device five devices were used for this stability test and all samples were fabricated in the same batch; (b) ToF-SIMS profiles of the moisture aged control photovoltaic cell; (c) ToF-SIMS profiles of the moisture aged 1-DDT photovoltaic cell; (d) evolution of PCEs of PSCs on thermal annealing of 50° C. followed by 85° C. in a N2 atmosphere with inset photographs of the final control (left) and 1-DDT (right) devices after thermal ageing, where for each type of device five devices were used for this stability test and all samples were fabricated in the same batch; (e) ToF-SIMS profiles of the heat stressed control photovoltaic cell; and (f) ToF-SIMS profiles of the heat stressed 1-DDT photovoltaic cell.
Figure 4:
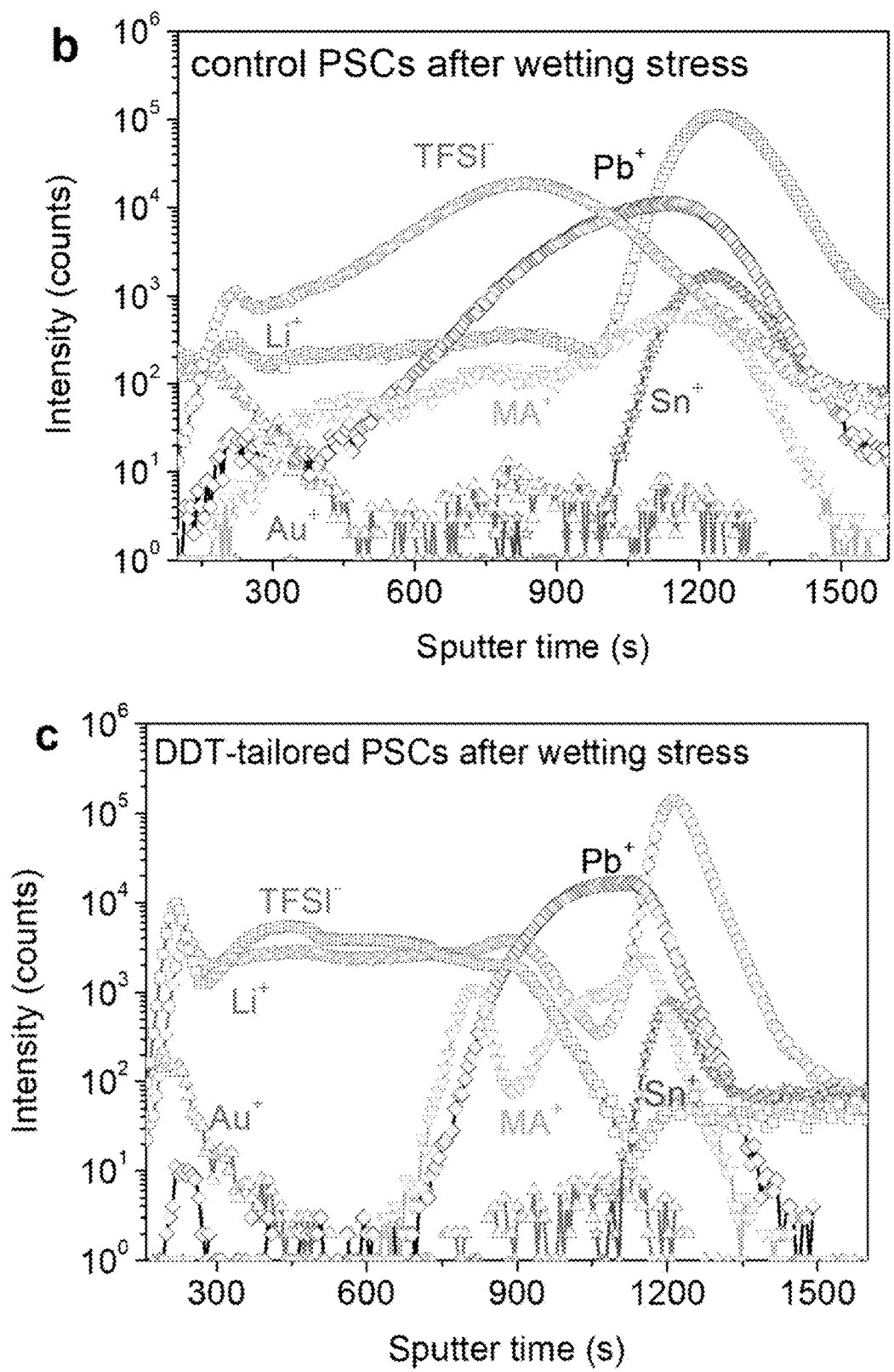
Figure 4:
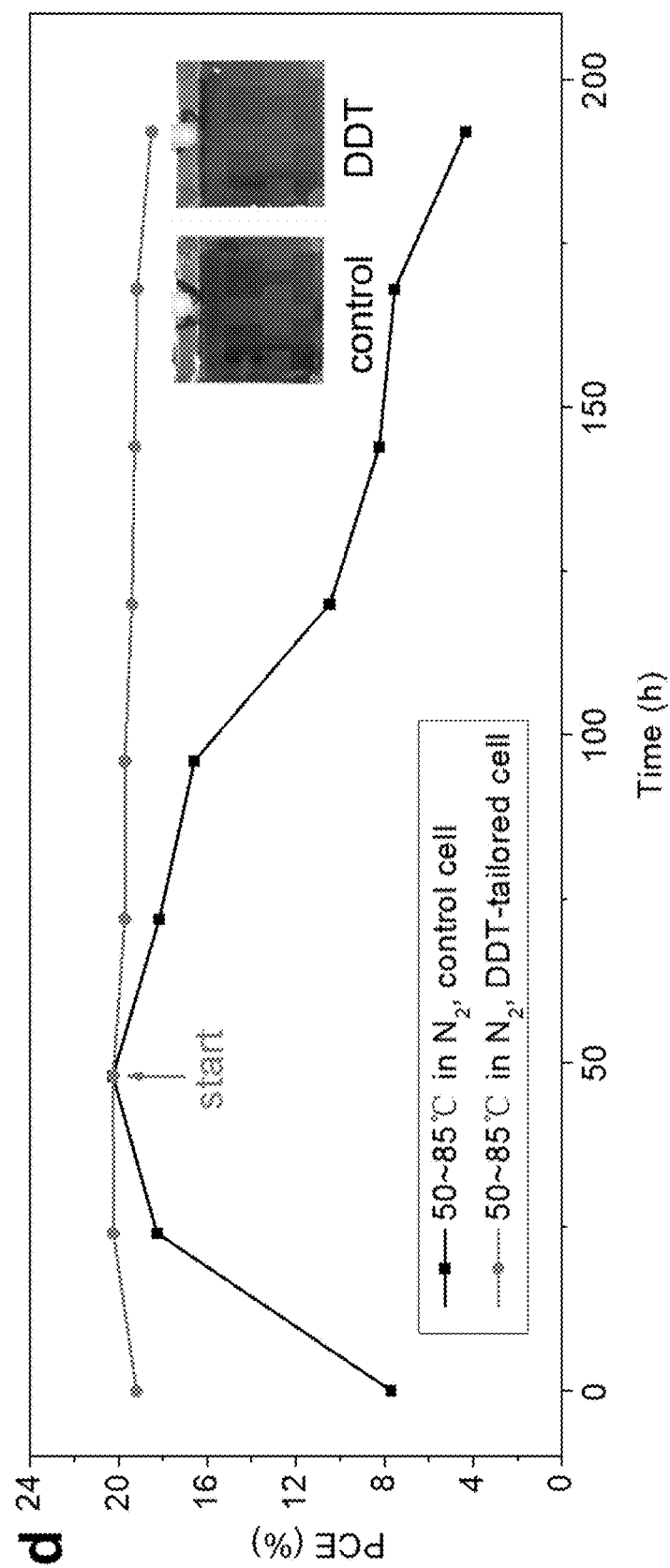
Figure 4:
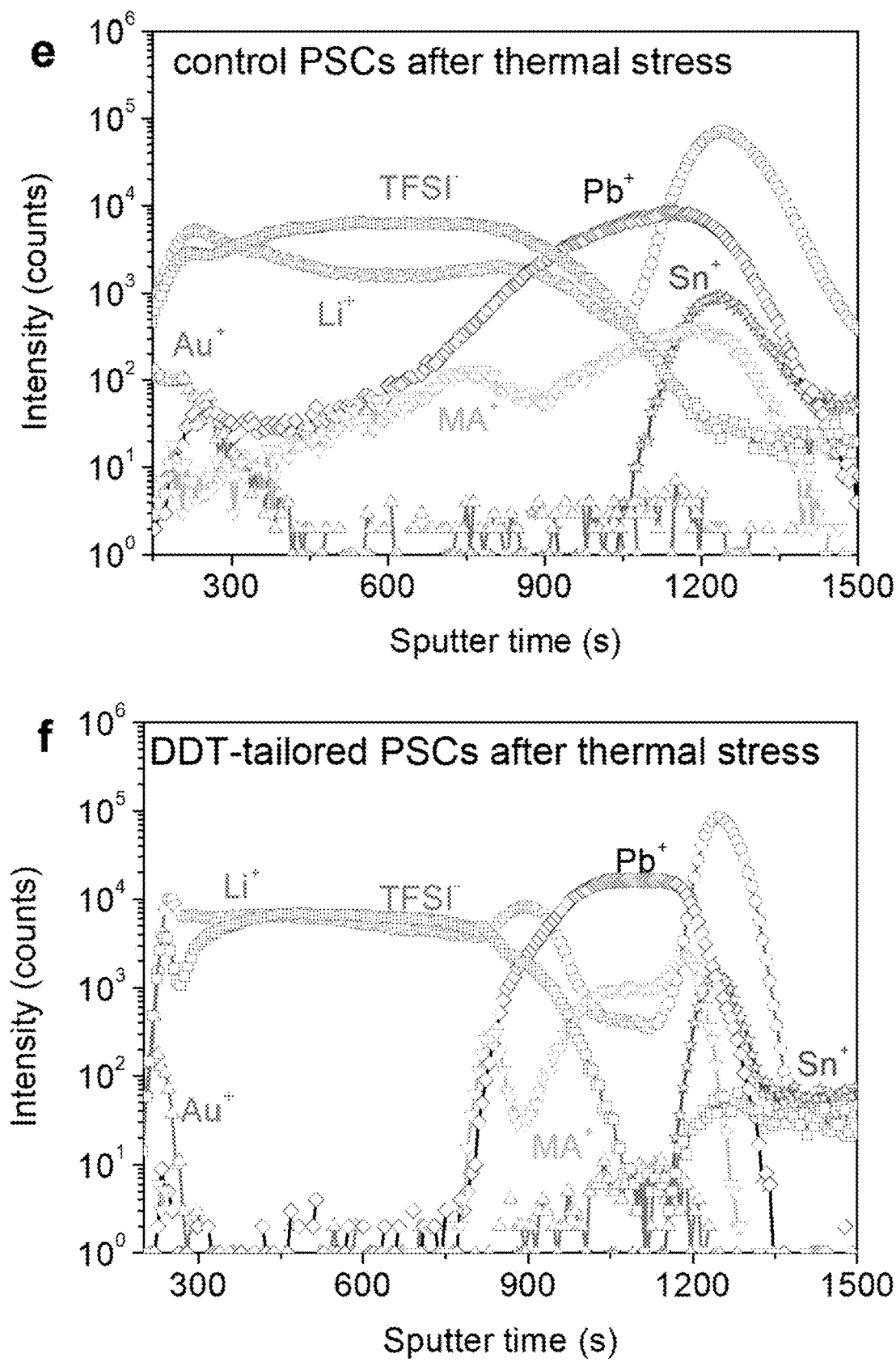

A compositional distribution profile was examined by probing the differences between the oxidized control and the 1-DDT containing devices after moisture stressing. The most stable control device reached peak PCE (19.7%) after the additional oxidation process, and the most stable 1-DDT device demonstrated initial PCE (19.3%) and peak PCE (19.6%). The ageing process started immediately after control cells reach their peak PCEs. For the aged control device, interdiffusion between Spiro-OMeTAD and perovskite was observed for the ions investigated (FIG. 4b). The decomposed perovskite stack well explains the large PCE loss for the control device after moisture stressing. In contrast, each stack in the humidity-aged 1-DDT containing device still maintains clear edges (FIG. 4c).

The stability of non-encapsulated devices with and without using 1-DDT HTLs was also observed at 50° C. in a $N_2$ atmosphere. A decreased as high as 63% with respect to the peak PCE after 120 hours was observed for this ageing stress for the most stable oxidized control device (FIG. 4d). By comparison, for the 1-DDT containing cells, only about a 5% drop over the same ageing period was observed. For each type of device, five devices were used for the stability test and all samples were fabricated in the same batch. The most stable control device reached peak PCE (20.3%) after the additional oxidation process, and the most stable 1-DDT device demonstrated initial PCE (20.2%) and peak PCE (20.3%). The ageing process started immediately after control cells reach their peak PCEs. A temperature of the device was raised to 85° C. and the device stability was evaluated (FIG. 4d). A slow degradation (another 5% drop) in efficiency for the most stable cell based on 1-DDT containing Spiro-OMeTAD was seen after 24 hours, and a faster degradation (another 16% drop) for the best oxidized control cell. This result agrees with the above stability results for Spiro-OMeTAD films and perovskite/Spiro-OMeTAD films.

Compositional distribution of these thermally aged devices was also investigated. Compared to the control device before ageing, heat stressing leads to more severe $Li^+$ ion accumulation at Au/HTL interface and more severe $Li^+$ ion migration into the perovskite stack (either via the bulk or via grain boundaries). This is regarded as a negative feature for PSC performance. The detection of perovskite ions at earlier SIMS time may be ascribed to the formation of enlarged voids, valleys, and cracks in HTL after crystallization, instead of the deterioration of perovskite. Contrastingly, the Spiro-OMeTAD layer in 1-DDT containing device maintains dopant homogeneity throughout the HTL and thereby reduces the risks of phase segregation. However, in some devices 1-DDT did not prevent the migration of very mobile $Li^+$ ions to the perovskite stack under the same ageing conditions. For longer-term stability results for the most stable non-encapsulated cells with 1-DDT in the Spiro-OMeTAD HTL, tested in ambient air (relative humidity of 40-70%, 25-40° C.) and stored in air desiccator (relative humidity of <10%, 25-30° C.), only about 7% degradation in the efficiency after 2200 hours is seen.

By adding 1-DDT, immediate doping for Spiro-OMeTAD, and freshly prepared planar PSCs reaching close to their peak PCEs (up to 21%) were seen straight after fabrication. Improvement was also obtained for devices using PTAA as HTLs. Besides, in addition to its effectiveness in realising immediate doping of Spiro-OMeTAD, this low-cost alkythiol material demonstrated multiple benefits in relation to long-term moisture and thermal stability through minimizing pinhole size, converting HTLs from hydroscopic to hydrophobic materials and suppressing the crystallization of Spiro-OMeTAD.

Figure 5:
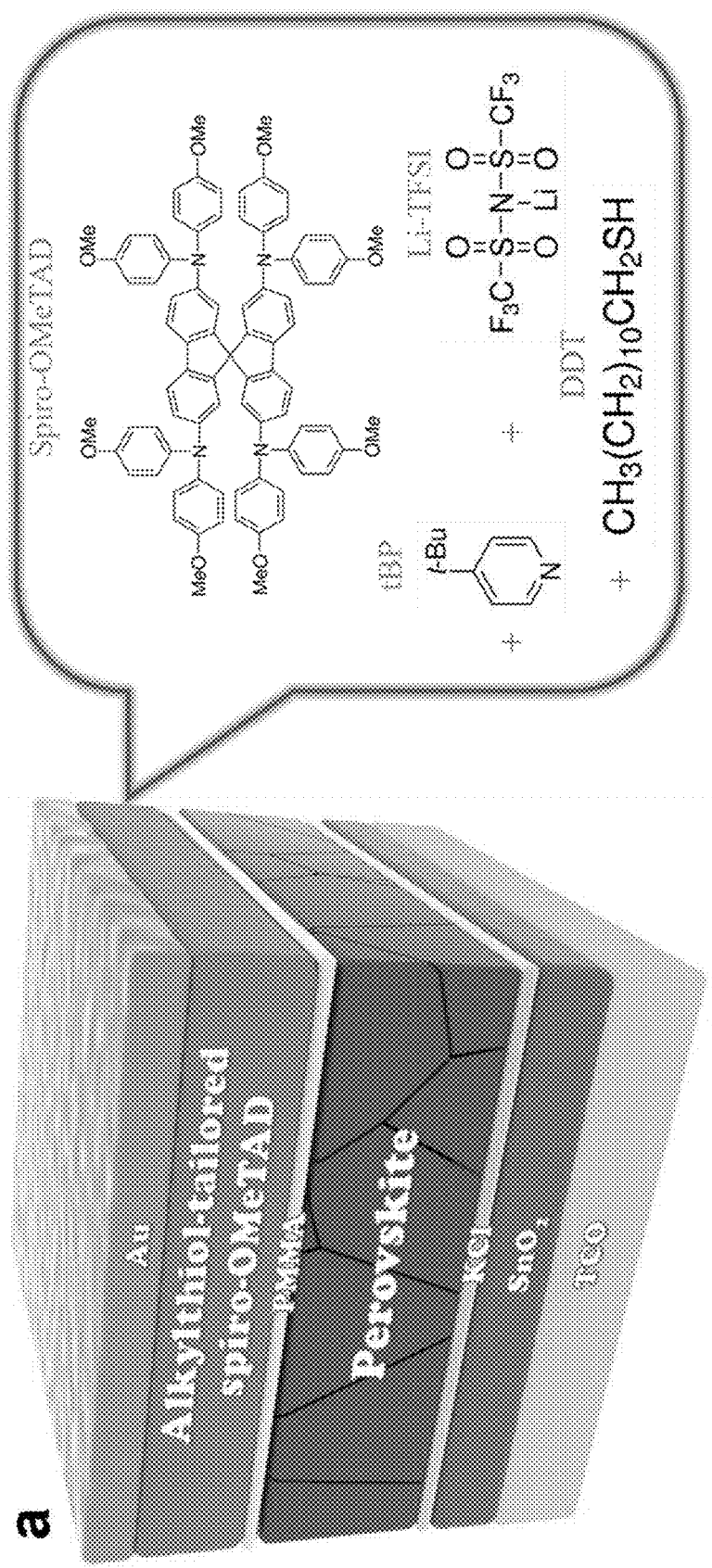
FIG. 5 shows (a) an embodiment of the disclosed photovoltaic device, and the molecule structures of Spiro-OMeTAD and alkylthiol (1-DDT); (b) J-V curves of a control cell and the DDT-tailored cell via a one-step method before and after humidity-controlled air treatment measured from reverse-bias scan direction under simulated AM 1.5 sunlight; (c) EQE spectra and photocurrent integrated over the AM 1.5 solar spectrum of DDT-tailored cells via the one-step method before and after humidity-controlled air treatment; (d) J-V curves of an air-treated DDT-tailored cell via the one-step method measured from the reverse- and forward-bias scan directions, respectively: (e) J-V curves of the air-treated control cell and the air-treated DDT-tailored cell via a two-step method measured from the reverse-bias scan direction.
Figure 5:
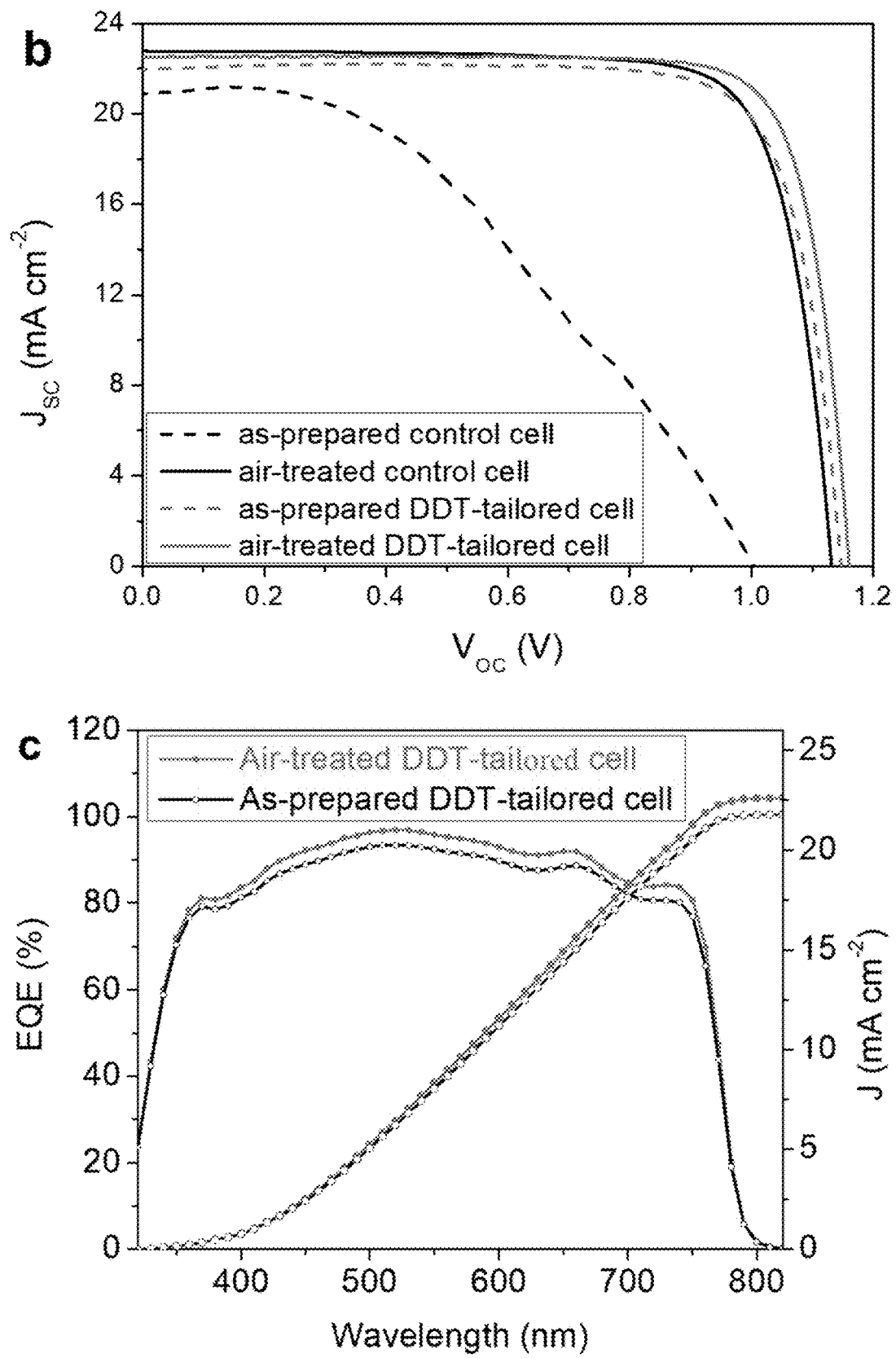
Figure 7:
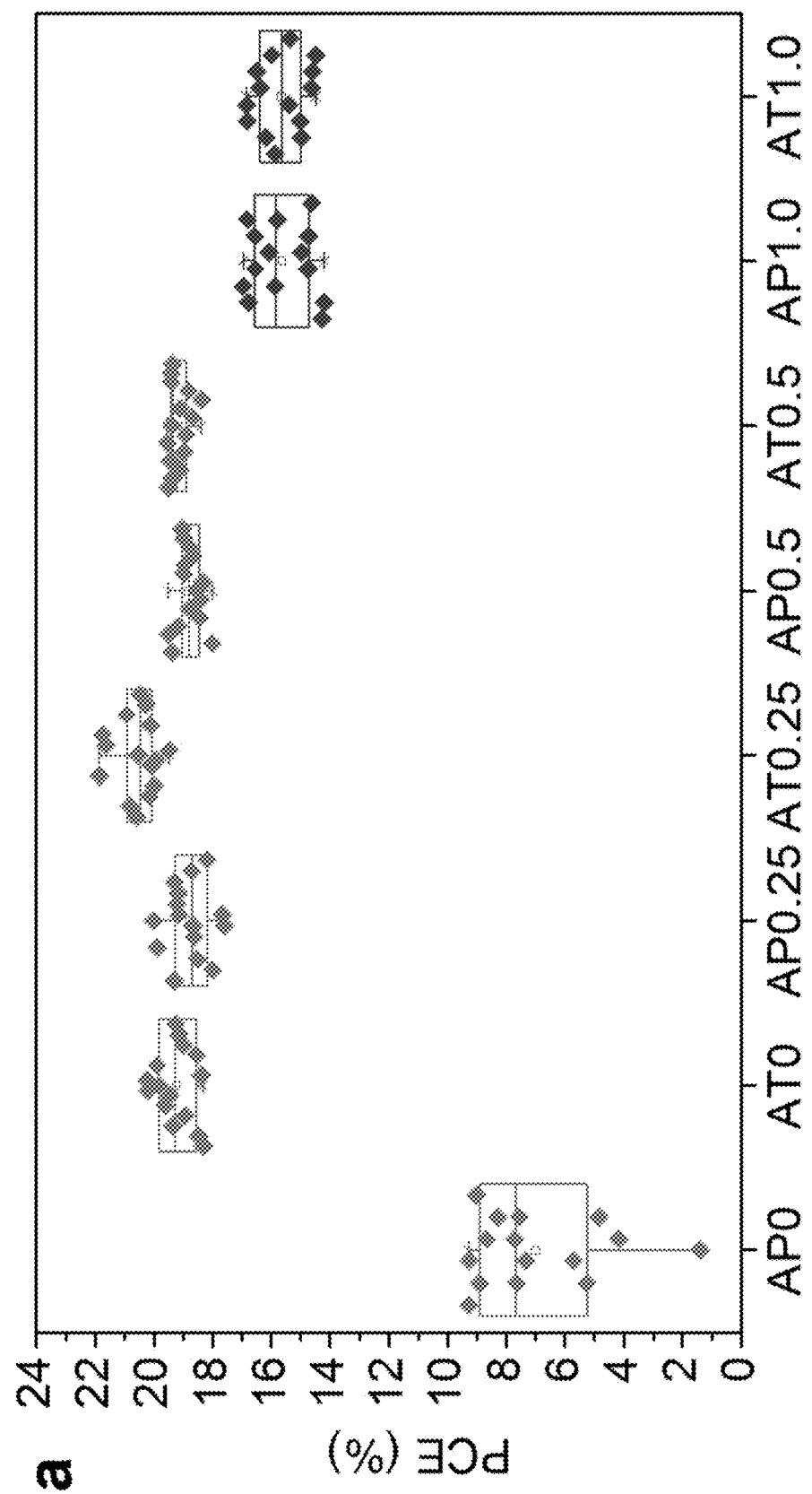
FIG. 7 shows the impacts of DDT concentration and humidity-controlled air-treatment on device performance: (a)-(d) statistics of device parameters for solar cells via the one-step method with DDT-tailored Spiro-OMeTAD HTM with a DDT volume ranging from 0 v % to 1.0 v % (with respect to chlorobenzene volume)—the PCE (a), $V_{OC}$ (b), $J_{SC}$ (c), and FF (d) were determined from the reverse J-V scan curves of 15 cells for each condition; AP represents the as-prepared sample, AT represents the air-treated sample: (e) SPO of a typical cell via one-step method measured for 550 s at a fixed voltage of 0.97V near the maximum power point (MPP) identified in the J-V curves: (f) SPO of the typical cell via two-step method measured for 550 s at a fixed voltage of 0.98V near the maximum power point (MPP) identified in the J-V curves; (g) J-V curves of air-treated DDT-tailored cell via two-step method measured from the reverse- and forward-bias scan directions, respectively; the completed device has obvious hysteresis; the J-V curve under reverse-bias scan direction shows a PCE of 23.0% with a $V_{OC}$ of 1.18 V, a $J_{SC}$ of 25.5 mA cm$^{-2}$, and a FF of 76.5%; the J-V curve under forward-bias scan direction shows an inferior PCE of 23.0% with a $V_{OC}$ of 1.16 V, a $J_{SC}$ of 25.5 mA cm$^{-2}$, and a FF of 56.3%; (h) current density vs the square of the applied bias for "hole only" diodes composed of FTO/spin-coated Spiro-OMeTAD with or without DDT (200 nm)/Au; (i) steady state PL spectra of perovskite film via one-step method (blue), perovskite film/as-prepared control Spiro-MeOTAD film (black), and perovskite film/as-prepared DDT-tailored Spiro-OMeTAD film (red) on a quartz substrate; excitation with 405 nm light was from the film side; (j) EIS of the as-prepared control cell, the air-treated control cell, and the as-prepared DDT-tailored cell; the Nyquist plots were obtained with an applied bias voltage of 0.95 V in the dark condition.
Figure 7:
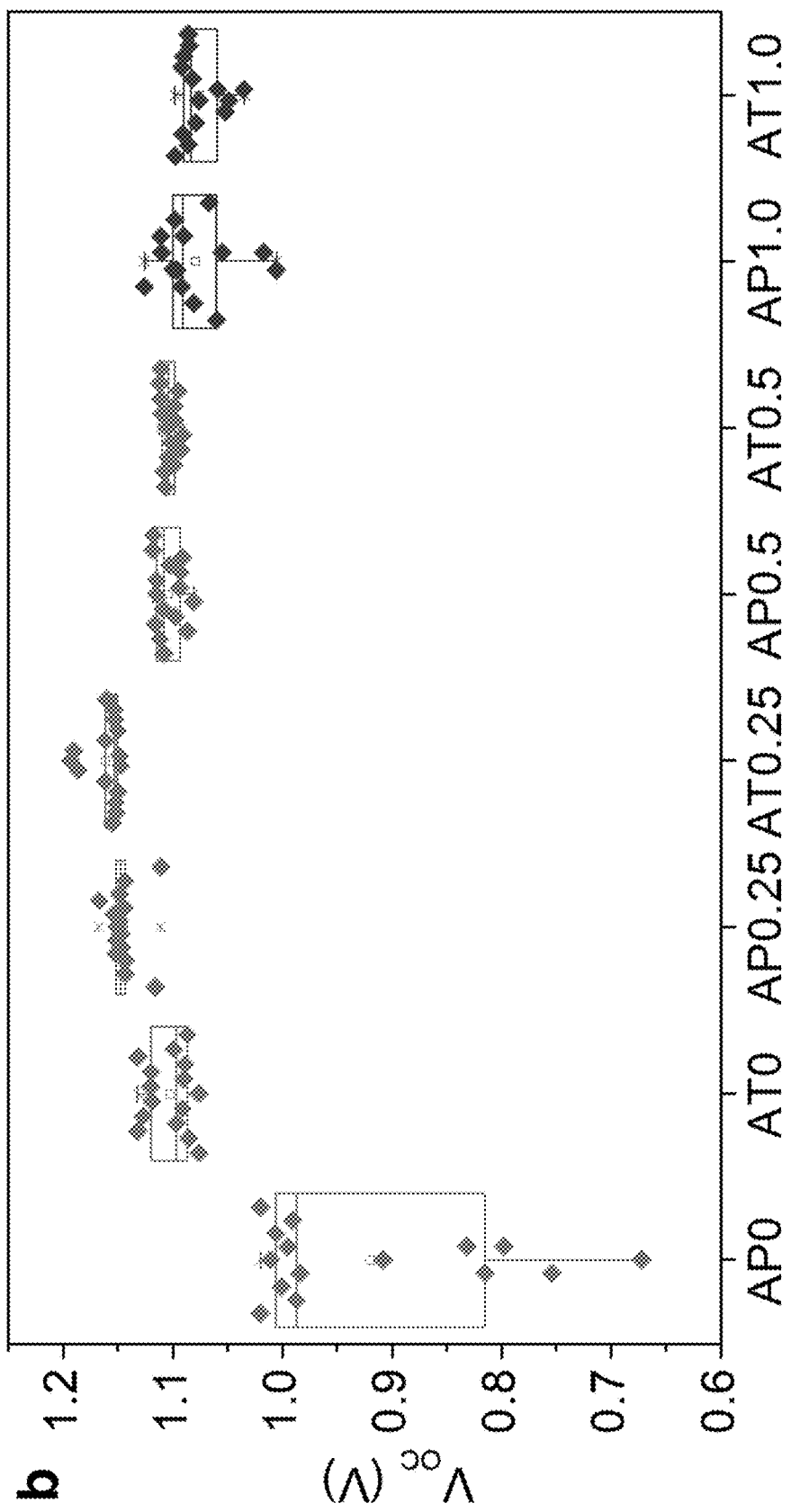
Figure 7:
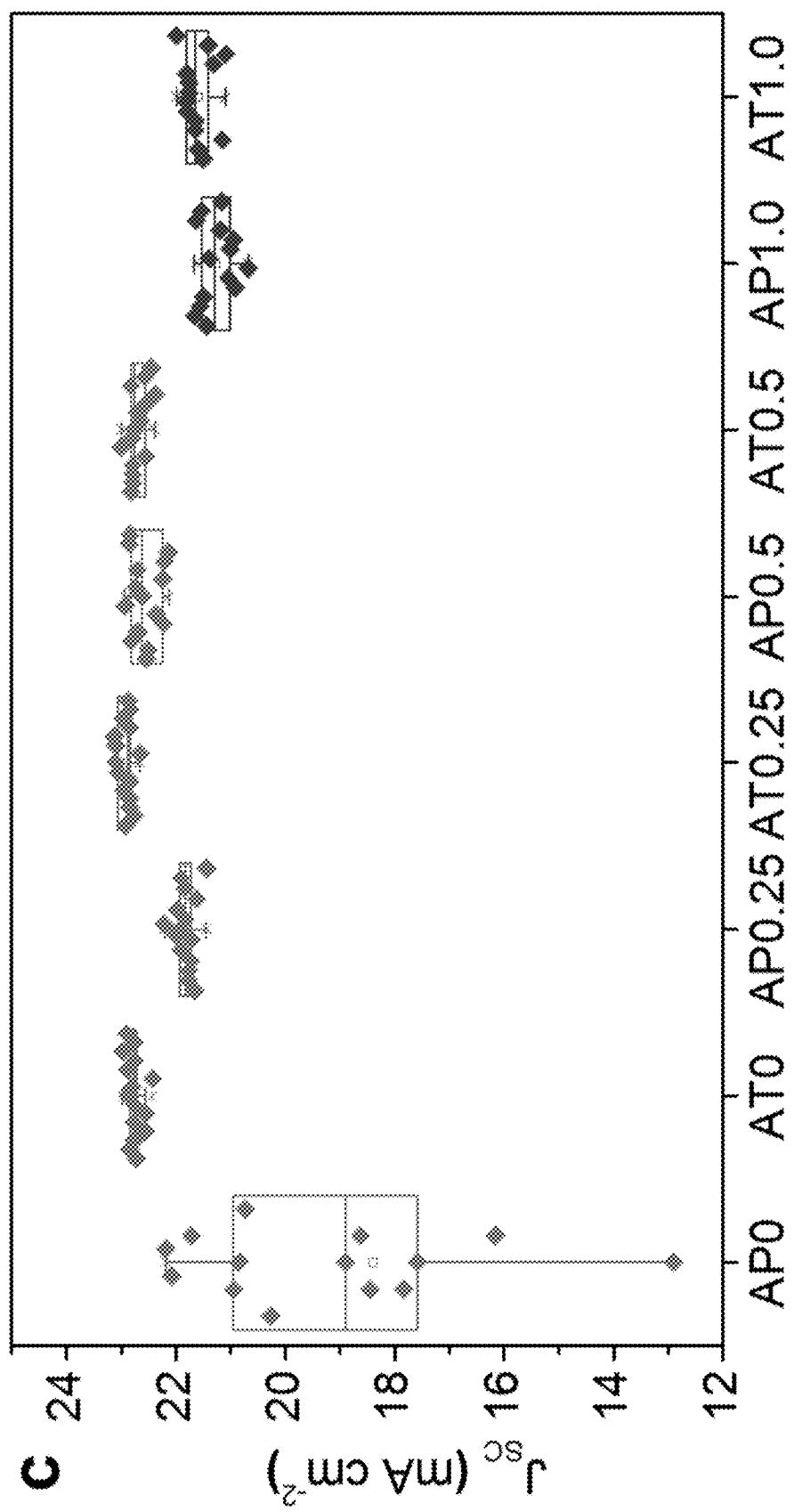
Figure 7:
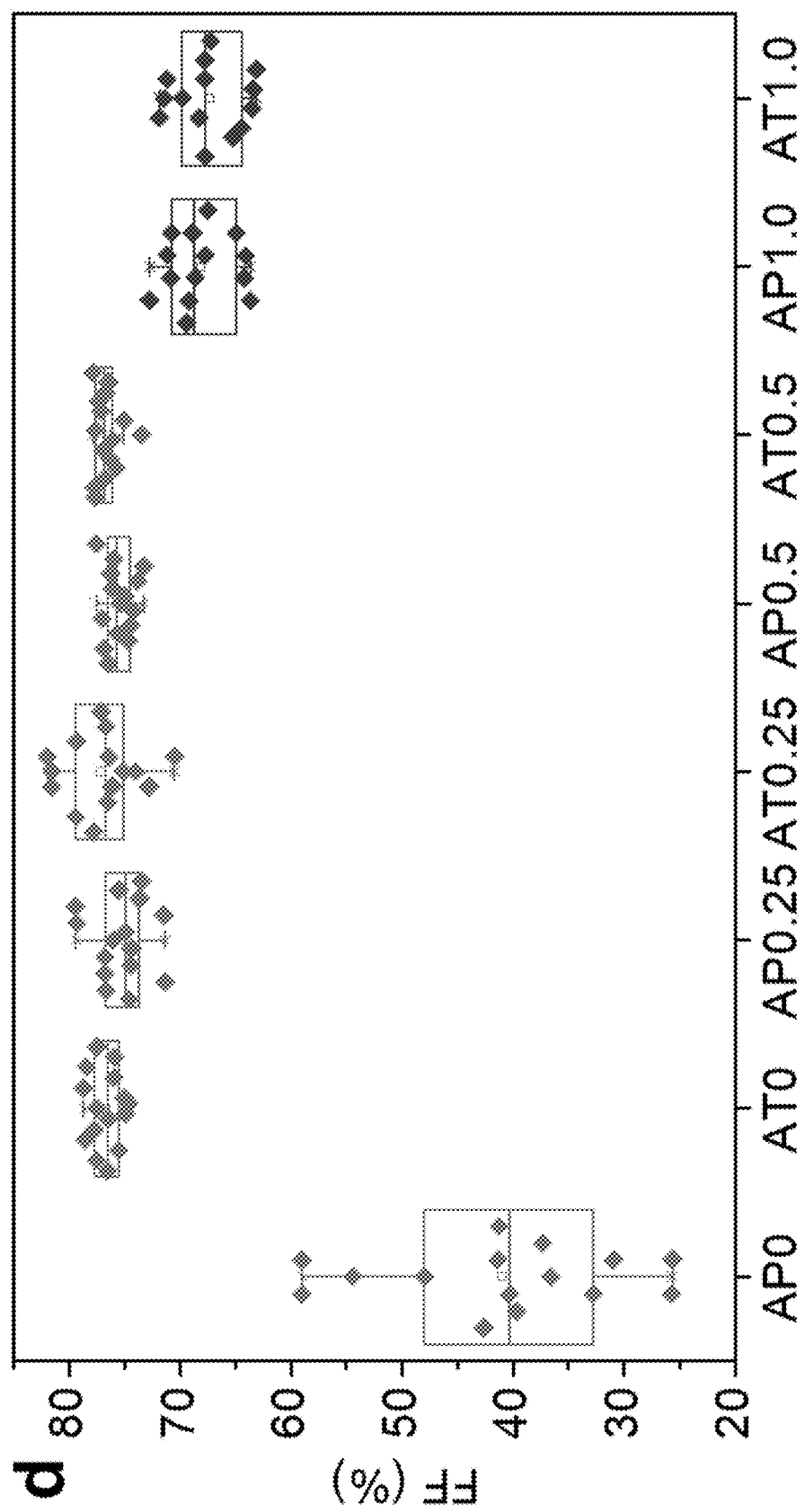
Figure 7:
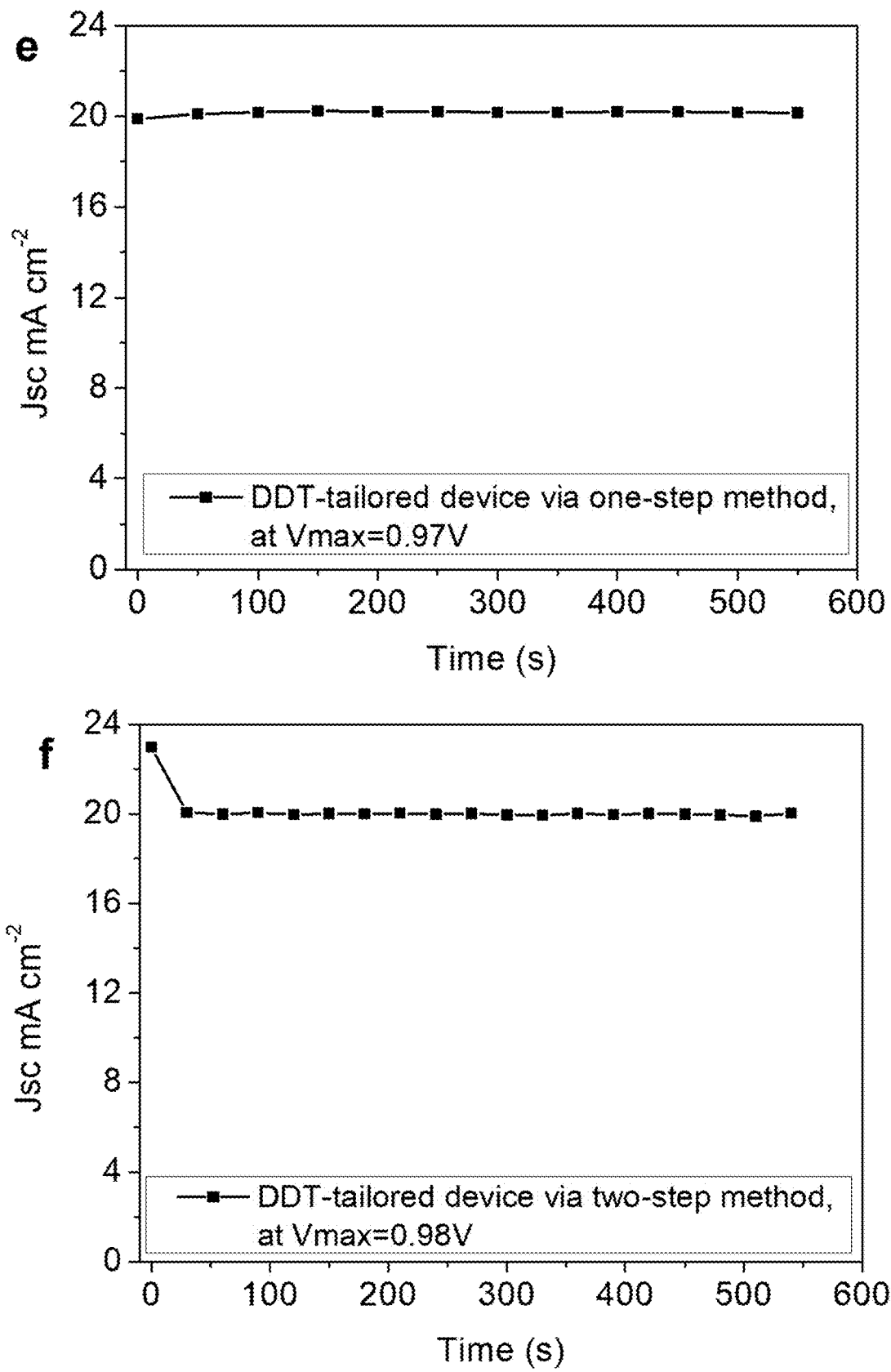
Figure 7:
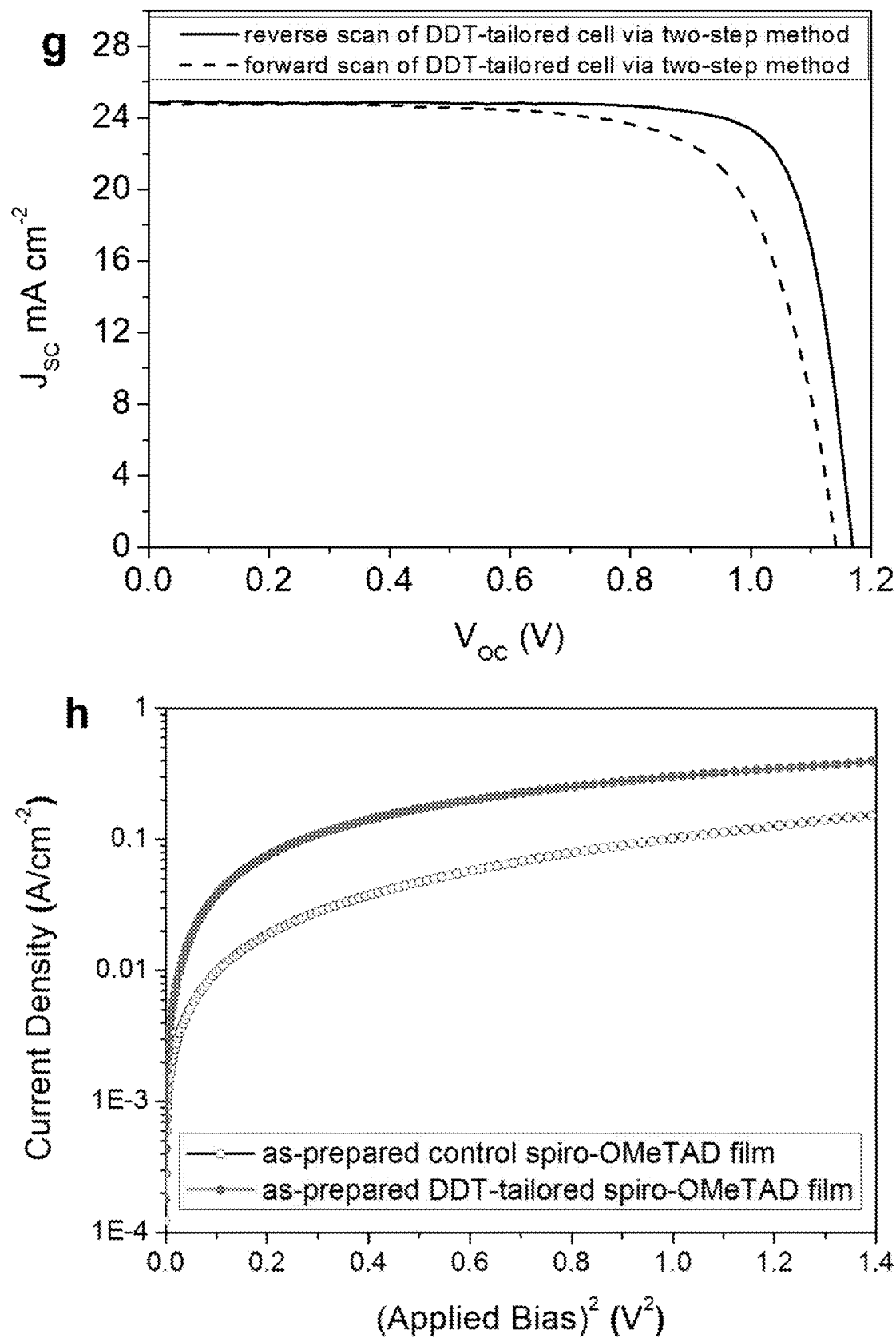

A further embodiment of an n-i-p PSC was prepared having the architecture shown in FIG. 5(a). An alkylthiol (1-DDT)-tailored HTM layer of Spiro-OMeTAD, tBP (4-tert-butylpyridine), LiTFSI (bis(trifluoromethane)sulfonimidelithium) was incorporated into the n-i-p planar perovskite solar cells, using tin oxide ($SnO_2$), perovskite via one-step and two-step methods, and potassium chloride (KCl) along with poly(methyl methacrylate) (PMMA) as, respectively, the n-type charge-extraction layers, the absorbers, and the interfacial passivation materials. FIG. 7 shows some of the observed enhanced efficiencies in the complete photovoltaic cells comprising 0.25-1.0 volume % (v %) of DDT with respect to 1 mL precursor volume. Notably, the improved performance for these devices is observed before traditional humidity-controlled air treatment; namely, storage in a humidity-controlled air box for several days (FIG. 5 and FIGS. 7-7a, 7b, 7c, 7d). In the discussion, samples before undergoing the air treatment are noted as the 'as-prepared' and the samples after the air treatment as the 'air-treated'.

To prepare a typical device via a one-step method, comprising 0.25 v % of DDT, an open-circuit voltage (VOC) of 1.15 V, a short-circuit photocurrent density (JSC) of 22.0 mA cm-2, and a fill factor (FF) of 79.4%, were measured yielding a PCE of 20.0%. Further humidity-controlled air treatment gives a slight increase in performance, exhibiting a PCE of 21.2% with a VOC of 1.16 V, a JSC of 22.5 mA cm-2, and a FF of 81.5%. It was verified that JSC values derived from the current density-voltage (J-V) curves agree well with that derived from the external quantum efficiency (EQE) results integrated over the solar spectrum (FIG. 5c). In contrast, the as-prepared control cell without DDT-tailored HTM exhibits a poor initial PCE of 8.7%, owing to a low VOC of 1.0 V, a JSC of 20.9 mA cm-2, and an inferior FF of 41.4%. PCE of the control cell jumps after humidity-controlled air treatment, as expected, reaching 20.2% with a VOC of 1.13 V, a JSC of 22.7 mA cm-2, and a FF of 78.5%. This improvement is ascribed to the optimized energy level alignment, minimized recombination, and maximized carrier extraction during the air-treatment period. To elucidate the change of PCE, a change index (C-index) is used and defined as C-index=(PCEair-treated−PCEas-prepared)/PCEair-treated. The C-index of controls is 56.9%, significantly higher than that of DDT-tailored counterparts 5.7%, suggesting the alkylthiol may enable instant p-type doping for Spiro-OMeTAD HTM.

The best-performing device of this architecture, of the present invention, shows a PCE of 21.8% with a VOC of 1.16 V, a JSC of 23.0 mA cm-2, and a FF of 81.6% after using anti-reflection layer with little hysteresis as shown in FIG. 5(d) (Certificated efficiency is 21.63%). In order to confirm the universality of the tailored Spiro-OMeTAD HTM technology, it was also applied in the PSCs with perovskite absorber fabricated using a two-step method. The best-performing air-treated DDT-tailored device shows a superior performance than that of the air-treated control device, yielding a PCE of 23.9% with a VOC of 1.18 V, a JSC of 24.7 mA cm-2, and a FF of 81.9% (see FIG. 5(e)). The current density and steady-state power output (SPO) of typical PSCs via one-step method and two-step method (shown in FIGS. 7(e) and (f), respectively) indicate that initial light soaking during the current-voltage measurements has negligible influence on the performance of PSCs via the one-step method, whilst it decreases the performance of PSCs prepared via the two-step method which could be related to the hysteresis shown in FIG. 7(g).

In light of the increased VOC and FF of the as-prepared DDT-tailored devices, the resulting energetic shift is most likely to lead to an improved energetic alignment, and thereby smaller voltage losses at the perovskite/Spiro-OMeTAD heterojunction and improved charge extraction. Space charge limited current (SCLC), photoluminescence (PL) spectroscopy, and electrical impedance spectroscopy (EIS) measurements were performed to investigate the charge transport and the recombination properties of the as-prepared Spiro-OMeTAD films. From the SCLC (FIG. 7(h)), it is observed that the hole mobility was enhanced by one order of magnitude upon adding DDT, from $2.7 \times 10^{-3}$ cm2 V-1 S-1 to $1.1 \times 10^{-2}$ cm2 V-1 S-1. From the PL (FIG. 7(i)), the intensity of perovskite peak for DDT sample quenches more than that of the control, indicating more efficient hole injection from perovskite to HTM. From the EIS (FIG. 7(j)), it was found that the fitted series resistance (Rs) value (1.2Ω) for as-prepared DDT sample is lower than that (3.9Ω) of the control, whilst the fitted recombination resistance (RREC) value (1927Ω) is higher than that (589Ω) of the control. The much lower Rs and higher RREC suggest the faster charge transport and the reduced recombination for DDT-tailored cells.

Figure 6:
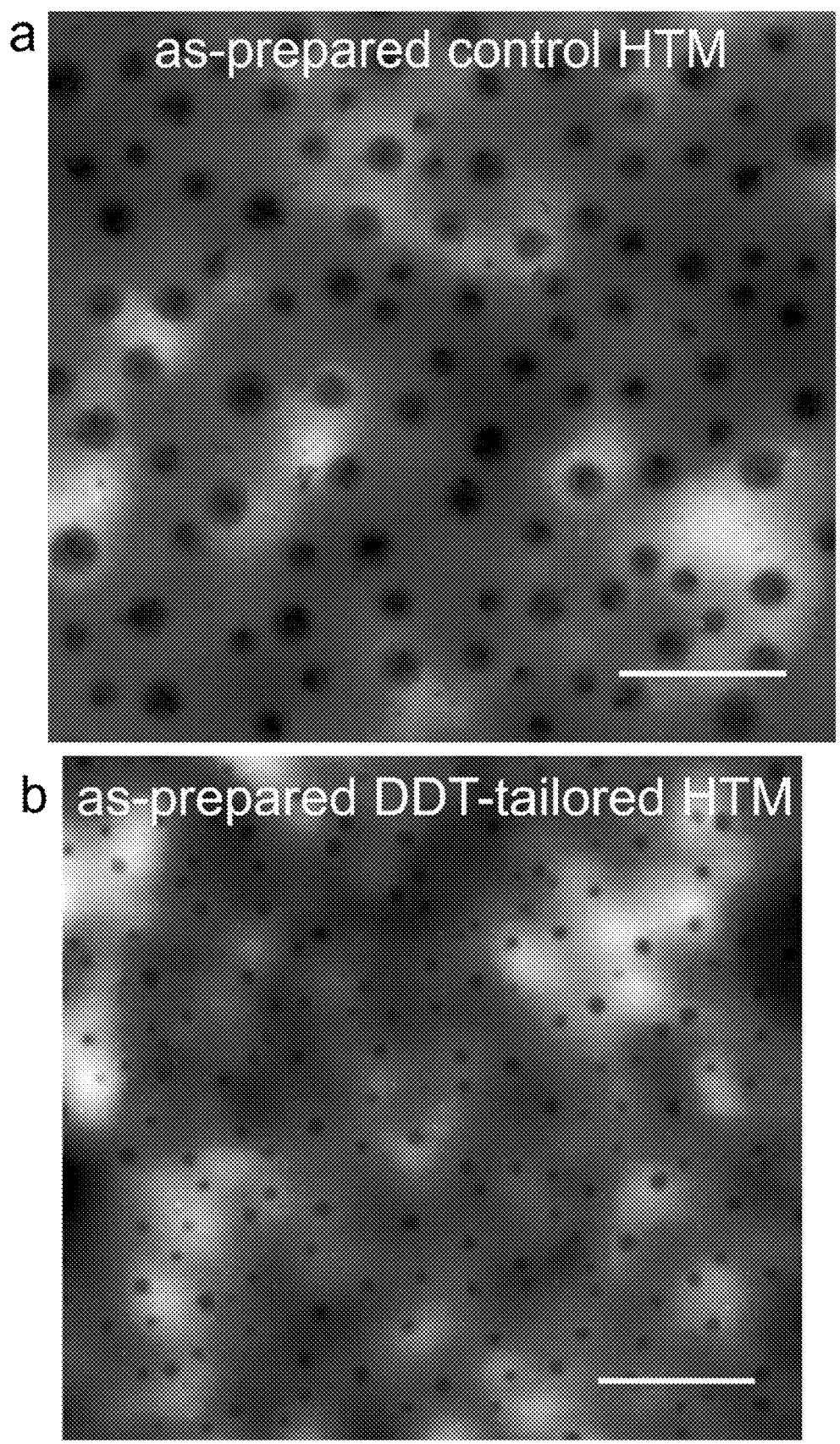
FIG. 6 shows a series of characterisation data of samples formed with and without the presence of DDT: (a) and (b) Tapping-mode AFM images of the as-prepared control Spiro-OMeTAD HTM film (a) and the as-prepared DDT-tailored Spiro-OMeTAD HTM film (b)—Scale bar is 1 um: (c) UV-vis absorption spectra of the as-prepared control and the as-prepared DDT-tailored Spiro-OMeTAD films on quartz substrates; (d) CPD at each pixel distribution of the as-prepared control and the as-prepared DDT-tailored Spiro-OMeTAD films coated on a glass substrate—an Au-coated tip which has work function of −5.1 eV was employed, a scan over a 25 μm$^2$ area is taken for each sample, the average isolated CPDs of DDT-tailored Spiro-OMeTAD film and control Spiro-OMeTAD film came to −20 mV and −160 mV respectively, corresponding to Fermi levels of −5.08 eV and −4.94 eV: (e) full and expanded FT-IR spectra of the mixture of DDT and Li-TFSI (red), Li-TFSI (blue), and DDT (black); (f) and (g) ToF-SIMS depth profiles of the as-prepared control (f) and the as-prepared DDT-tailored (g) PSCs.
Figure 6:
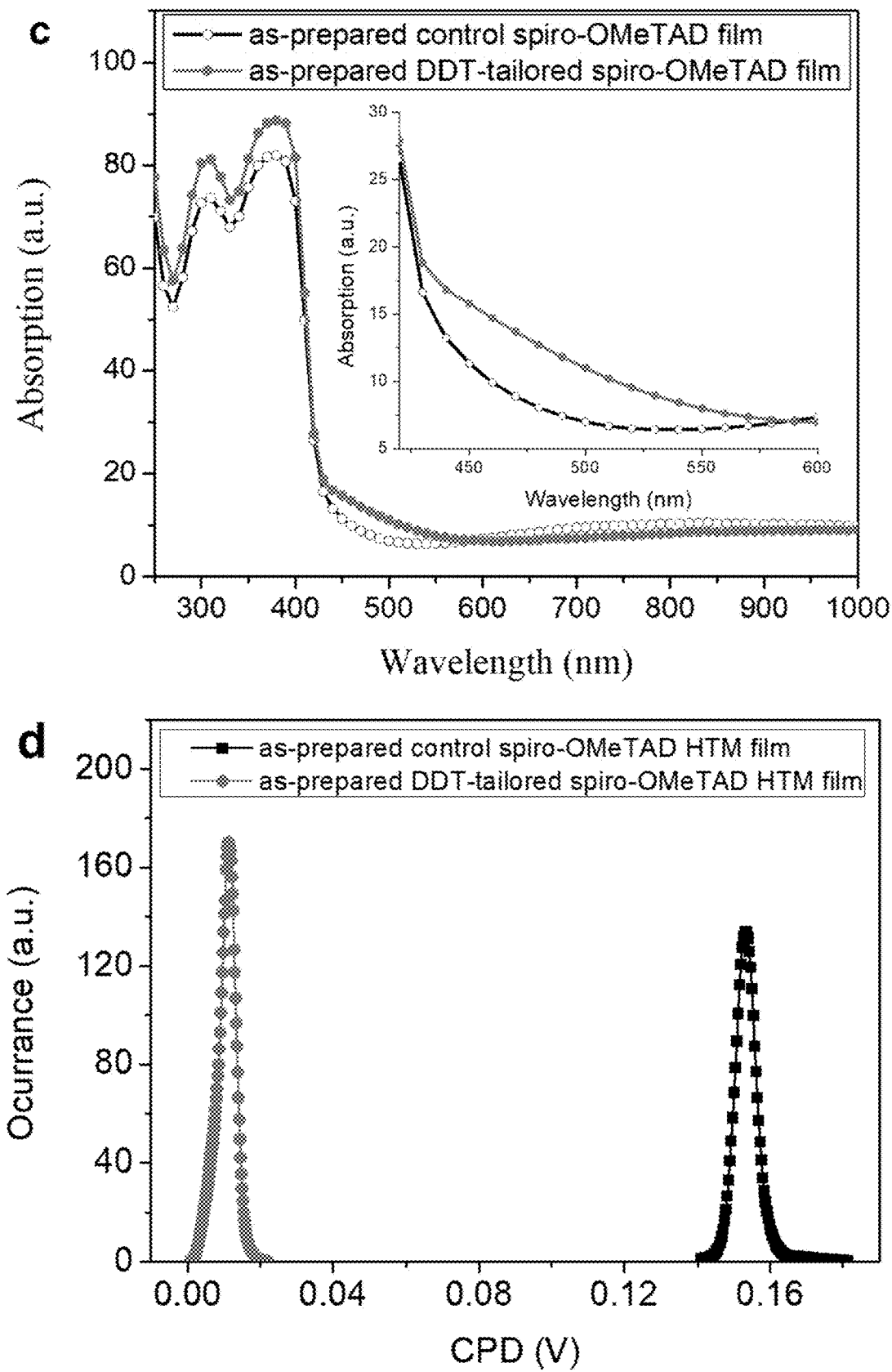
Figure 6:
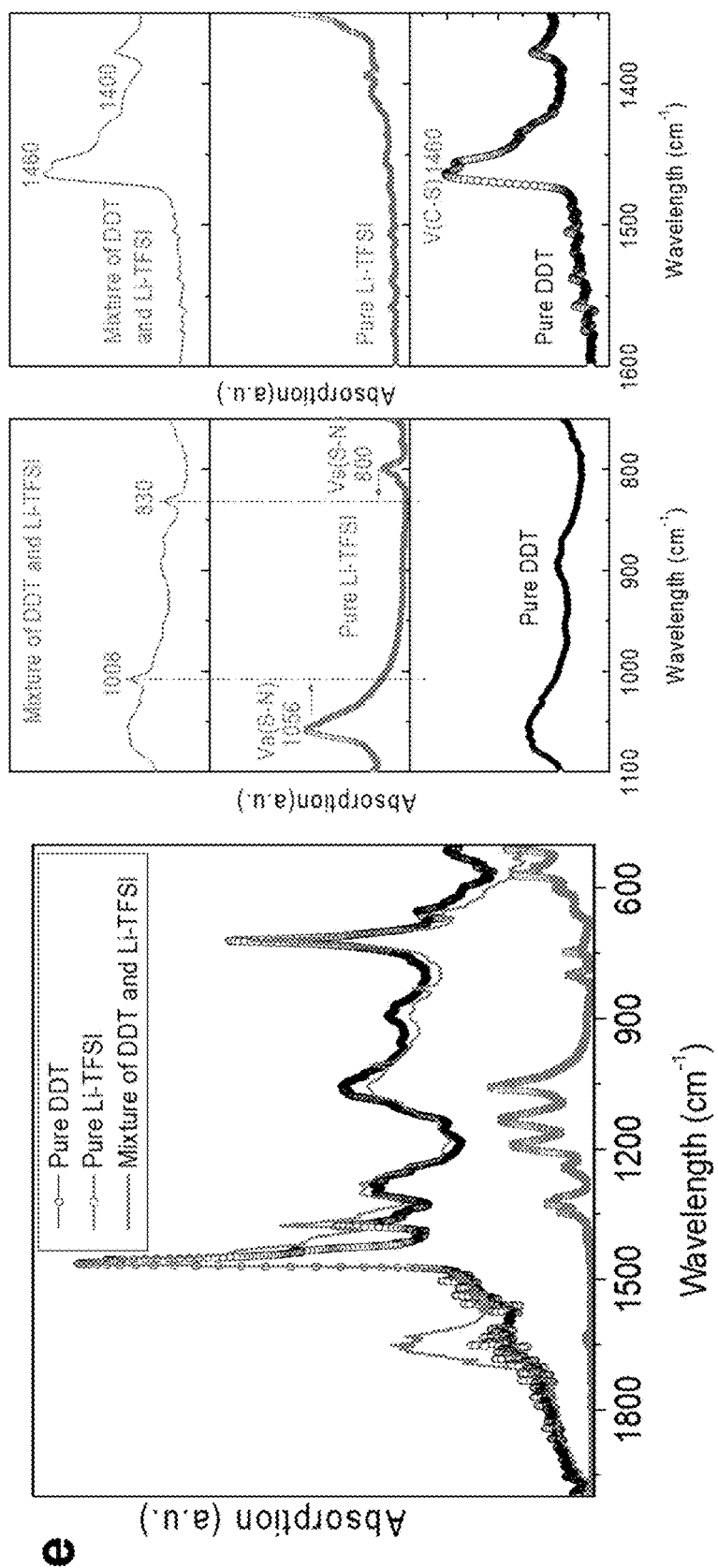
Figure 6:
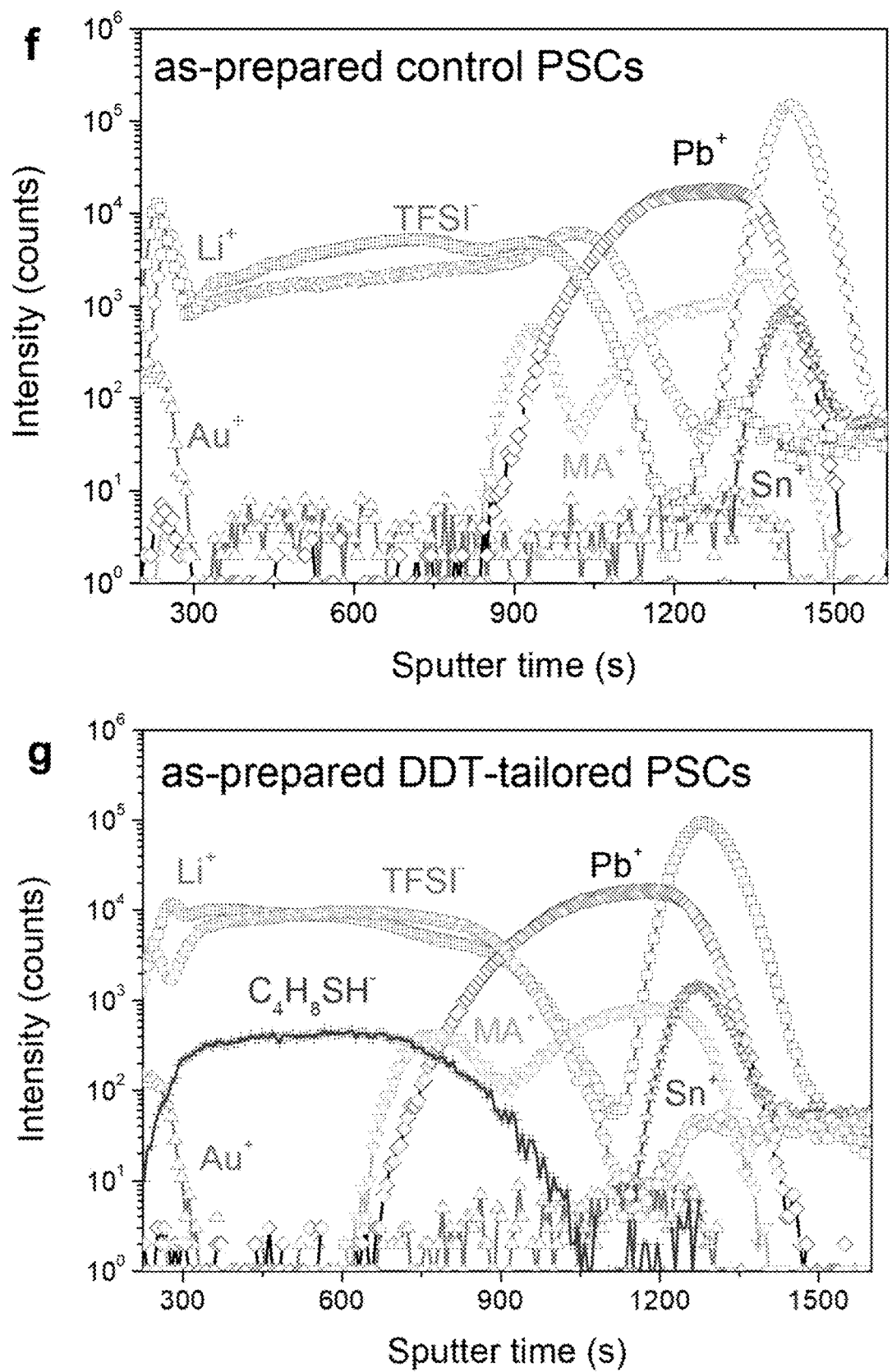
Figure 8:
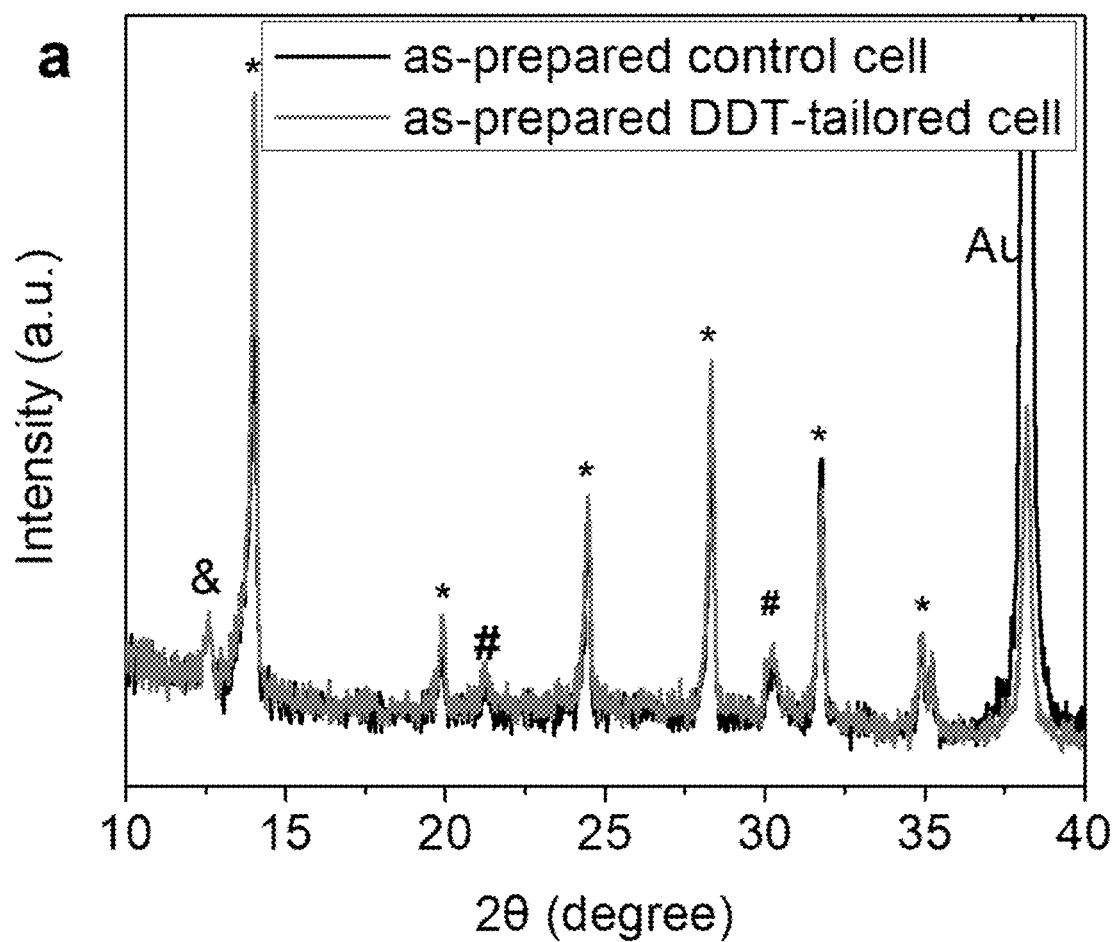
FIG. 8 shows a series of characterisation data of samples formed with and without the presence of DDT: (a) XRD patterns of as-prepared PSCs with or without DDT-tailored HTM layers (&: PbI$_2$; *: perovskite; #: ITO substrate); (b) SEM images of the perovskite after removing the overlying control (left) or DDT-tailored (right) HTM by using chlorobenzene wash; (c) Cross-sectional SEM images of devices employing the control Spiro-OMeTAD HTM (left) and the DDT-tailored Spiro-OMeTAD HTM (right); (d) NMR spectra of the Spiro-OMeTAD precursor solution comprising deuterated chlorobenzene-d5, tBP, LiTFSI dissolved in acetonitrile with or without DDT; the solution was heated at 80° C. for 30 min in order to simulate thermal radiation for the cells when processing the thermal evaporation of Au contact; (e) the reverse J-V scan curve of typical device via one-step method by using didodecyl disulfide-tailored Spiro-OMeTAD HTM layer; this device shows a PCE of 18.3% with a $V_{OC}$ of 1.14 V, a $J_{SC}$ of 22.2 mA cm$^{-2}$, and a FF of 72%; (f) ToF-SIMS depth profiles of as-prepared DDT-tailored Spiro-OMeTAD film, where the film is LiTFSI-free and tBP-free; (g) ToF-SIMS depth profile of air-treated control PSCs.
Figure 8:
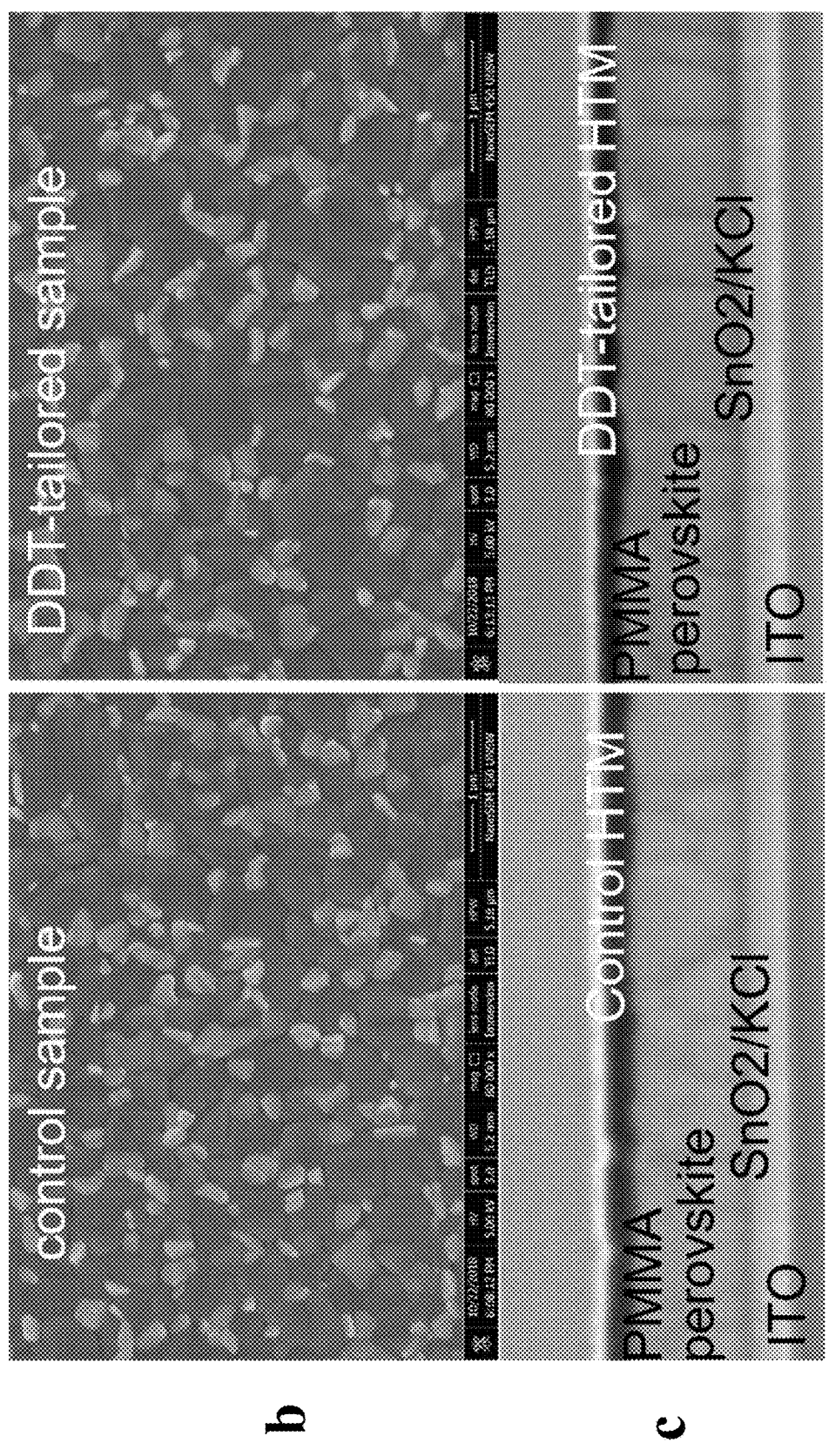
Figure 8:
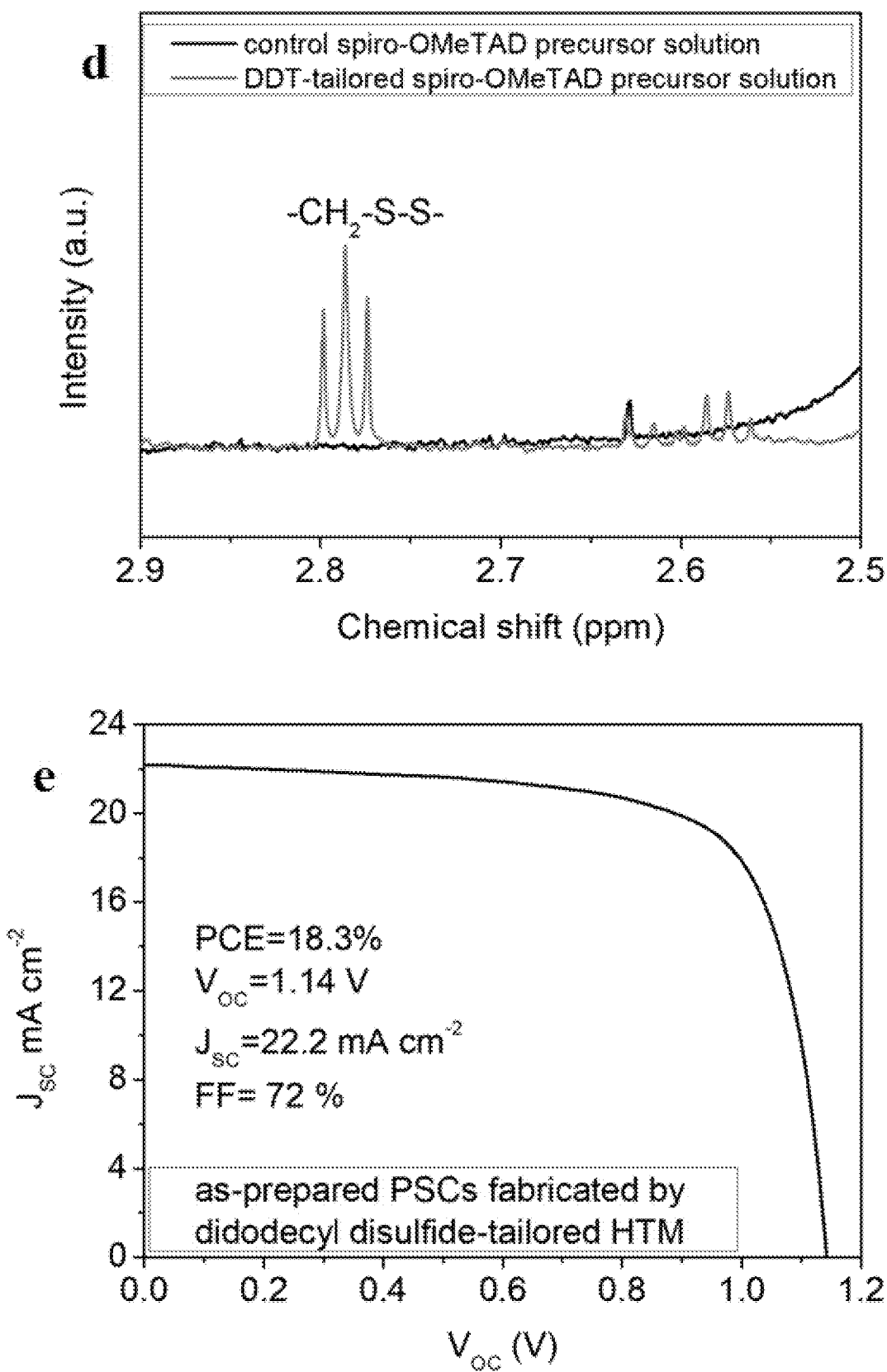

In order to understand why the use of DDT improves the device performance, a range of characterizations on the films was carried out. With the addition of DDT, the X-ray diffraction (XRD) peak positions remain unaltered, consistent with no DDT incorporating into and perturbing the perovskite crystal lattice (FIG. 8(a)). Perovskite grains seen in scanning electron microscopy (SEM) images (FIG. 8(b)) also remain unchanged. A negligible change in Spiro-OMeTAD film thickness (FIG. 8(c)) was presented, but a stark reduced pinhole size for the DDT-tailored HTM film in atomic force microscopy (AFM) images (FIGS. 6(a) and (b)).

UV-vis absorption spectroscopy and kelvin probe force microscopy (KPFM) was carried out to investigate the impact of DDT on the electronic properties of as-prepared Spiro-OMeTAD films. An increased intensity was observed in the DDT-tailored film absorption with the maximum peak at around 480 nm (FIG. 6(c)), suggesting the formation of oxidized Spiro-OMeTAD.+TFSI- 19,22-24. From the KPFM (FIG. 6(d)), a pronounced contact potential difference (CPD) could be seen, where DDT changes the fermi energy level of the as-prepared Spiro-OMeTAD film from 4.94 eV to 5.09 eV with respect to vacuum. This indicates the DDT-tailored film has a lower HOMO energy level by 0.15 eV than that of the as-prepared control counterpart, in light of the fermi level for doped Spiro-OMeTAD lying very close to the edge of the HOMO level. The work function of the control well aligns with reported values of Li-TFSI doped Spiro-OMeTAD. In the case of the control, the reaction between Spiro-OMeTAD and Li+-TFSI- during the air treatment period involves an uncontrollable oxidation of Spiro-OMeTAD [Eq. (1) and (2)].

Spiro-OMeTAD+O2⇌ Spiro-OMeTAD.+O2.-  (1)

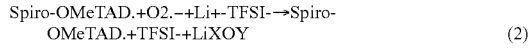
Spiro-OMeTAD.+O2.-+Li+-TFSI-→Spiro-OMeTAD.+TFSI-+LiXOY  (2)

In stark contrast to the as-prepared control PSC requiring air-treatment, the as-prepared cells with DDT-tailored HTMs can reach a comparable 20% efficiency without the air-treatment step. Considering that DDT usually acts as electron donor rather than an electron acceptor, and without wishing to be bound by theory, it was postulated that the observed instant p-doping effect might be due to the coupling species of DDT i.e. formation of didodecyl disulfide, playing a similar role as $O_2$. Solid-state nuclear magnetic resonance (NMR) spectroscopy measurements were carried out to confirm this postulation. From the NMR (FIG. 8(d)), we observe a new chemical species appearing at 2.77 ppm, 2.79 ppm, and 2.80 ppm, agreeing with the typical values of R-SS-R (R: alkyl). For completeness, instead of DDT, didodecyl disulfide was added directly to the control Spiro-OMeTAD precursor and good efficiencies were then observed in complete photovoltaic cells, especially the VOC values (FIG. 8(e)).

Lithium salts may form coordination bond with thiol compounds. The possible formation of coordination interactions between DDT and Li-TFSI were therefore studied using Fourier-transform infrared spectroscopy (FTIR). The sample is prepared by stirring Li-TFSI in the presence of excess DDT. From the FTIR (FIG. 6(e)), the S—N in pure Li-TFSI shows a typical symmetric stretching vibration mode at 800 cm-1 and a typical asymmetric stretching vibration mode at 1056 cm-1, which shift to 832 cm-1 and 1008 cm-1, respectively, when mixed with DDT. The downward shift of the S—N asymmetric stretching vibration frequency by of 48 cm-1 may result from the electron delocalization when a Lewis base-acid adduct is formed, demonstrating a strong interaction between thiol compound and lithium salt. A shoulder was observed around 1400 cm-1 near the typical stretching vibration mode at 1460 cm-1 of C—S in pure DDT. It is postulated that such interaction between DDT and Li-TFSI is likely to influence the chemical composition across the Spiro-OMeTAD film. This is confirmed by the time-of-flight secondary-ion mass spectrometry (ToF-SIMS) that allows the study of depth profiles for both positive and negative secondary ions. It can be seen in ToF-SIMS that DDT has a homogeneous distribution throughout the Spiro-OMeTAD film (FIG. 8(f)), accompanied by the desired significantly improved distribution of Li+-TFSI- (FIG. 6(g)). On one hand, Li+-TFSI- shows an enhanced intensity throughout DDT-tailored Spiro-OMeTAD film, one order of magnitude higher than that in the as-prepared control, along with the diminished dopant accumulation at the HTM's interfaces (FIGS. 6(f) and (g)). On the other hand, DDT also enables significantly improved homogeneity of the dopant in the whole Spiro-OMeTAD bulk. Such greatly improved Li+-TFSI- distribution is believed to be beneficial for improved PSC performance. Both the dopant accumulation at interfaces and the dopant gradient in the bulk can result in poor electrical properties of the HTM layer and result in poor device efficiency. Therefore traditional humidity-controlled air-treatment has been widely adopted since it has positive influences on the dopant distribution for the control, which is elaborated upon in FIG. 8(g). It was also observed that Li+ ions diffuse across the perovskite and accumulate at the perovskite/SnO2 interface for all samples.

Figure 9:
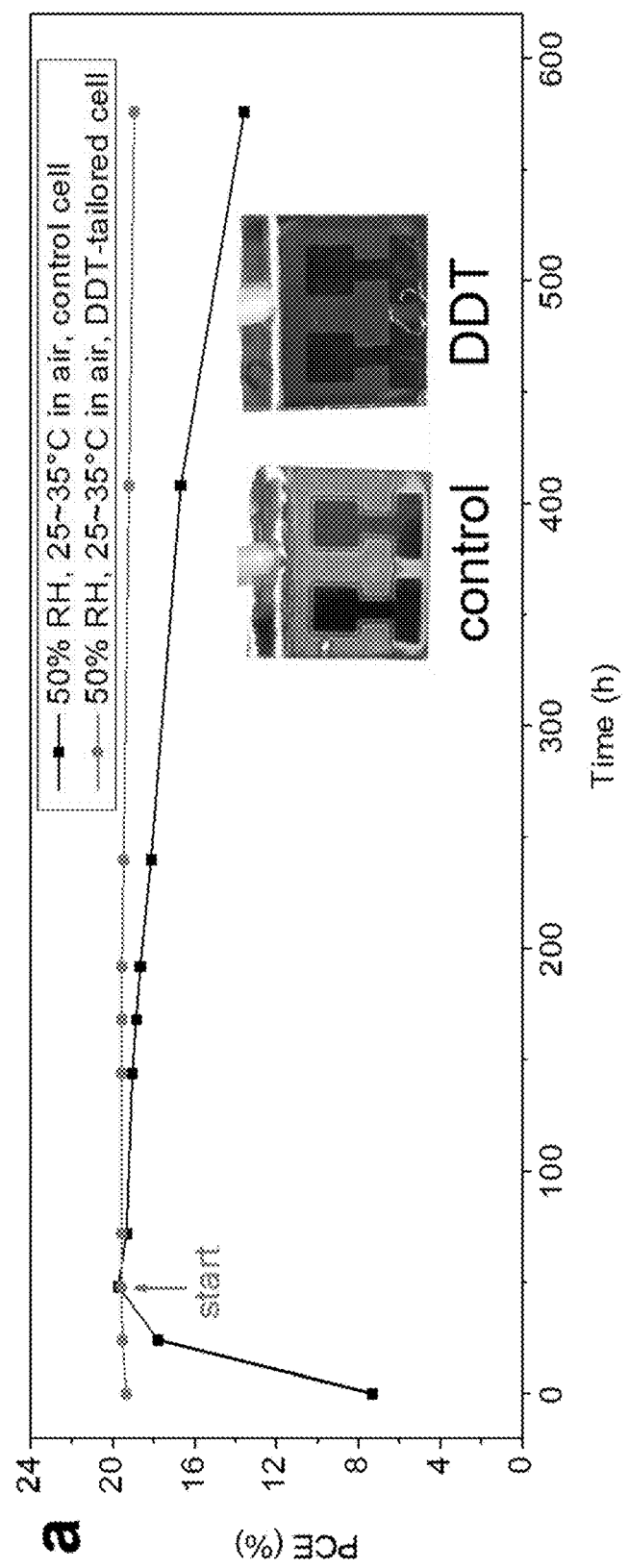
FIG. 9 shows data indicating the device stability under wetting stress: (a) evolution of PCEs of PSCs on moisture stress (50% RH at 25~35° C.); inset, photographs of the control (left) and 1-DDT (right) devices after 530 h; after humidity-controlled air treatment for 48 hours, PCEs of the most stable control device and the most stable DDT-tailored device reached 19.7% and 19.6%, respectively; ageing process then started immediately; (b) corresponding XRD patterns of the control and the corresponding DDT-tailored PSCs before and after wetting stress. "!", "*", and "^" represent yellow-phase FAPbI$_3$, PbI$_2$, and degraded (FAPbI$_3$)$_{1-x}$(MAPbI$_3$)$_x$ respectively; (c) and (d) corresponding tapping-mode AFM images of the control HTM layer (c) and the DDT-tailored HTM layer (d) after wetting stress; scale bar is 1 um; (e) and (f) corresponding microscope photographs (50× magnitude) of the control HTM layer (c) and the DDT-tailored HTM layer (d) after wetting stress; (g) and (h) corresponding ToF-SIMS depth profiles of the control device (g) and the DDT-tailored device (h) after wetting stress.
Figure 9:
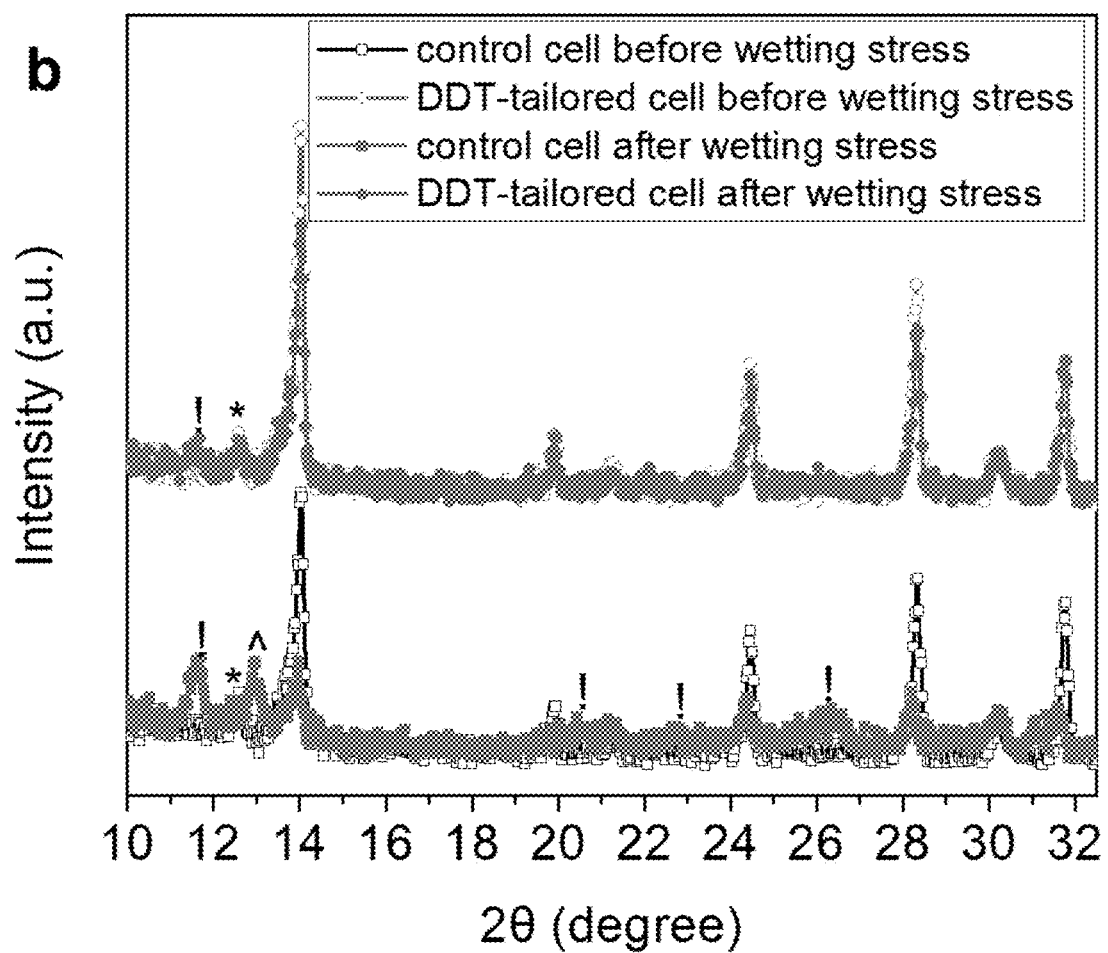
Figure 9:
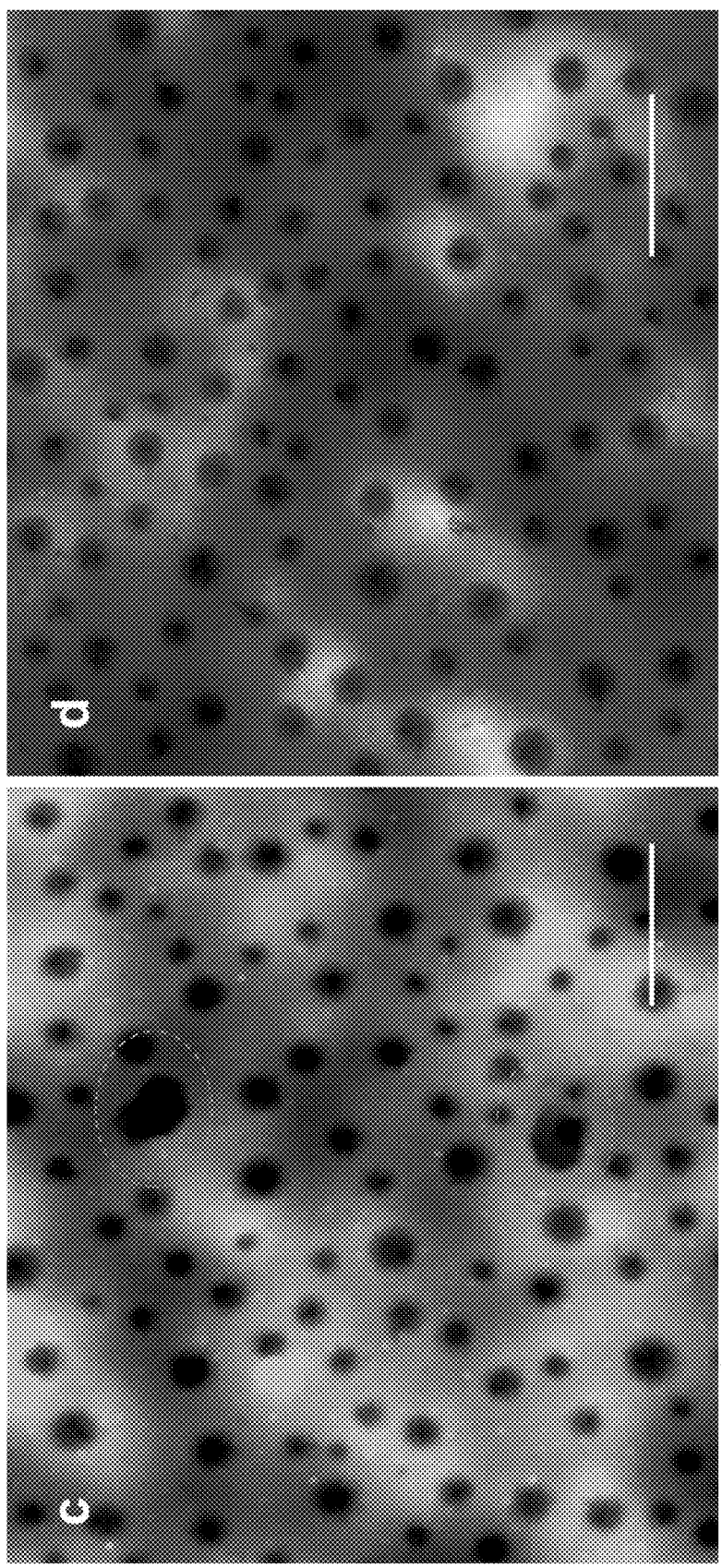
Figure 9:
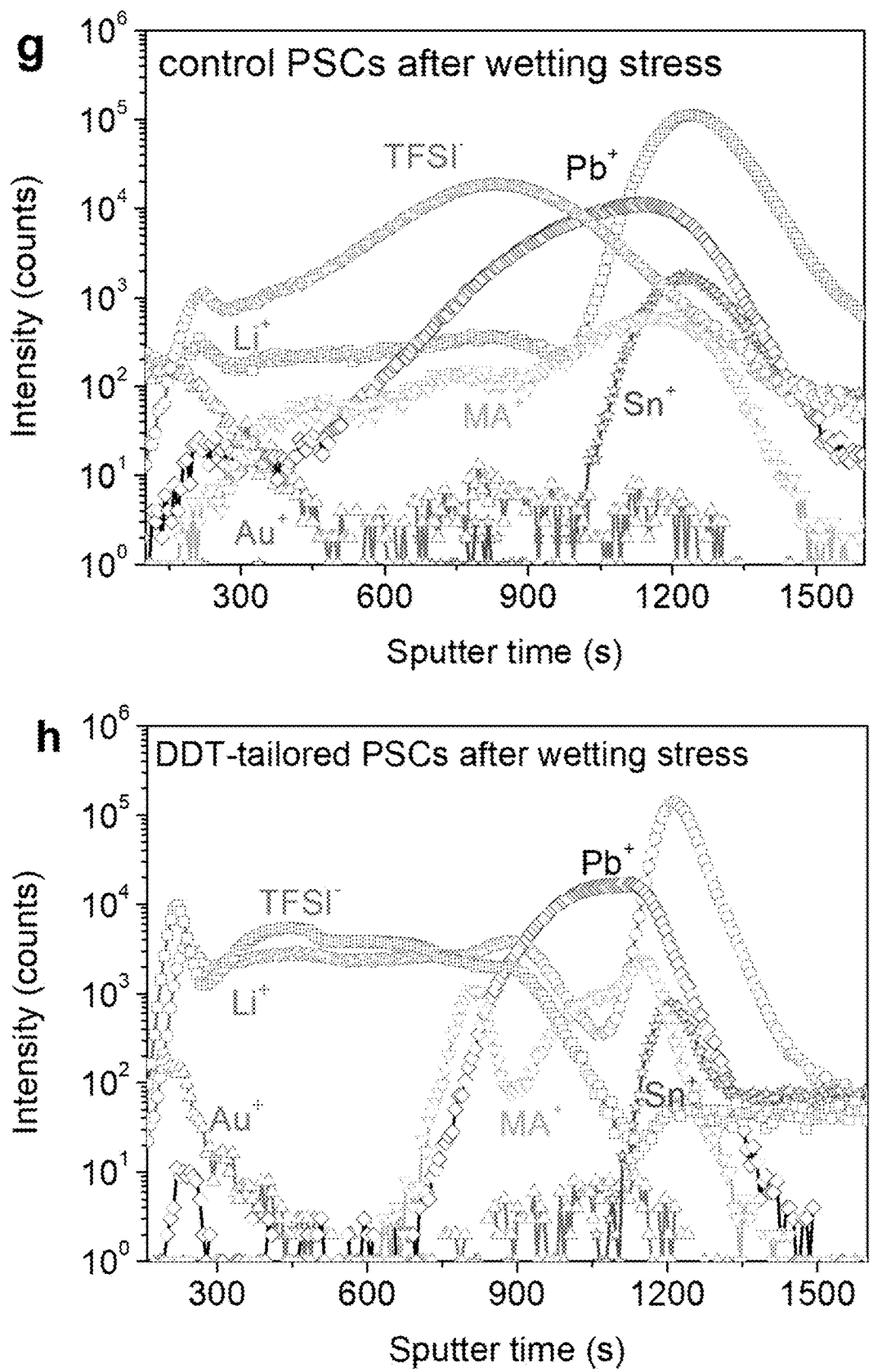
Figure 10:
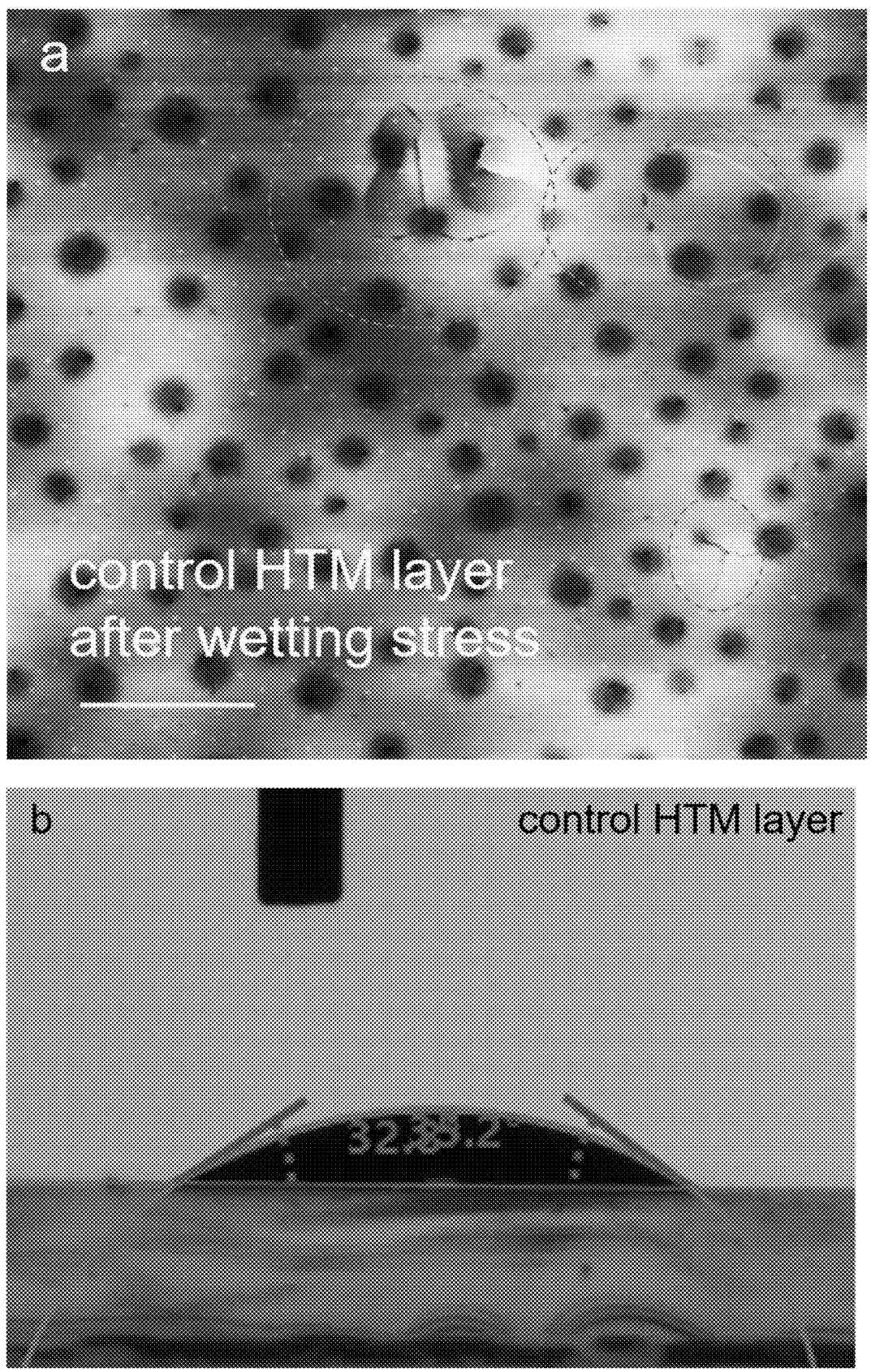
FIG. 10 shows further data indicating the device stability under wetting stress: (a) tapping-mode AFM image of the control HTM layer under wetting stress of 50% RH after 530 h; (b) and (c) contact angle measurement of a water droplet on the surface of the control (b) and the DDT-tailored Spiro-OMeTAD HTM layers; (d) photographs of perovskite/control Spiro-OMeTAD HTM (left) and perovskite/DDT-tailored Spiro-OMeTAD film (right) in ambient air (35-70% RH) after 2880 hours; (e) PCE evolution of the most stable unencapsulated DDT-tailored device (initial PCE is 20.3%; peak PCE is 20.6%; post-aged PCE: 19.3%) which is stored in the humidity-controlled air box (<10% RH, 25-30° C.).
Figure 10:
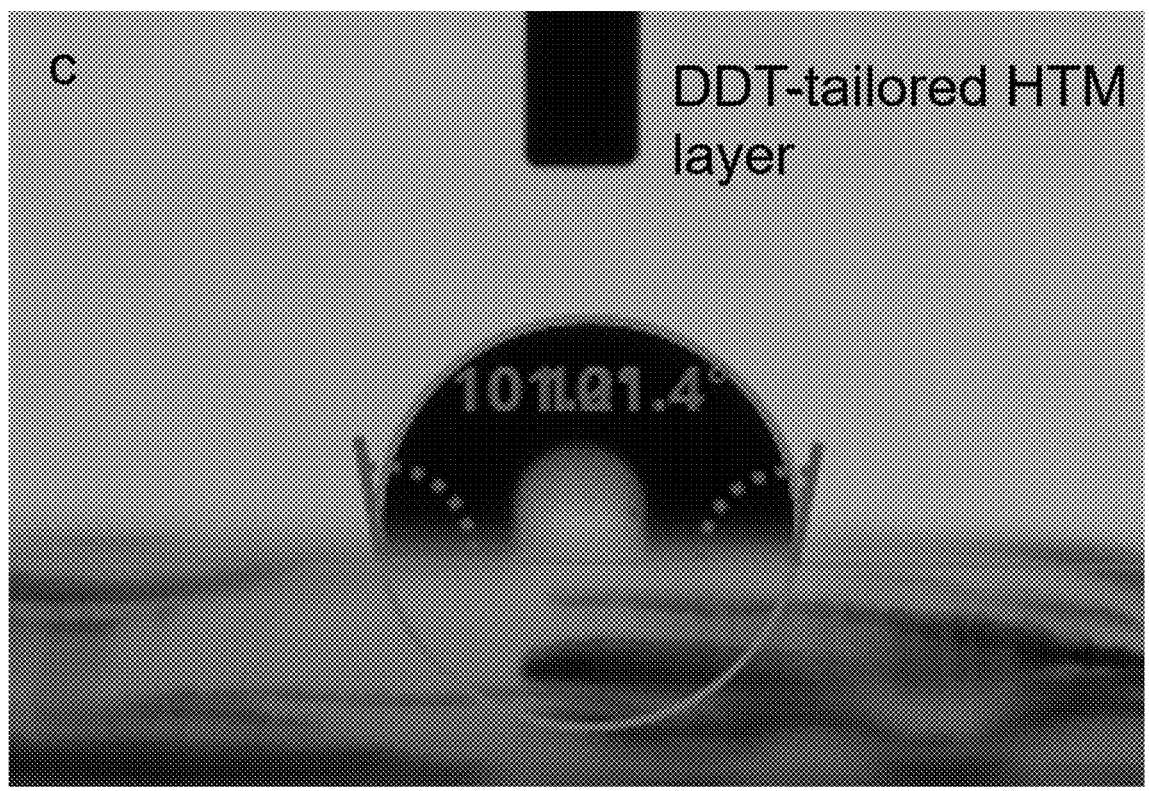
Figure 10:
Figure 10:
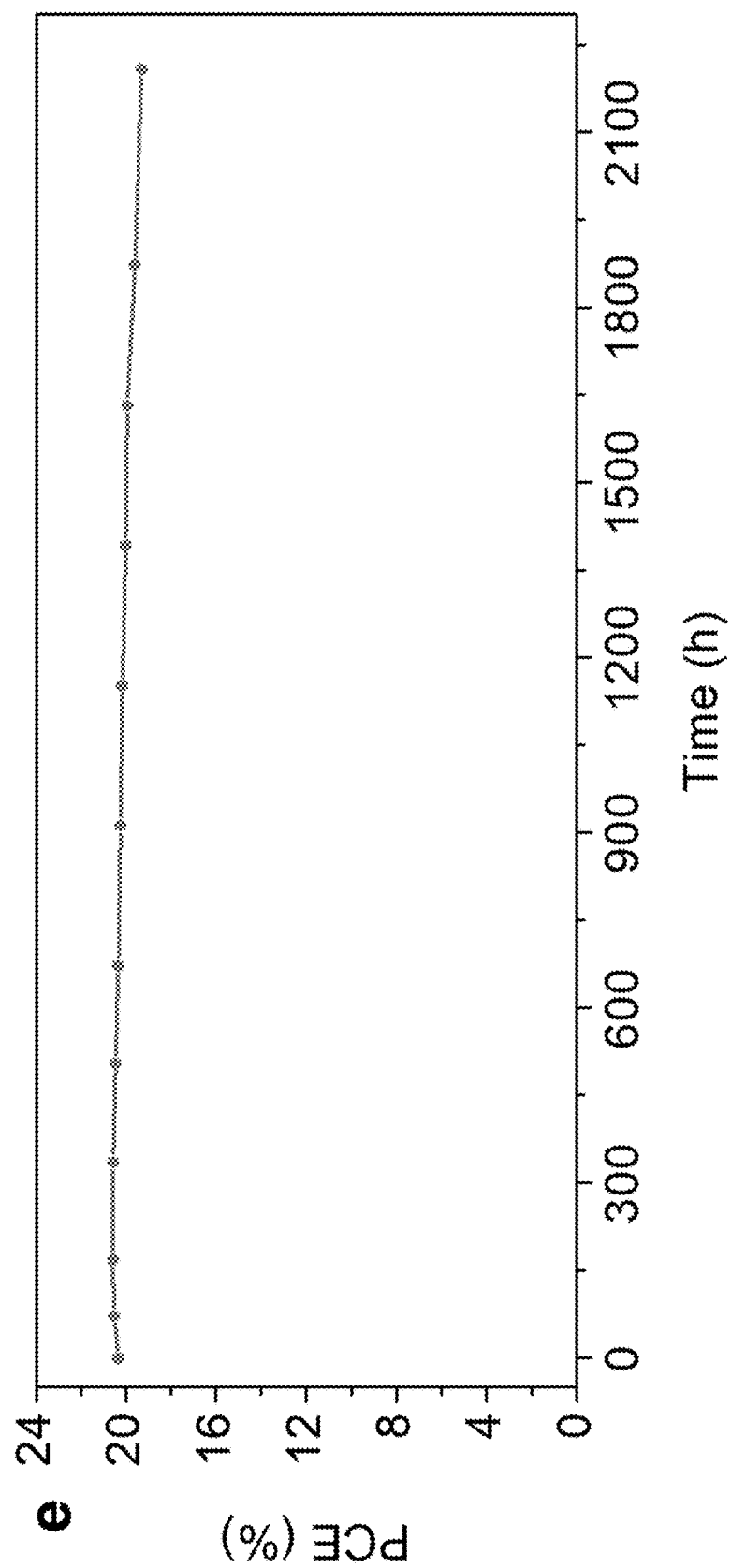

As the improved efficiency of PSCs tailored by DDT was demonstrated, the stability of complete photovoltaic cells under wetting, thermal, and continuous 1-sun illumination stresses was investigated. All cells are stored in a humidity-controlled air box for 48 hours in order to attain peak efficiency. Long-term stability tests on the devices without encapsulation under 50% RH (FIG. 9(a)) were firstly conducted. For the control device, a slow degradation of PCE during the first 100 hours was observed, followed by a quick degradation, decreasing to 68% of its peak PCE after another 430 hours. In comparison, the device with DDT-tailored HTM demonstrates greatly improved wetting stability, retaining a high PCE up to 97% over the same measurement period. The control discolours in the regions beyond the electrode-protected area, whilst showing no visible discolouration, are presented in the DDT-tailored device (FIG. 9(a), insets). The XRD, AFM, microscope, and ToF-SIMS measurements were performed to estimate the degradation of the device layers. The control exhibits a clear deterioration of the typical perovskite XRD peaks after 530 hours, whereas no such apparent impurity peaks are observed in the XRD patterns of devices fabricated with DDT-tailored HTM (FIG. 9(b)). Additionally, from the AFM (FIGS. 9(c) and (d) and FIG. 10(a)), enlarged pinholes and even the cracks in the control device after 530 hours were observed, whereas no morphological change is observed for DDT-tailored HTM. Moreover, the formation of crystalline domain is observed in the control films (FIG. 10(e)), whereas it is not found in the DDT-containing counterpart (FIG. 10 (f)). From the ToF-SIMS, severe compositional interdiffusion between the Spiro-OMeTAD and the perovskite is present in the control sample after 530 h (FIG. 9(g)). In contrast, each function layer still maintains clear edges in DDT-containing device (FIG. 9(h)).

In light of the significantly improved moisture stability, contact-angle measurements were conducted to determine the surface water resistance of the Spiro-OMeTAD films with dopants. The water droplet contact angle of 101° on the DDT-tailored film is much larger than that of 35° on the control film (FIGS. 10 (b) and (c)), indicating reduced hygroscopicity of the DDT-tailored HTMs. The stability of perovskite/HTM films was further tracked in ambient air (35-70% RH). No discolouration is observed for the unencapsulated DDT-containing sample even after 2880 hours (FIG. 10(d)). The DDT-containing cell stored in the humidity-controlled air box (<10% RH) has only ~7% degradation in PCE after 2200 hours (FIG. 10(e)). The incorporation of DDT appears to induce the formation of kinetic barriers that slows down the intrusion of $O_2$ and $H_2O$. The increased hydrophobicity and the reduced pinhole size for DDT-tailored Spiro-OMeTAD films are two key factors contributing to the enhanced stability of unencapsulated PSCs under wetting stress.

Figure 11:
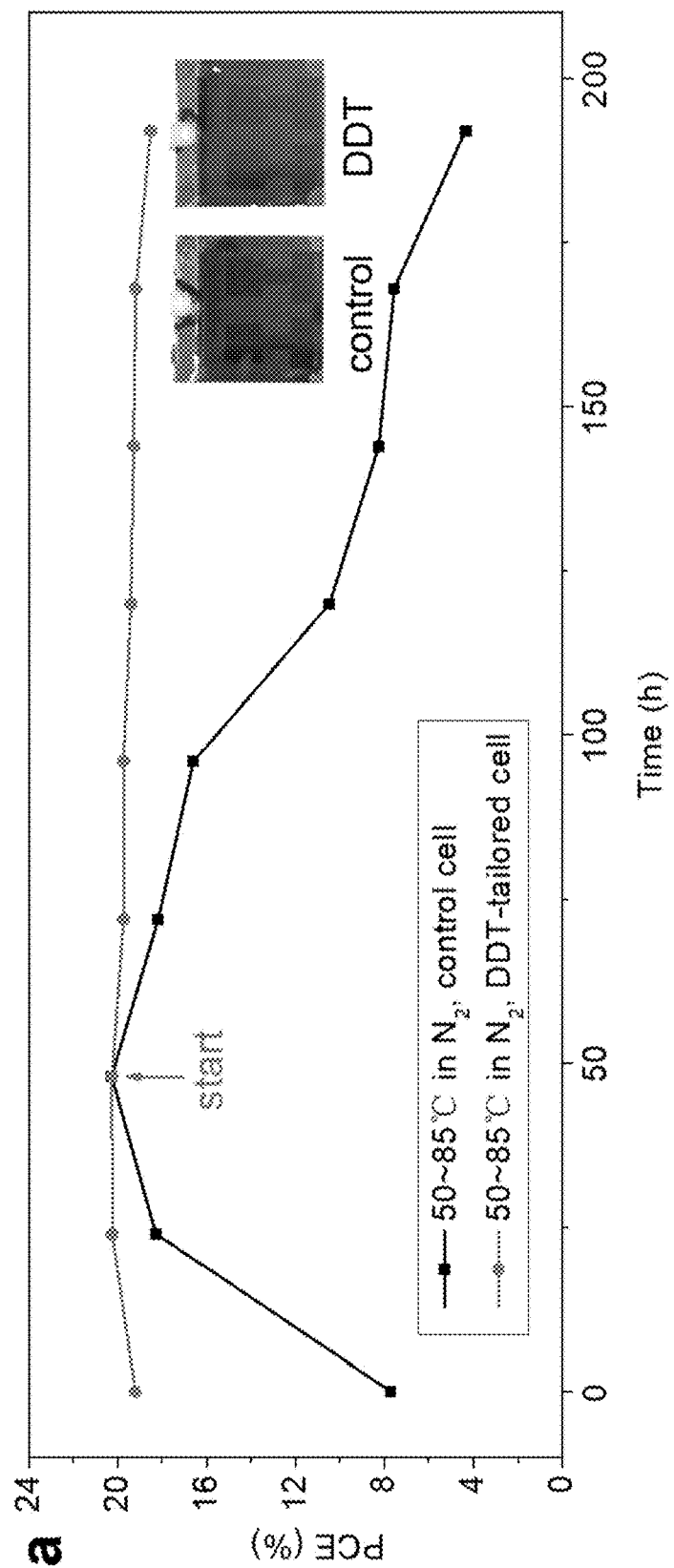
FIG. 11 shows data indicating the device stability under thermal stress: (a) evolution of PCEs of PSCs on thermal stress (at 50° C. for 120 h, then at 85° C. for another 24 h); inset, photographs of the control (left) and 1-DDT (right) devices after 144 h; after humidity-controlled air treatment for 48 hours, PCEs of the most stable control device and the most stable DDT-tailored device reached 20.2% and 20.3%, respectively; ageing process then started immediately; (b) corresponding XRD patterns of the control and the corresponding DDT-tailored PSCs before and after thermal stress; "*" represents PbI$_2$; (c) and (d) corresponding tapping-mode AFM images of the control HTM layer (c) and the DDT-tailored HTM layer (d) after thermal stress; scale bar is 1 um; (e) and (f) corresponding microscope photographs (50× magnitude) of the control HTM layer (c) and the DDT-tailored HTM layer (d) after thermal stress; (g) and (h) corresponding ToF-SIMS depth profiles of the control device (g) and the DDT-tailored device (h) after thermal stress.
Figure 11:
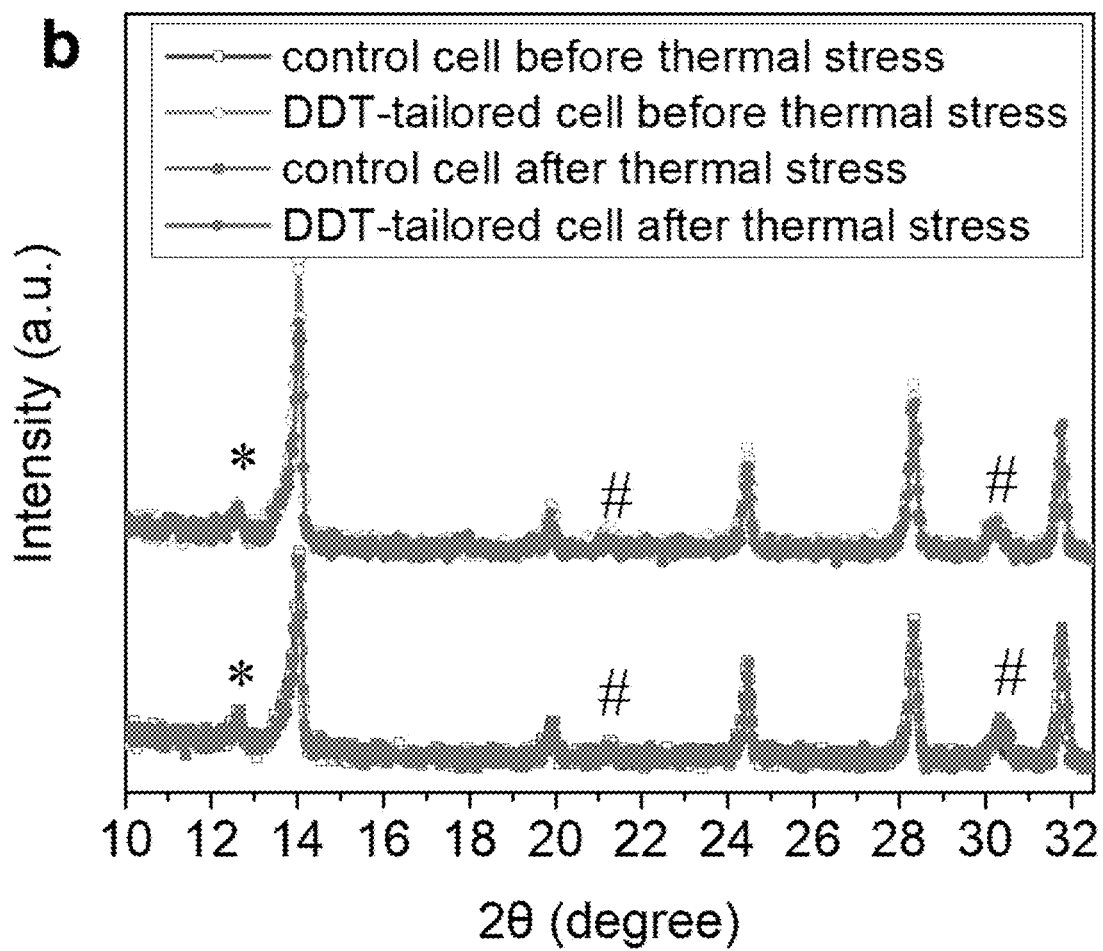
Figure 11:
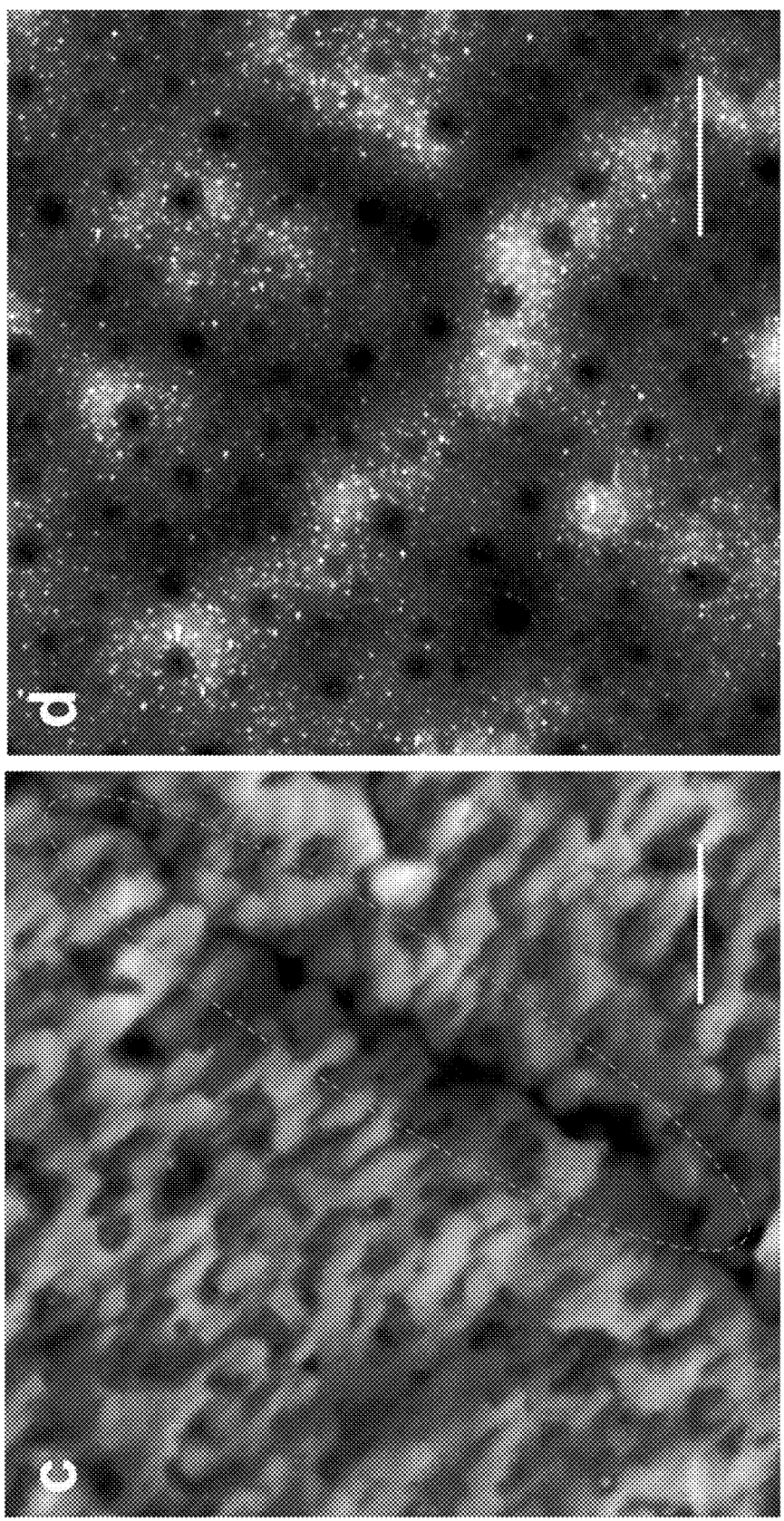
Figure 11:
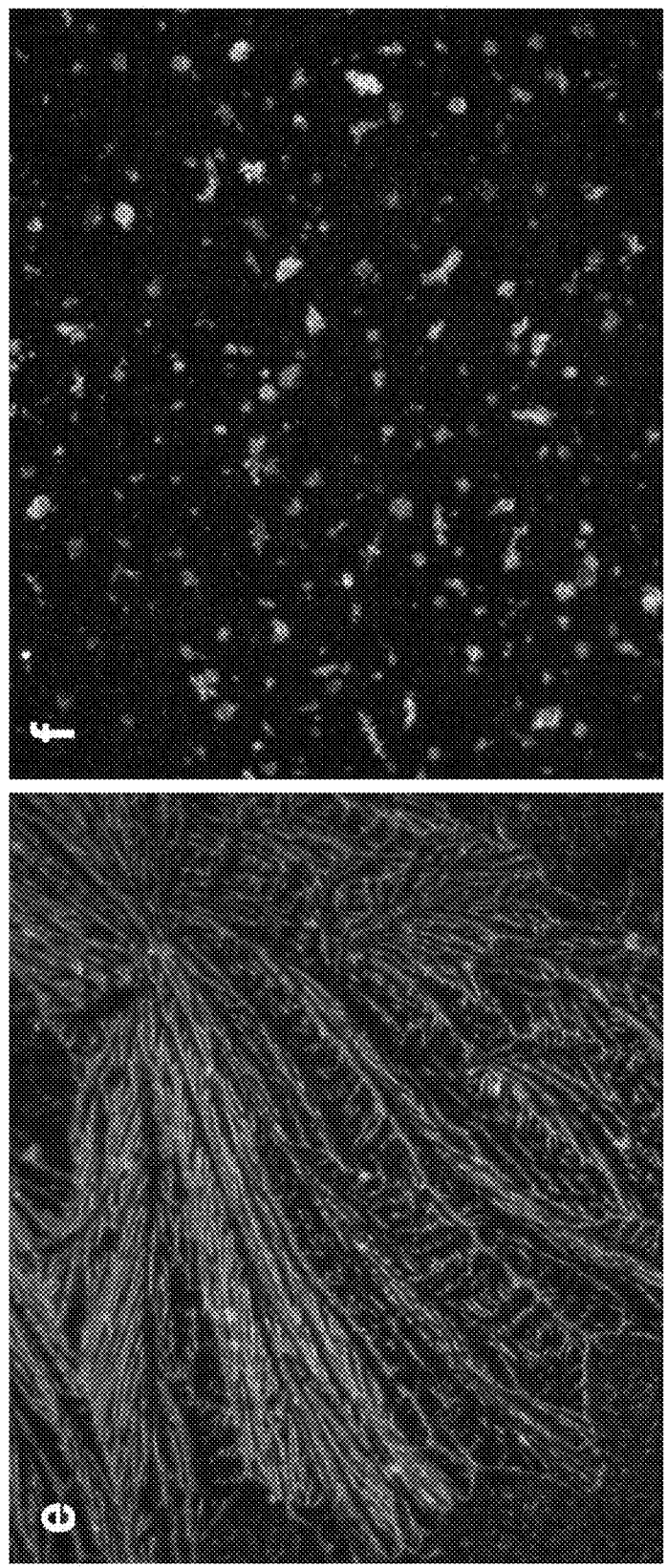
Figure 11:
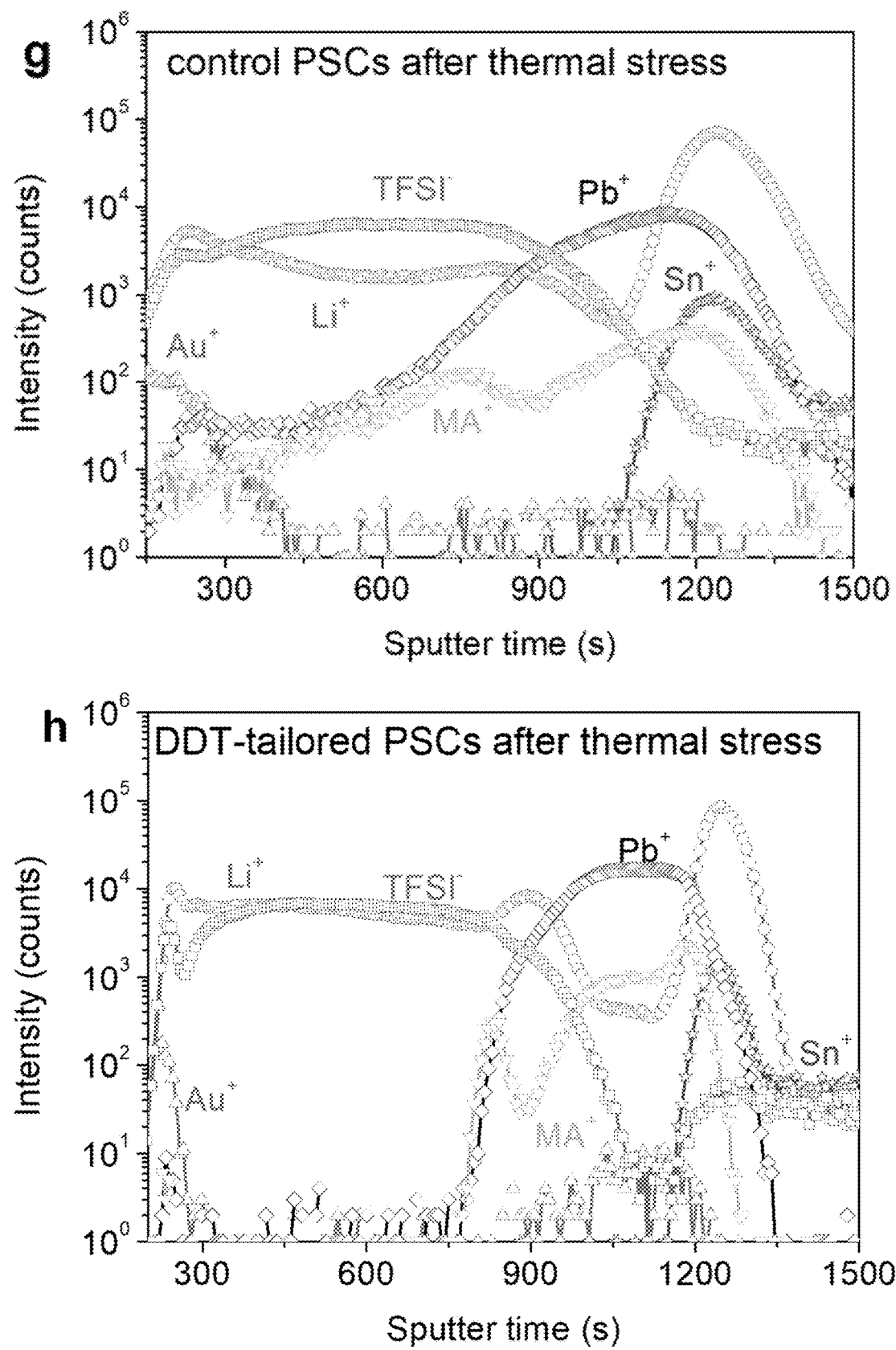

Stability tests were carried out on the devices without encapsulation under 50-85° C. in a $N_2$ atmosphere (FIG. 11(a)), where the performance of DDT-tailored PSCs also excels. As high as a 63% decrease was observed with respect to the peak PCE at 50° C. after 120 hours for the control device. Contrastingly, the device fabricated with DDT-tailored HTM has a high PCE retention up to 95% over the same ageing period. The device temperature was then allowed to rise to 85° C., and the device stability again evaluated. A faster degradation of another 16% drop for the control cell after 24 hours was measured, whereas the device fabricated with DDT-tailored Spiro-OMeTAD HTM shows a slower degradation of only another 5% drop over the same thermal ageing period. From the XRD (FIG. 11(b)), there are no impurity peaks either in the control or in the DDT-containing device after 144 hours, suggesting the drop of PCE probably is led by the deterioration of Spiro-OMeTAD HTM. This is confirmed by the AFM, where we observe the formation of a crystalline fibril structure with valleys after 144 hours in the control sample (FIG. 11(c)). In comparison, the DDT-containing film excels by largely retaining its initial morphological features, though along with some enlarged pinholes (FIG. 11(d)). From the microscopy measurements (FIGS. 10 (e) and (f)), the DDT-tailored Spiro-OMeTAD film exhibits a suppressed crystalline coverage with much smaller domain sizes than that of the control film. It is known that the crystallization of Spiro-OMeTAD has negative influences on the electrical properties of the HTM, leading to the decreased adhesive and cohesive fracture resistance and the formation of an additional undesired layer that causes an energy barrier for charge extraction. From their corresponding ToF-SIMS, we observe more Li+-TFSI- ion accumulation at the Au/HTL interface and Li+ ions migration into the perovskite stack either via the bulk or via grain boundaries for the control cell after 144 hours (FIG. 11(g)). The detection of perovskite ions at an earlier SIMS time may be ascribed to the formation of the enlarged voids, the valleys, and the cracks in HTM film rather than the deterioration of perovskite. Contrastingly, the device fabricated by DDT-tailored HTM still maintains an overall good dopant homogeneity (FIG. 11(h)). For the control, the efficiency can be recovered to 19% after depositing new Spiro-OMeTAD HTM layer (FIG. 12(a)), suggesting its performance degradation mainly results from the deteriorated HTM layer. The presence of DDT induces the creation of kinetic barriers that suppresses the crystallization of Spiro-OMeTAD, where the coordination interaction between DDT and Li-TFSI is believed to be the key factor contributing to the enhanced stability of unencapsulated PSCs under thermal stress.

Figure 13:
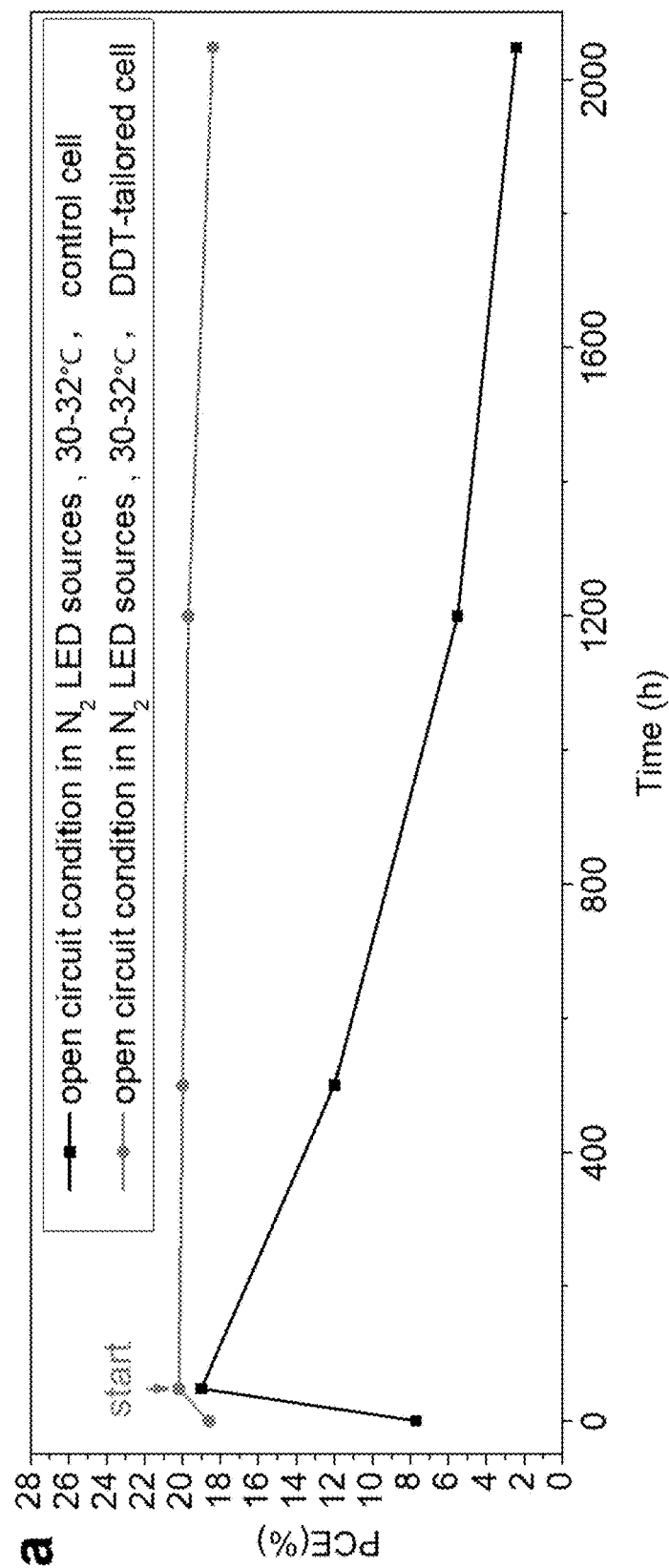
FIG. 13 shows the device stability under the illumination stress: (a) evolution of PCEs of PSCs on continuous 1-sun illumination stress for ~2000 h under the open-circuit condition. Inset, photographs of the control (left) and DDT-tailored (right) devices; after humidity-controlled air treatment for 48 hours, PCEs of the most stable control device and the most stable DDT-tailored device reached 19.0% and 20.2%, respectively; ageing process then started immediately; (b) evolution of PCEs of PSCs on continuous 1-sun illumination stress for 1000 h under the continuous operation condition at MPP; after humidity-controlled air treatment for 48 hours, PCEs of DDT-tailored device reached 19.5%; ageing process then started immediately; inset, J-V curve of DDT-tailored device before starting ageing; (c) corresponding XRD patterns of the control and the corresponding DDT-tailored PSCs before and after illumination stress under the open-circuit condition; "*" represents PbI$_2$; (d) and (e) corresponding tapping-mode AFM images of the control HTM layer (d) and the DDT-tailored HTM layer (e) after illumination stress under the open-circuit condition; scale bar is 200 nm; (f) and (g) corresponding microscope photographs (50× magnitude) of the control HTM layer (f) and the DDT-tailored HTM layer (g) after illumination stress under the open-circuit condition; (h) and (i) corresponding ToF-SIMS depth profiles of the control device (h) and the DDT-tailored device (i) after illumination stress under the open-circuit condition.
Figure 13:
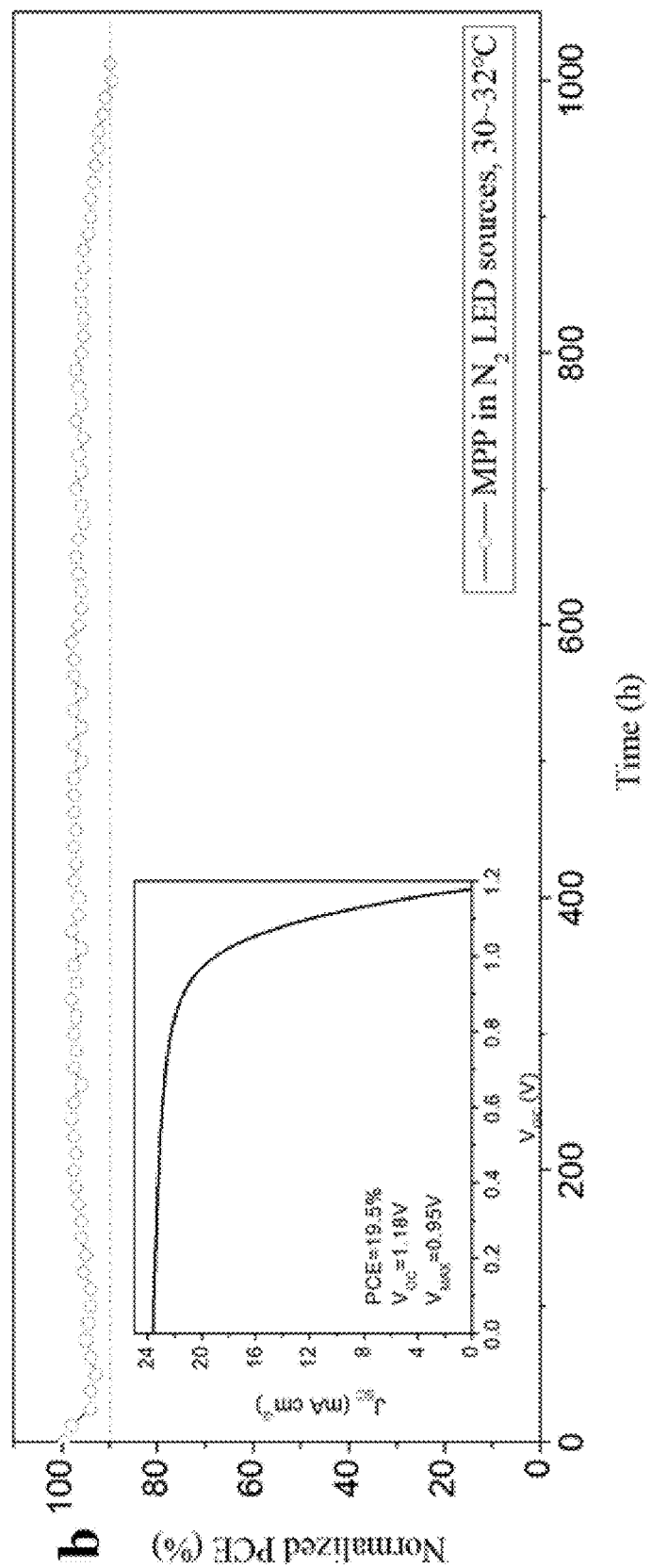
Figure 13:
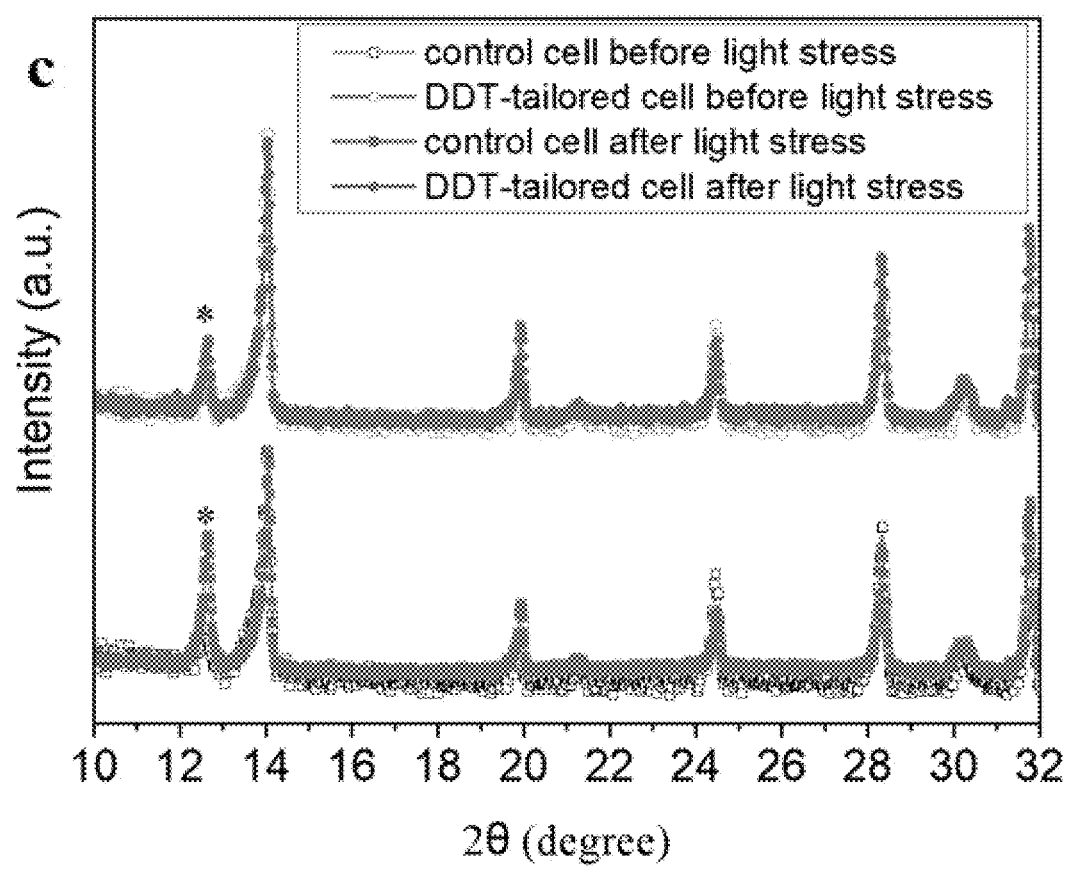
Figure 13:
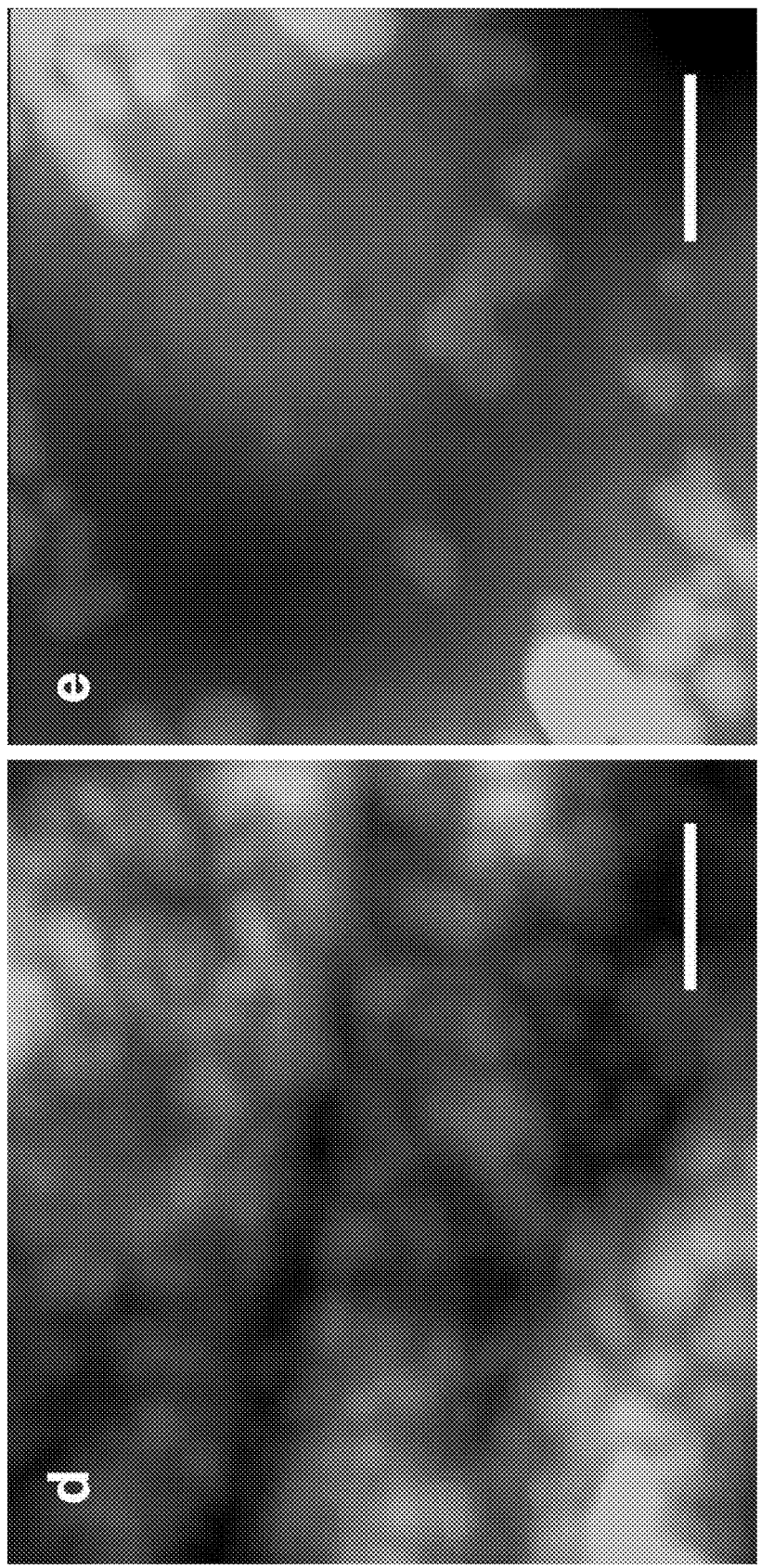
Figure 13:
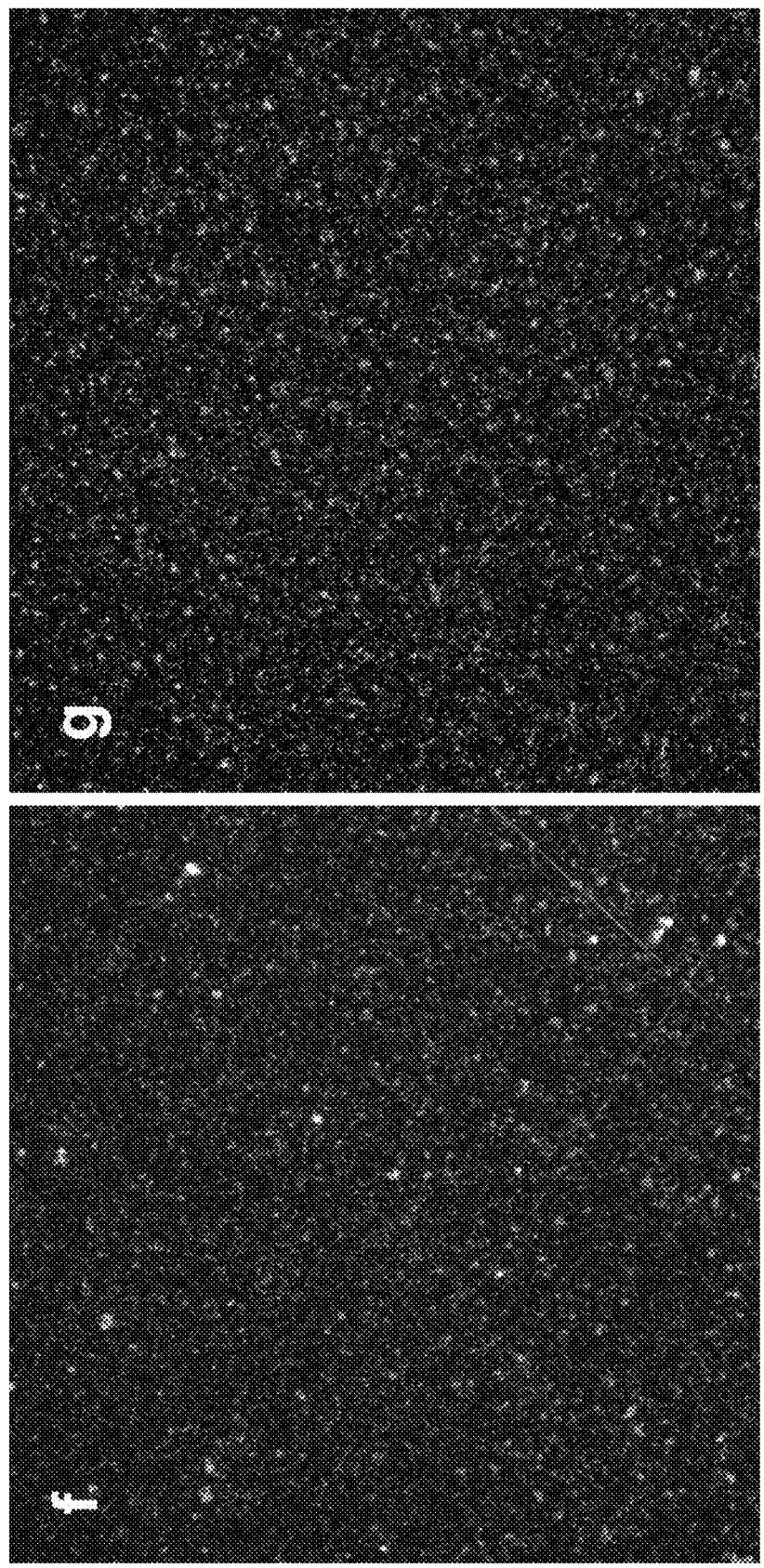
Figure 13:
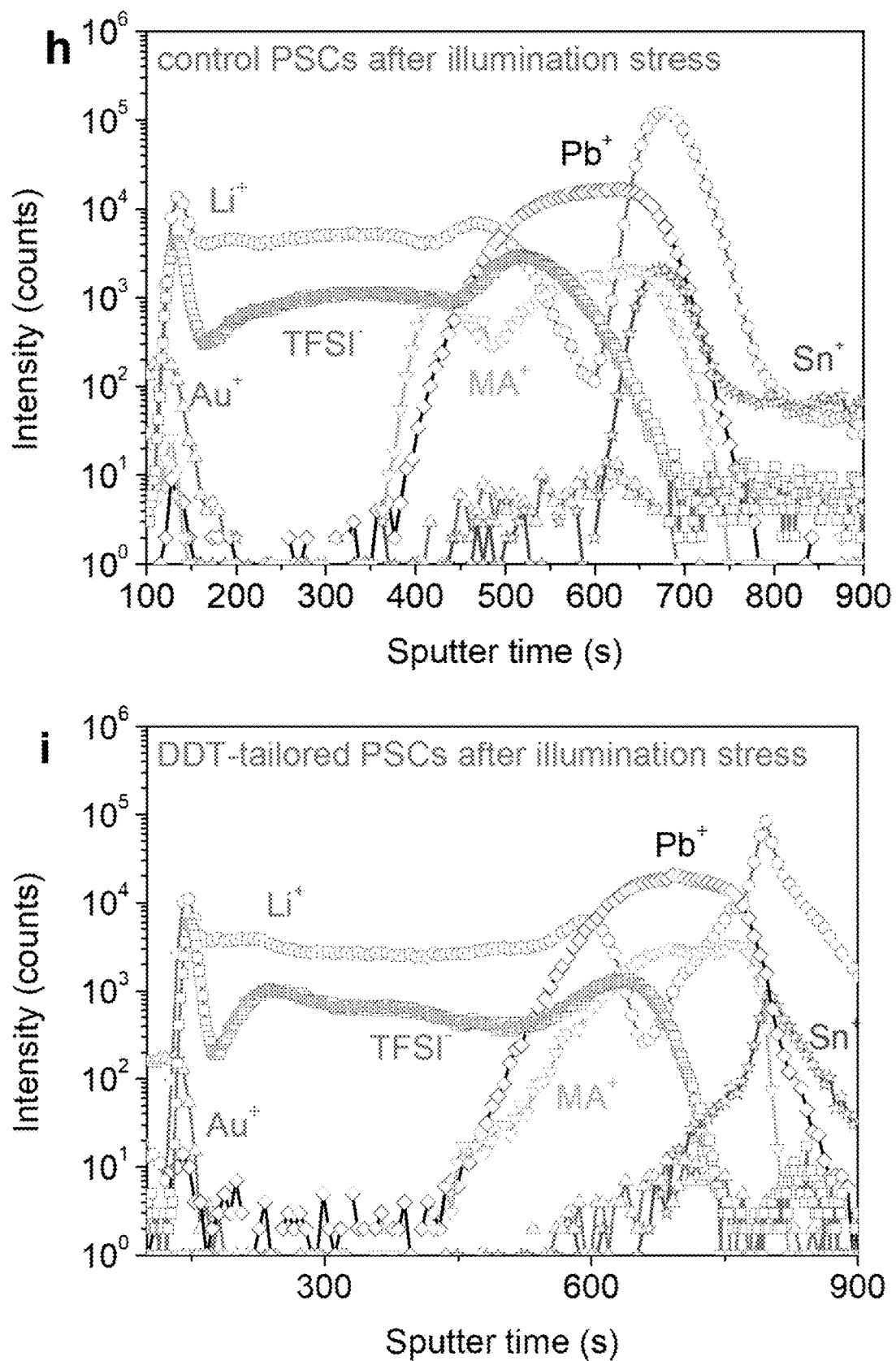

Long-term stability tests were conducted on the devices without encapsulation under continuous 1-sun illumination stress including the open-circuit condition and the operation at the MPP in a $N_2$ atmosphere (FIGS. 13(a) and (b)). Under the open-circuit condition, we observe an as high as 90% decrease with respect to the peak PCE after ~2000 hours for the control device. In comparison, the device with DDT-tailored HTM has a high PCE retention up to 93% over the same measurement period. Similar enhanced stability of DDT-tailored PSCs is also obtained under a continuous operation condition. The device with DDT-tailored HTM retains 90% of its peak PCE after 1000 hours under the operation at the MPP.

Illumination stress induced damages in both the perovskite and HTM layers of the control device were found but which are significantly alleviated in those of the DDT-tailored device. From the XRD (FIG. 13(c)), the control device under illumination stress exhibits a strong XRD peak of PbI2 after 2000 hours, whereas $PbI_2$ is greatly mitigated in the devices fabricated with DDT-tailored HTM over the same ageing period. The appearance of $PbI_2$ impurity could be ascribed to the loss of the organic cations. Moreover, the formation of small crystalline grains and valleys in the HTM layer of the control cell (FIG. 13(d)) were observed. In contrast, most regions in the DDT-tailored HTM layer still retain the initial amorphous structure, though a few small crystalline grains can be seen on the surface (FIG. 13(e)). From the microscopy measurements, we observe obvious cracks in the control (FIG. 13(f)), whereas no apparent cracks in the DDT-tailored sample (FIG. 13(g)). More importantly, from the ToF-SIMS (FIGS. 13(h) and (i)), more severe Li+-TFSI- ion accumulation was observed, especially the TFSI- anion, at the Au/HTL interface for the control cell than the DDT-containing cell. For the control device, the appearance of MA+ at the Au/HTL interface after ~2000 hours was seen, consistent with the ion migration of MA+ from perovskite to the metal contact via the HTL layer. The corresponding efficiency of the control cell returns to a PCE of only 10% after depositing the new Spiro-OMeTAD HTM layer (FIG. 12(b)), indicating the PCE deterioration of PSCs under long-term illumination results not only from the degradation of the Spiro-OMeTAD HTM film but also from the degradation of the perovskite absorber itself. In contrast, the presence of DDT induces the creation of kinetic barriers that mitigate the formation of small crystalline grains in Spiro-OMeTAD and the ion migration of MA+, contributing to the enhanced stability of unencapsulated PSCs under the long-term illumination stress.

Figure 14:
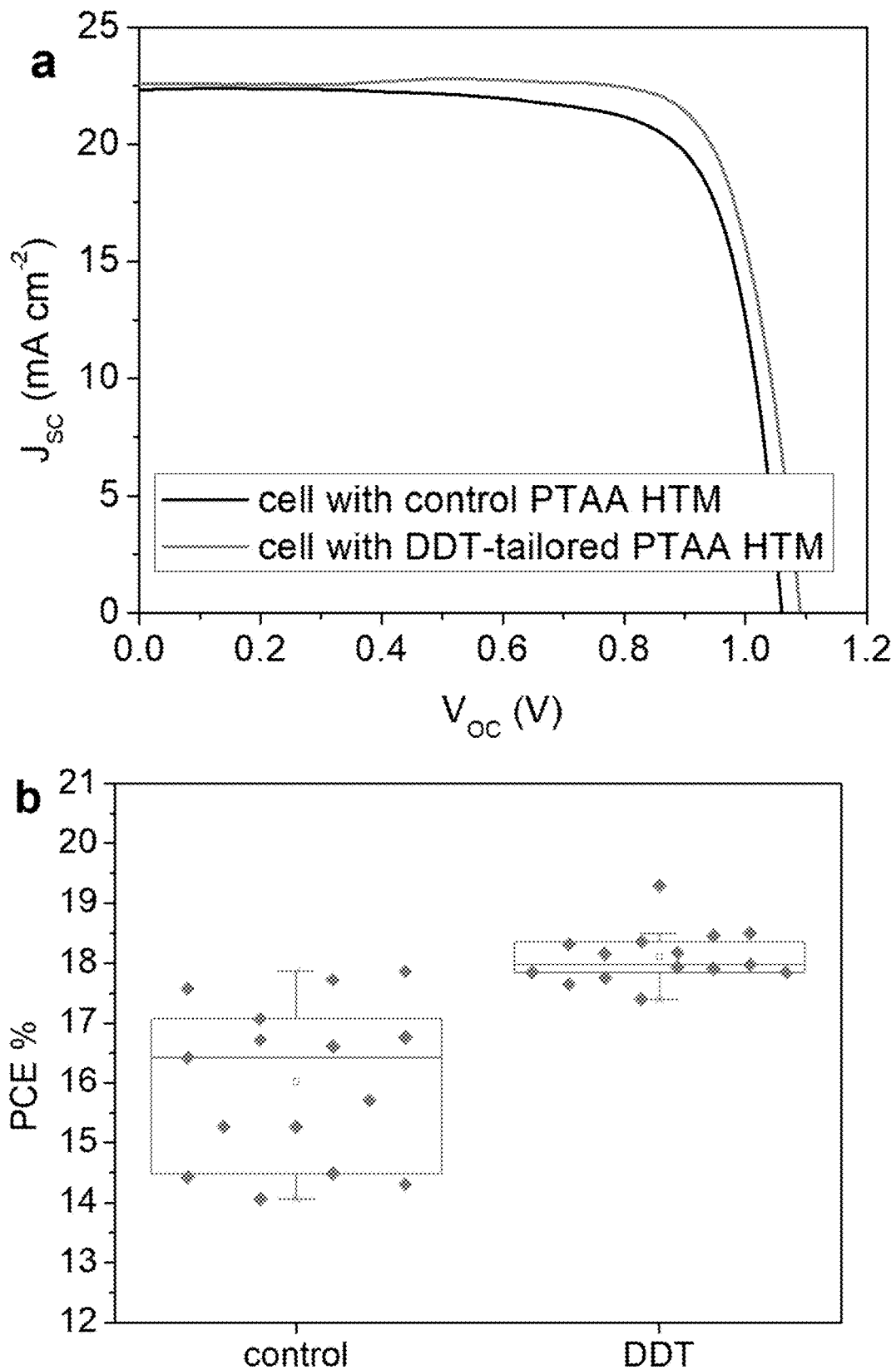
FIG. 14 shows the impacts of DDT on devices fabricated by PTAA HTM layer: (a) J-V curves of the performance of devices employing the control and DDT-tailored PTAA HTM layers. The control cell shows a PCE of 17.7% with a $V_{OC}$ of 1.06V, a $J_{SC}$ of 22.3 mA cm$^{-2}$, and a FF of 74.9%. The DDT-tailored cell shows a PCE of 19.3% with a $V_{OC}$ of 1.09V, a $J_{SC}$ of 22.6 mA cm$^{-2}$, and a FF of 78.3%; (b)-(e) statistical box charts of PCE (b), $V_{OC}$ (b), $J_{SC}$ (c), and FF (d) (each condition has 15 cells); the control PTAA precursor solution comprising 10 mg PTAA powder, 1 mL toluene, 7.5 µL Li-TFSI in acetonitrile (170 mg mL$^{-1}$), and 4 µL tBP with or without DDT was spin-coated on perovskite layer at 3000 r for 30 s; for the DDT-tailored PTAA films, 2.5 µL DDT was added in the above PTAA precursor solution.
Figure 14:
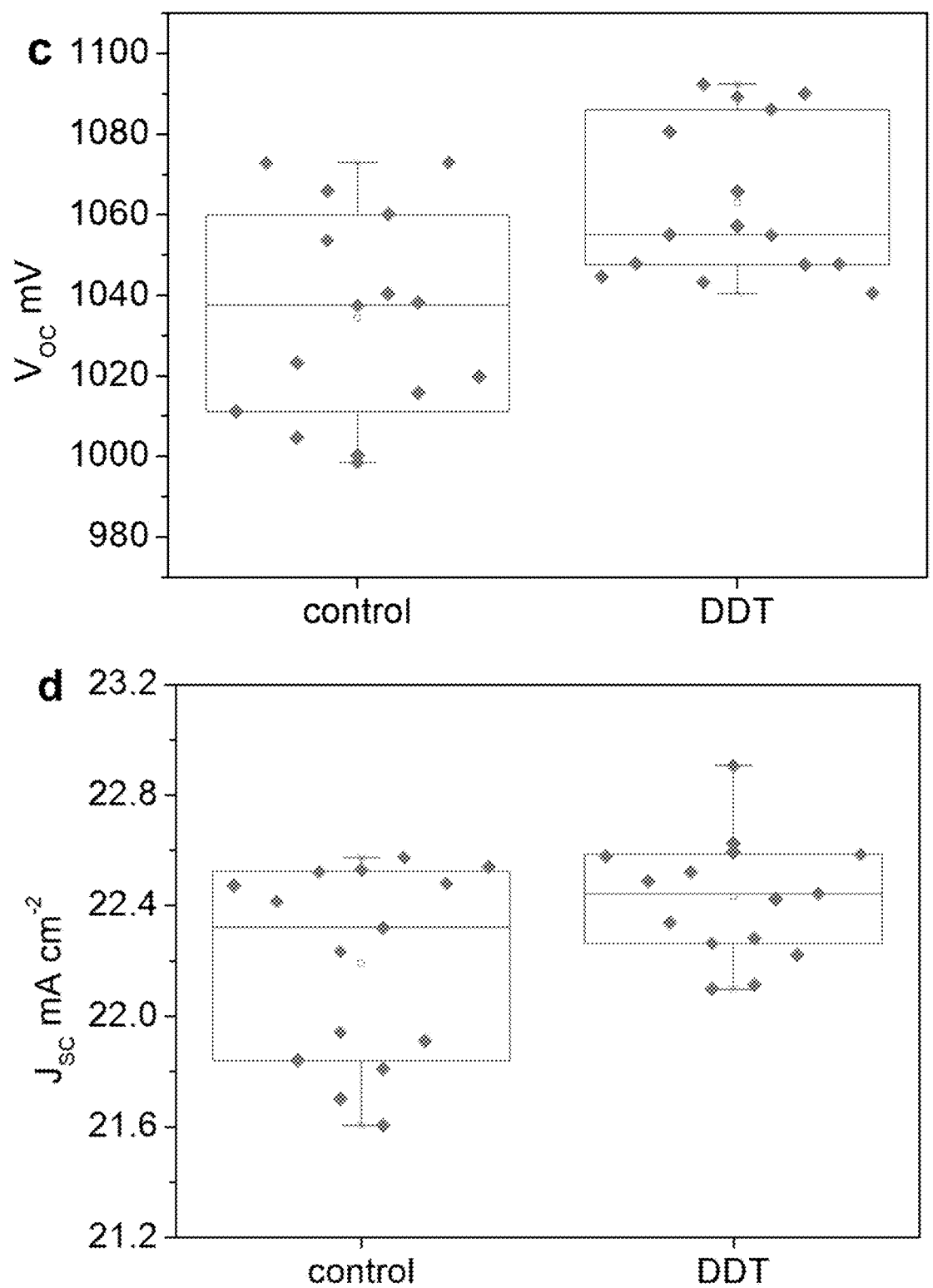
Figure 14:
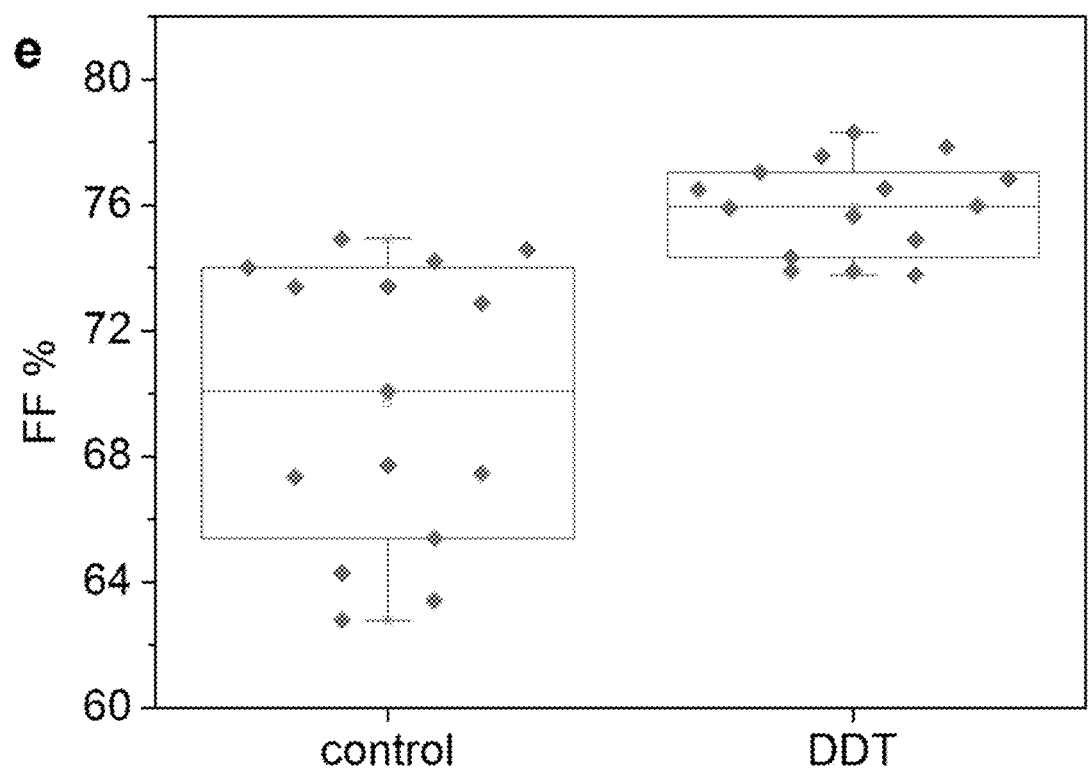

To evaluate the effect of DDT in a broader context, DDT was applied to the well-known poly-triarylamine (PTAA) precursor and observe an obvious improvement for the devices using DDT-tailored PTAA as the HTM layers (FIG. 14).

In the claims which follow and in the preceding description, except where the context requires otherwise due to express language or necessary implication, the word "comprise" or variations such as "comprises" or "comprising" is used in an inclusive sense, i.e. to specify the presence of the stated features but not to preclude the presence or addition of further features in various embodiments.

The invention claimed is:

1. A method of forming a photovoltaic device, comprising:
    providing a substrate;
    forming a perovskite photovoltaic cell on the substrate comprising forming a hole transport layer, the hole transport layer comprising a hole transport material selected from the group consisting of a spirobifluorene and a polymeric amine, and the hole transport layer having an additive which is an alkylthiol and/or disulphide that results in one or more of the following:
        reduced formation of crystalline domains in the hole transport layer;
        reduced size of pinholes in the hole transport layer; and
        increased hydrophobicity of the hole transport layer.

2. The method according to claim 1, wherein the additive prevents the formation of crystalline domains in the hole transport layer, reduces a pinhole size in the hole transport layer, and increases a hydrophobicity of the hole transport layer.

3. The method according to claim 1, wherein the hole transport layer has a lower HOMO energy level compared to a hole transport layer in absence of the additive.

4. The method according to claim 1, wherein forming the hole transport layer comprises applying a hole transport layer precursor solution comprising the additive onto the perovskite photovoltaic cell.

5. The method according to claim 1, wherein the alkylthiol is 1-dodecanethiol.

6. The method according to claim 1, wherein the disulfide is didodecyl disulphide.

7. The method according to claim 1, wherein the hole transport layer comprises a dopant.

8. The method according to claim 1, wherein the hole transport layer comprises 2,2',7,7'-tetrakis(N,N-di-p-methoxyphenyl-amine) 9,9'-spirobifluorene (Spiro-MeO-TAD), poly-triarylamine (PTAA), 4-tert-butylpyridine (tBP) and/or a (bis(trifluoromethane)sulfonimidelithium salt (TFSI).

9. A photovoltaic device comprising:
    a substrate;
    a perovskite photovoltaic cell comprising a hole transport layer, the hole transport layer comprising a hole transport material selected from the group consisting of a spirobifluorene and a polymeric amine, and the hole transport layer having an additive which is an alkylthiol and/or disulphide that that results in one or more of the following:
        reduced formation of crystalline domains in the hole transport layer;
        reduced size of pinholes in the hole transport layer; and
        increased hydrophobicity of the hole transport layer.

10. The device according to claim 9, wherein the hole transport layer has a lower HOMO energy level compared to the hole transport layer in the absence of the additive.

11. The device according to claim 9, wherein the spirobifluorene is 2,2',7,7'-tetrakis(N,N-di-p-methoxyphenyl-amine) 9,9'-spirobifluorene (Spiro-MeOTAD).

12. The device according to claim 9, wherein the hole transport layer comprises 2,2',7,7'-tetrakis(N,N-di-p-methoxyphenyl-amine) 9,9'-spirobifluorene (Spiro-MeO-TAD), poly-triarylamine (PTAA), 4-tert-butylpyridine (tBP) and/or a (bis(trifluoromethane)sulfonimidelithium salt (TFSI).

* * * * *